(12) United States Patent
Schultz et al.

(10) Patent No.: US 6,198,793 B1
(45) Date of Patent: Mar. 6, 2001

(54) ILLUMINATION SYSTEM PARTICULARLY FOR EUV LITHOGRAPHY

(75) Inventors: Jörg Schultz, Aalen; Johannes Wangler, Königsbronn; Karl-Heinz Schuster, Rechbergstrasse; Udo Dinger, Oberkochen, all of (DE)

(73) Assignee: Carl-Zeiss-Stiftung Trading As Carl Zeiss, Heidenheim (DE)

( * ) Notice: Subject to any disclaimer, the term of this patent is extended or adjusted under 35 U.S.C. 154(b) by 0 days.

(21) Appl. No.: 09/305,017

(22) Filed: May 4, 1999

(30) Foreign Application Priority Data

| May 5, 1998 | (DE) | ................................. 198 19 898 |
| Feb. 2, 1999 | (DE) | ................................. 199 03 807 |
| Feb. 8, 1999 | (DE) | ............................. 299 02 108 U |

(51) Int. Cl.⁷ ................................................... G21K 5/04
(52) U.S. Cl. ........................... 378/34; 378/145; 378/146; 378/147
(58) Field of Search ............................. 378/34, 145, 146, 378/147, 154

(56) References Cited

U.S. PATENT DOCUMENTS

| 4,651,012 | 3/1987 | Clark et al. ................. 250/505.1 |
| 5,339,346 | 8/1994 | White ............................. 378/34 |
| 5,361,292 | 11/1994 | Sweatt ........................... 378/34 |
| 5,512,759 | 4/1996 | Sweatt ......................... 250/492.1 |
| 5,581,605 | 12/1996 | Murakami et al. ................ 378/84 |
| 5,669,708 | 9/1997 | Mashima et al. ................ 362/341 |
| 5,677,939 | * 10/1997 | Oshino ........................... 378/34 |
| 5,737,137 | 4/1998 | Cohen et al. ..................... 359/859 |
| 5,896,438 | 4/1999 | Miyake et al. .................... 378/34 |

FOREIGN PATENT DOCUMENTS 0 359 018   3/1990   (EP) .

OTHER PUBLICATIONS

"Handbook On Synchrotron Radiation" Ernst–Eckhard Koch ed., pp. 140–145, 1098–1111 (1983).

* cited by examiner

Primary Examiner—David V. Bruce
Assistant Examiner—Allen C Ho
(74) Attorney, Agent, or Firm—Ohlandt, Greeley, Ruggiero & Perle, L.L.P.

(57) ABSTRACT

The invention concerns an illumination system for wavelengths ≦193 nm, particularly for EUV lithography, with at least one light source, which has an illumination A in a predetermined surface; at least one device for producing secondary light sources; at least one mirror or lens device comprising at least one mirror or one lens, which is or are organized into raster elements; one or more optical elements, which are arranged between the mirror or lens device comprising at least one mirror or one lens, which is or are organized into raster elements and the reticle plane, whereby the optical elements image the secondary light sources in the exit pupil of the illumination system.

The illumination system is characterized by the fact that the raster elements of the one or more mirror or lenses are shaped and arranged in such a way that the images of the raster elements cover by means of the optical elements the major portion of the reticle plane and that the exit pupil defined by aperture and filling degree is illuminated.

54 Claims, 25 Drawing Sheets

Feld = field
Pupille = pupil
Du = Diameter

Feld = field
Pupille = pupil
Du = Diameter
Quelle = source
kol = collector
$Du_{Bl}$ = diaphragm diameter

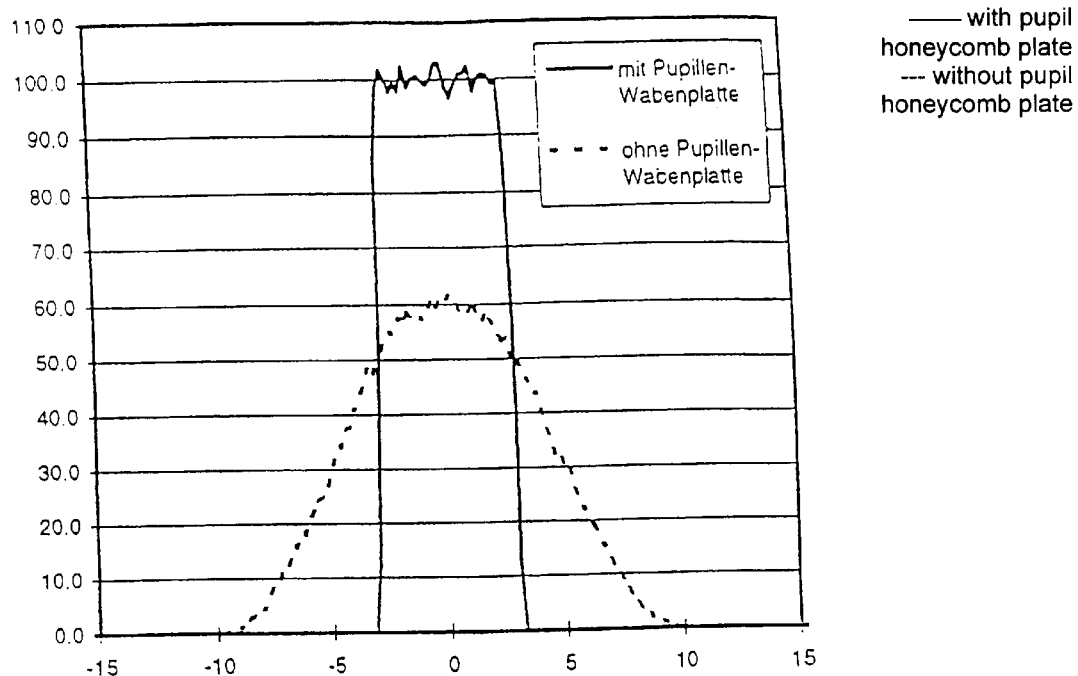
x-axis: Y in the reticule plane [nm]
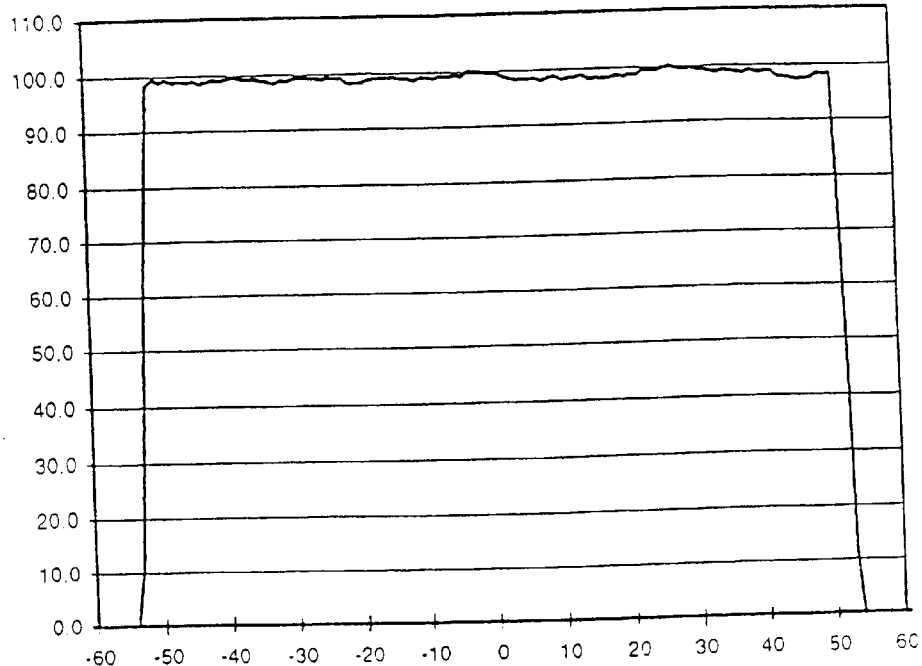
y-axis: scan energy [%]
x-axis: X in the reticule plane [mm]

y-axis: peak energy [%]
x-axis: number of [illegible]

y-axis: scan energy [%]
x-axis: x in the reticule plane [mm]

268.82 MM 227.27 MM y-axis: scan energy [%]
x-axis: X in the reticule plane [mm]

y-axis: intensity [%]  
x-axis: Y in the reticule plane [mm]
——— 50-μm source  
- - - - 200-μm source
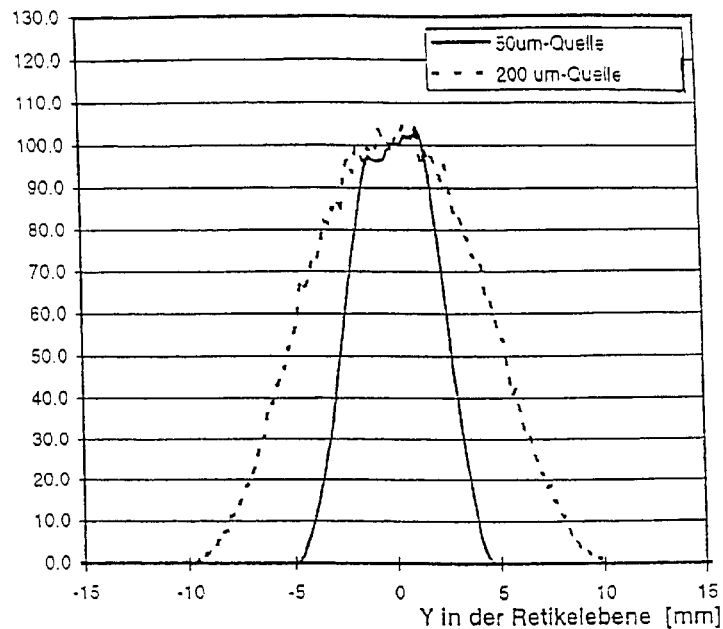
FIG. 62
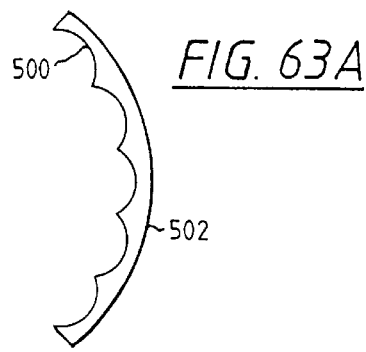
FIG. 63A
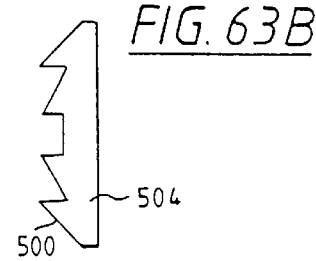
FIG. 63B
FIG. 64
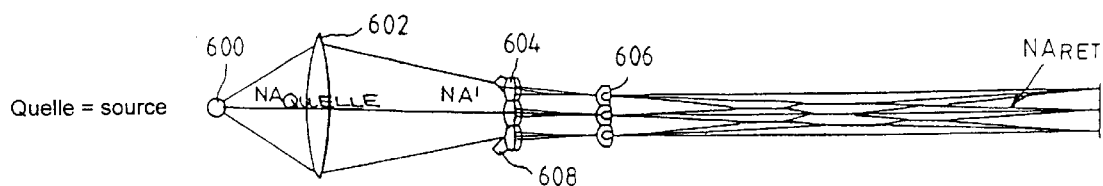
Quelle = source

US 6,198,793 B1

ILLUMINATION SYSTEM PARTICULARLY FOR EUV LITHOGRAPHY

BACKGROUND OF THE INVENTION

1. Field of the Invention

The invention concerns an illumination system according to the preamble of claim I as well as a projection exposure unit with such an illumination system.

In order to be able to further reduce the structural widths of electronic components, particularly in the submicron range, it is necessary to reduce the wavelengths of the light utilized for microlithography. Lithography with soft x-ray radiation, so-called EUV (extreme UV) lithography, is conceivable at wavelengths smaller than 193 nm, for example.

2. Description of the Prior Art

An illumination system suitable for EUV lithography will illuminate with as few reflections as possible the field provided for EUV lithography, particularly the annular field of an objective in a homogeneous manner, i.e., uniformly; further, the aperture diaphragm or pupil of the objective will be illuminated independent of field up to a specific filling ratio σ and the exit pupil of the illumination system will lie in the entrance pupil of the objective.

An illumination system for a lithographic device, which uses EUV radiation, has been made known from U.S. Pat. No. 5,339,346. For uniform illumination in the reticle plane and filling of the pupil, U.S. Pat. No. 5,339,346 proposes a condenser, which is constructed as a collector lens and comprises at least 4 pairs of mirror facets, which are arranged symmetrically. A plasma light source is used as the light source.

In U.S. Pat. No. 5,737,137, an illumination system with a plasma light source comprising a condenser mirror is shown, in which an illumination of a mask or a reticle to be illuminated is achieved by means of spherical mirrors.

U.S. Pat. No. 5,361,292 shows an illumination system, in which a plasma light source is provided, and the point plasma light source is imaged in an annular illuminated surface by means of a condenser, which has five aspherical mirrors arranged off-center. The annularly illuminated surface is then imaged in the entrance pupil by means of a special subordinate sequence of grazing-incidence mirrors.

From U.S. Pat. No. 5,581,605, an illumination system has been made known, in which a photon beam is split into a multiple number of secondary light sources by means of a honeycomb condenser. In this way, a homogeneous or uniform illumination is achieved in the reticle plane. The imaging of the reticle on the wafer to be exposed is produced by means of a conventional reduction optics. A gridded mirror is precisely provided with equally curved elements in the illumination beam path. The contents of the above-mentioned patents are incorporated by reference.

SUMMARY OF THE INVENTION

The task of the invention is to provide an illumination system that is constructed as simply as possible and a process for the design of such, with which the requirements for an exposure system for wavelengths of ≦193 nm, particularly in the EUV region, can be fulfilled, and any desired light sources with any desired type of illumination in a predetermined surface A could be used as a light source. In particular, in addition to a uniform illumination of the reticle, the telecentry requirements of a system will be fulfilled for wavelengths ≦193 nm.

In the present application, telecentry is understood to mean that the entire system is telecentric at the wafer. This requires an adaptation of the exit pupils of the illumination system to the entrance pupils of the objective, which are lying in the finite for a reflective reticle.

In the present application, the telecentry requirement is thus fulfilled, if the aberration of the centroid beam of illumination and objective in the reticle plane does not exceed a certain extent, for example ±14.0 mrad, preferably ±1.0 mrad, and the centroid beams impinge telecentrically on the wafer.

According to the invention, the task is resolved in that in the case of the illumination system of this overall concept, the raster elements or facets of the mirror or lens device are shaped and arranged on the mirror or the lens in such a way that the images of the raster elements or facets cover by means of the optical elements the major portion of the reticle plane, and that the exit pupil of the illumination system, which is defined by the aperture and filling degree, which is the entrance pupil of the reduction optics, is illuminated in an extensively uniform manner. Thus, the entrance pupil can also be varied according to field height, e.g., it can be axially displaced.

Whereas the system is purely reflective for wavelengths in the EUV region, i.e., is designed exclusively with mirror components, refractive components are utilized as lenses in the 193-nm or 157-nm system.

The system also makes available in the 193-nm or 157-nm region an illumination system or a construction principle, which has as few as possible optical elements as possible, such as, for example, lenses or prisms. This is important for 193 nm or 157 nm for that reason, since optical elements have high absorptions.

Further, the invention makes available a process for the design of an illumination system for wavelengths ≦193 nm, particularly for EUV lithography.

The process for the design of an illumination system comprising a light source with any desired illumination A in a predetermined surface, with a mirror or lens device comprising at least two mirrors or lenses, which are organized in raster elements, as well as optical elements, which are arranged between the mirror or lens device and the reticle plane, comprises the following steps according to the invention:

the raster elements of the first mirror or lens are arranged in such a way that the field is covered and have a form, which corresponds to that of the field to be illuminated, whereby a secondary light source is assigned to each raster element;

the raster elements of the second mirror or of the lens are arranged in such a way that they sit at the site of the secondary light source and have a form, which corresponds to that of the secondary light source;

a light path is produced between the mirrors or lenses by rotating and tilting the individual raster elements of the mirror or by orienting and selecting the deflection angle of the prismatic component of the lens(es), whereby a predetermined ordering of the raster elements of the first mirror or of the first lens to the raster elements of the second mirror or the second lens is maintained; so that an overlapping of the images is achieved in the reticle plane and the secondary light sources are imaged in the exit pupil by the optical elements.

The field in the reticle or object plane is illuminated homogeneously and with partially filled aperture with the illumination system according to the invention and the process according to the invention. By introducing a field lens into such an illumination system, the exit pupil of the illumination system is put together with the entrance pupil of the objective.

Preferably, in the case of projection systems, this involves annular field systems, so that the field to be illuminated in the reticle plane represents an annular segment.

For forming the annular field, for producing the Etendu or optical flux and for homogenizing the field distribution, one or more of the mirrors is formed with raster elements similar to a honeycomb condenser in a special form of the invention.

A honeycomb condenser with planar carrier surface is represented from U.S. Pat. No. 5,581,605, whose disclosure content is particularly included also to the full extent in the disclosure of this application with respect to the production of such condensers.

In a particularly preferred manner, the honeycombs of the honeycomb condenser are to be configured in their geometry similar to that of the field to be illuminated, i.e., in the case of an annular field system with aspect ratio 1:V, the honeycombs can be configured as rectangles with an aspect ratio of 1:V.

In order to obtain a uniform illumination of the reticle even in the case of asymmetric light sources or those deviating from the point form and to satisfy the telecentry requirements—as defined previously, a second mirror or lens with raster elements is advantageously provided.

The raster elements of the first mirror or the honeycombs of the lens will be designated below as field honeycombs, and the raster elements of the second mirror or the honeycombs of the second lens will be designated as pupil honeycombs.

In order to take up the previously described "any desired" illumination (circular, rectangular, composite distributions) in surface A, and, on the other hand, to illuminate the pupil uniformly, it is of advantage if the honeycombs are made available on the mirror surface via the degrees relative to freedom of position and tilt. In the case of lens systems, these degrees of freedom can be produced, instead of the tilt and position of the individual honeycombs or raster elements, by orientation, deflection or leading-edge angle and position of the prisms in front of the individual honeycombs. According to the invention, the field honeycombs are to be arranged in such a way that the illuminated entrance plane is optimally covered. The position of the pupil honeycombs is determined in such a way that one images the secondary light sources given in advance in the entrance pupil of the objective opposite the direction of light through the field lens into the diaphragm plane of the illumination system.

After the arrangement of the individual honeycombs on the respective mirrors or lenses was determined based on the above boundary conditions, a connection of the light channels to the honeycombs can be produced, for example, by tilting of the field and pupil honeycombs in the mirror systems or prismatic components. It is particularly preferred if the assignment of field and pupil honeycombs is selected in such a way that the tilt angle and the prismatic component are minimized. Alternatively, an ordering can be aimed at, in which the intensity distribution in the pupil is extensively homogeneous.

In order to correct the tilt in the pupil illumination that remains due to the zigzag beam path, an adjustment of the reflectivity of the mirror or mirrors can be provided. The preferred further developments of the invention based on mirror systems will be described below as an example, without this being seen as a limitation to reflective systems. The person skilled in the art will transfer the measures named as examples without inventive activity also to refractive systems, without this being explicitly mentioned.

In general, in the systems according to the invention, the uniformity of the field illumination and the distribution of the secondary light sources, which is responsible in turn for the filling degrees, will be given by the number and arrangement of honeycombs of the first mirror, thus of the honeycomb condenser. The shape of the illuminated field is given by the shape of the individual honeycombs on the first honeycomb plate. If a high aspect ratio of the individual honeycombs is present, then a uniform distribution of the secondary light sources can be achieved by line-wise displacement of the honeycombs.

In the case of systems with two mirrors with raster elements, the shape of the honeycombs of the second mirror is adapted to the shape of the secondary light sources and thus is different from the shape of the first honeycombs. It is particularly preferred that these honeycombs are round, if the light source is also shaped as round.

The optical elements arranged subsequently to the mirrors with raster elements, particularly honeycombs, serve for the purpose of imaging the second honeycomb plate, i.e., the pupil plane, in the entrance pupil of the projection objective, shaping the annular field, and producing the illumination distribution according to the requirements of the exposure process.

It is particularly preferred if the optical elements comprise grazing-incidence mirrors with incidence angles $\leq 15°$. In order to minimize the light losses associated with any reflection, it is provided advantageously, if the number of field mirrors is kept small. Particularly preferred are forms of embodiment with two field mirrors at most.

A numerical example will be given below, from which the values typical for EUV lithography can be found.

If one requires an aperture in the wafer plane $NA_{wafer}=0.1-0.15$, then this indicates in the case of 4:1 systems an aperture in the reticle plane of $NA_{reticle}=0.025-0.375$. If the illumination system will illuminate this aperture up to a filling degree of $\sigma=0.6$ in a homogeneous manner, independent of the field, then the EUV source must make available the following 2-dim Etendu or Lagrange optical invariant (light conductance (LC)):

$LC_{ill.}=\sigma LC_{obj}=0.236$ mm$^2$.

The Etendu or Lagrange optical invariant LC is generally defined as follows:

$LC=x \cdot y \cdot NA^2 = A \cdot NA^2$.

In order to produce this Etendu for light sources, particularly EUV sources, the latter must be appropriately adapted.

In the case of a too large Etendu of the source, the Etendu is reduced to the required dimension at a suitable place by vignetting. In the case of the Etendu of the source that is too small, the Etendu can be effectively increased. The use of scattering disks or a partially filled pupil is possible, as it is proposed by segmenting according to the invention.

A laser-plasma source can be provided in a first form of embodiment as the light source for the EUV illumination system according to the invention.

The laser plasma source has the following parameters:

diameter of 50 $\mu$m-200 $\mu$m range of angle of radiation: 4 $\pi$

Since the radiation of a laser-plasma source is spherical, in order to take up the radiated light power, advantageously an ellipsoid mirror is used, which remodels the light of the spherical source into a convergent pencil beam.

In expanded laser-plasma sources, for example with a diameter of 200 $\mu$m, in order to avoid blurrings and for correct superimposition of the beam pencils of the field honeycombs, it is advantageous to provide a second mirror with raster elements. In the case of a point light source, for example, with a diameter of 50 µm, the blurrings are so small that such a measure can be dispensed with.

Another light source for the illumination system according to the invention is a pinch-plasma source.

A pinch-plasma source can be described as a surface radiator (Ø=1.00 mm), which irradiates in the solid angle element Ω=0.3 sr. For the correct superimposition of the individual honeycomb images, as in the case of expanded laser-plasma sources, a honeycomb plate is necessary at the position of the secondary light source. A system according to the invention with a pinch-plasma source preferably comprises at least the following elements: a collector mirror, a plane facet mirror or first honeycomb condenser for producing the secondary light sources and for field shaping and a pupil facet mirror or second honeycomb condenser for the correct field overlay as well as subsequent optical elements, for example, two field mirrors. The honeycombs of the first honeycomb condenser are shaped in a planar manner in a first form of embodiment and tilted individually, while, on the other hand, the honeycombs of the second honeycomb condenser are curved spherically and are regularly arranged on the mirror without tilting. In order to avoid vignetting, the entire system is advantageously arranged in a zig-zag beam path.

In order to be able to keep to a short structural length, particularly in systems with laser-plasma sources, a tele-system is provided in a special configuration of the invention. This tele-system can be coupled with the honeycomb condenser, so that no other mirrors are necessary. The tele-system has the further advantage that secondary light sources are arranged packed densely on the second honeycomb plate.

The tele-effect can be produced, for example, in such a way that the honeycombs are introduced onto a curved carrier surface, or that a prismatic component is produced for each honeycomb, which is produced in lens systems, for example, by prisms pre-assigned to the honeycombs, or in mirror systems by tilting the honeycombs.

Of course, in addition to the special EUV light sources described, for example above, such as laser-plasma, plasma or pinch-plasma sources, also still other EUV light sources are conceivable without deviating from the invention.

Particularly preferred additional EUV light sources are synchrotron radiation sources. Synchrotron radiation is emitted if relativistic electrons are deflected in a magnetic field. The synchrotron radiation is emitted tangentially to the electron path.

In the case of synchrotron radiation sources, currently one distinguishes three types of sources:

Bending magnets

Wigglers

Undulators

In the case of bending magnet sources, the electrons are deflected by a bending magnet and photon radiation is emitted.

Wiggler sources comprise a so-called wiggler for the deflection of the electron or of an electron beam, and this wiggler comprises a multiple number of alternating poled pairs of magnets arranged in a series. If an electron passes through a wiggler, then the electron is subjected to a periodic, vertical magnetic field; the electron oscillates correspondingly in the horizontal plane. Wigglers are further characterized by the fact that no coherency effects occur. The synchrotron radiation produced by means of a wiggler is similar to that of a bending magnet and radiates in a horizontal steradian. In contrast to the bending magnet, it has a flow reinforced by the number of poles of the wiggler.

The transition from wiggler source to undulator source is indistinct.

In the case of undulator sources, the electrons in the undulator are subjected to a magnetic field with shorter periods and smaller magnetic field of the deflection pole than in the case of the wiggler, so that interference effects of synchrotron radiation occur. Due to the interference effects, the synchrotron radiation has a discontinuous spectrum and radiates both horizontally and vertically in a small steradian element; i.e., the radiation is strongly directed.

All of the above-described synchrotron EUV radiation sources with suitable dimensioning make available EUV radiation, for example, from 13 or 11 nm with sufficient power for EUV lithography.

Concerning synchrotron radiation, reference is made to Ernst Eckhart Koch, "Handbook of Synchrotron Radiation", 1983, Elseiver Science, New York, whereby the disclosure content of this publication is included to its full extent in the present application.

BRIEF DESCRIPTION OF THE DRAWINGS

The invention will be described below on the basis of drawings.

Here.

DESCRIPTION OF THE INVENTION

It shall be shown theoretically on the basis of FIGS. 1–20, how, with the help of the design process according to the invention and the illumination device according to the invention, a system can be provided for any desired illumination distributions A in a plane, which satisfies the requirements with reference to uniformity and telecentry.

Figure 1:
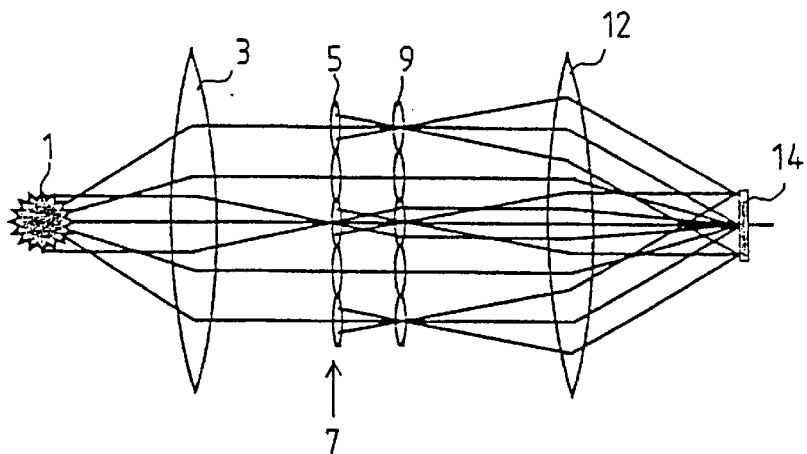
FIG. 1: Principle diagram of the beam path of a system with two honeycomb plates.

In FIG. 1, a principle diagram of the beam path of a system with two honeycomb plates is illustrated. The light of source 1 is collected by means of a collector lens 3 and converted into a parallel or convergent pencil beam. The field honeycombs 5 of the first honeycomb plate 7 decompose the light pencil and produce secondary light sources at the site of the pupil honeycombs 9. The field lens 12 forms these secondary sources in the exit pupil of the illumination system or the entrance pupil of the subsequent objective. Such an arrangement is characterized by an interlinked beam path of field and pupil planes from the source up to the entrance pupil of the objective. For this, the designation "Kohler illumination" is also often selected.

The illumination system according to FIG. 1 is considered segmentally below. Since the intersection of the light and aperture distribution is in the plane of the field honeycombs, the system can be described independent of source type and collector mirror.

Figure 2A:
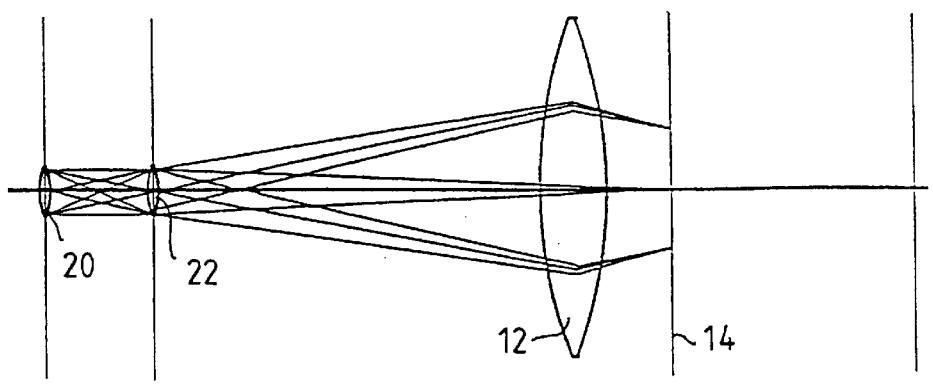
FIGS. 2a, 2b: Field and pupil imaging for the central pair of honeycombs.
Figure 2B:
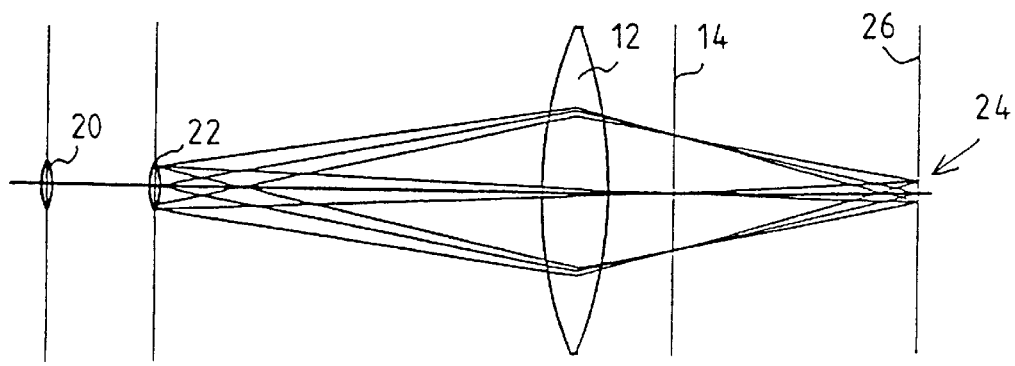

The field and pupil imaging is illustrated for the central pair of honeycombs 20, 22 in FIGS. 2A and 2B. The field honeycomb 20 is imaged on the reticle 14 or the mask to be imaged by means of the pupil honeycomb 22 and the field lens 12. The geometric extension of the field honeycomb 20 determines the shape of the illuminated field in the reticle plane 14. The image scale is approximately given by the ratio of the distances from pupil honeycomb 22 to reticle 14 and field honeycomb 20 to pupil honeycomb 22. The optical effect of the field honeycomb 20 is designed such that an image of light source 1, a secondary light source, is formed at the site, i.e., the position, of pupil honeycomb 22. If the extension of the light source is small, for example, approximately punctiform, then all of the light beams run through the optical axis of the pupil honeycomb 22. In such a case, an illumination device can be produced, in which the pupil honeycomb is dispensed with.

As is shown in FIG. 2B, the task of field lens 12 consists of imaging the secondary light sources in the entrance pupil 26 of objective 24. If a field lens is introduced into the beam path, then the field imaging is influenced in such a way that it forms the annular field by control of the distortion. The imaging scale of the field honeycomb image is thus not changed.

Figure 3:
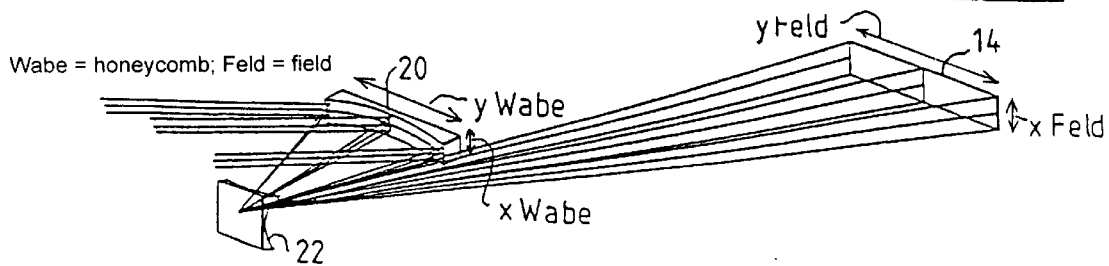
FIG. 3: Course of the light beam for a rectangular field honeycomb in combination with a rectangular pupil honeycomb.

A special geometric form of a field honeycomb and a pupil honeycomb of the course of the light beams is shown in FIG. 3.

Figure 4:
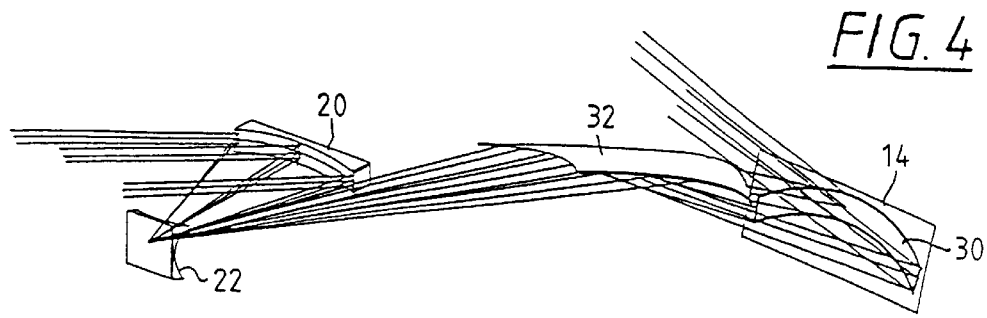
FIG. 4: Course according to FIG. 3 with field lens introduced in the beam course.

In the form of embodiment represented in FIG. 3, the shape of field honeycomb 20 is selected as a rectangle. Thus, the aspect ratio of the field honeycomb 20 corresponds to the ratio of the arc length to the annular width of the required annular field in the reticle plane. The annular field is formed by the field lens, as shown in FIG. 4. Without the field lens, as shown in FIG. 3, a rectangular field is formed in the reticle plane.

As shown in FIG. 4, a grazing-incidence field mirror 32 is used for the shaping of annular field 30. Under the secondary condition that the beam reflected by the reticle must no longer run back into the illumination system, one or two field mirrors 32 are required, each time depending on the position of the entrance pupil of the objective.

Figure 5:
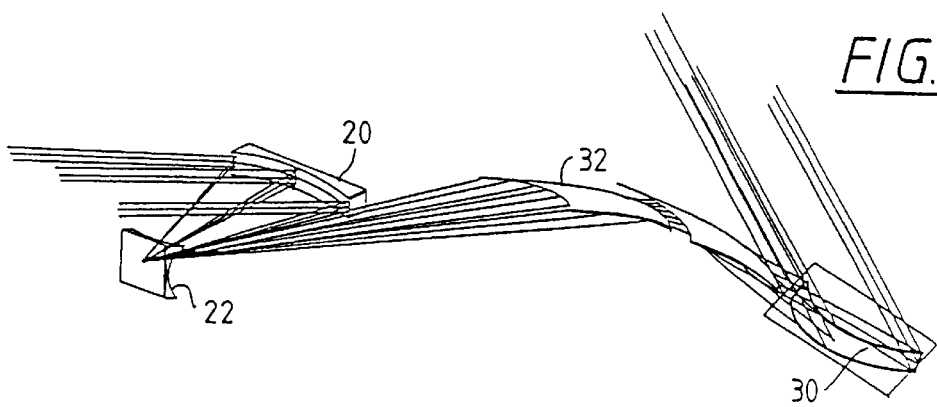
FIG. 5: Course according to FIG. 3 with two field lenses introduced in the beam course.

If the principal rays run divergently into the objective that is not shown, then a field mirror 32 is sufficient, as shown in FIG. 4. In the case of the convergent principal beam path, two field mirrors are required. The second field mirror must rotate the orientation of the ring. Such a configuration is shown in FIG. 5.

In the case of an illumination system in the EUV wavelength region, all components must be formed reflectively.

Due to the high reflection losses at $\lambda=10$ nm–14 nm, it is advantageous that the number of reflections be kept as small as possible.

In the construction of the reflective system, the mutual vignetting of the beams must be taken into consideration. This can occur due to construction of the system in a zigzag beam path or by operating with obscurations.

The process according to the invention will be described below for the preparation of a design for an EUV illumination system with any desired illumination in a plane A, as an example.

Figure 6:
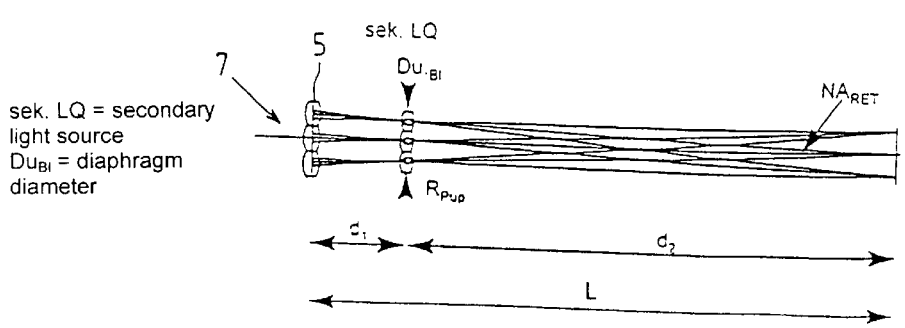
FIG. 6: System with field and pupil honeycombs.

The definitions necessary for the process of the invention are shown in FIG. 6.

First, the beam path is calculated for the central pair of honeycombs.

In a first step, the size of field honeycombs 5 of the field honeycomb plate 7 will be determined. As indicated previously, the aspect ratio (x/y) results for rectangular honeycombs from the shape of the annular field in the reticle plane. The size of the field honeycomb is determined by expansion or extension A of the intensity distribution of the arbitrary light source in the plane of the field honeycombs and the number N of the field honeycombs on the honeycomb plate, which in turn is given by the number of secondary light sources. The number of secondary light sources results in turn from the uniformity of the pupil illumination as well as the intermixing.

The honeycomb surface $A_{honeycomb}$ of a field honeycomb can be expressed as follows with $x_{honeycomb}$, $y_{honeycomb}$:

$$A_{honeycomb} = x_{honeycomb} \cdot y_{honeycomb} = (x_{field}/y_{field}) \cdot y_{honeycomb}$$

whereby $x_{field}$, $y_{field}$ describe the magnitude of the rectangle, which establishes the annular field. Further, the following is valid for the number N of field honeycombs:

$$N = A/A_{honeycomb} = A/[y^2_{honeycomb} \cdot (x_{field}/y_{field})].$$

From this, there results for the size of the individual field honeycomb:

$$y_{honeycomb} = \sqrt{A/[N \cdot (x_{field}/y_{field})]}$$

and $$x_{honeycomb} = (x_{field}/y_{field}) \cdot y_{honeycomb}$$

The honeycomb size and the size of the rectangular field establish the imaging scale $\beta_{honeycomb}$ of the honeycomb imaging and thus the ratio of the distances $d_1$ and $d_2$.

$$\beta_{honeycomb} = x_{field}/y_{field} = d_2/d_1$$

The pregiven structural length L for the illumination system and the honeycomb imaging scale $\beta_{honeycomb}$ determine the absolute size of $d_1$ and $d_2$ and thus the position of the pupil honeycomb plate. The following is valid:

$$d_1 = L/(1+\beta_{honeycomb})$$
$$d_2 = d_1 \cdot \beta_{honeycomb}$$

Then, $d_1$ and $d_2$ determine in turn the radius of the pupil honeycombs. The following is valid:

$$R_{Pup} = \frac{2 \cdot d_1 \cdot d_2}{d_1 + d_2}$$

In order to image the pupil honeycombs in the entrance pupil of the objective and to remodel the rectangular field into an annular field, one or more field lenses, preferably of toroidal form, are introduced between the pupil honeycomb and the reticle. By introducing the field mirror, the previously given structural length is increased, since among other things, the mirror must maintain minimum distances in order to avoid vignettings.

The positioning of the field honeycombs depends on the intensity distribution in the plane of the field honeycombs. The number N of the field honeycombs is pregiven by the number of secondary light sources. The field honeycombs will preferably be arranged on the field honeycomb plate in such a way that they cover the illuminated surfaces without mutually vignetting.

In order to position the pupil honeycombs, the raster pattern of the secondary light sources in the entrance pupil of the objective will be given in advance. The secondary light sources are imaged by the field lens counter to the direction of light. The diaphragm plane of this imaging is found in the reticle plane. The images of the secondary light sources give the (x, y, z) positions of the pupil honeycombs. The tilt and rotational angles remain as degrees of freedom for producing the light path between the field and pupil honeycombs.

If a pupil honeycomb is assigned to each field honeycomb in one configuration of the invention, then the light path will be produced by tilting and rotating from field and pupil honeycombs. Thereby beam pencils are deviated in such a way that the center beams all intersect the optical axis in the reticle plane.

The assignment of field and pupil honeycombs is freely made. One possibility for arrangement would be to assign spatially adjacent honeycombs to each other each time. Thereby, the deflecting angles become minimal. Another possibility consists of equilibrating the intensity distribution in the pupil plane. This is made, for example, if the intensity distribution has a distribution in the plane of the field honeycombs. If the field and pupil honeycombs have similar positions, the distribution is transferred to the pupil illumination.

The intensity can be equalized by intermixing of the assignment.

Advantageously, the individual components of field honeycomb plate, pupil honeycomb plate and field mirror of the illumination system are arranged in the beam path such that a beam path free of vignetting is possible. If such an arrangement has effects on the imaging, then the individual light channels and the field lenses must be post-optimized.

With the design process described above, illumination systems for EUV lithography are obtained for any desired illumination A with two normal-incidence and one to two grazing-incidence reflections, and these systems have the following properties:

An homogeneous illumination, for example, of an annular field

An homogeneous and field-independent pupil illumination

The combining of the exit pupil of the illumination system and the entrance pupil of the objective The adjustment of a pregiven structural length The uptake of the maximum possible optical conductance or optical flux value.

Arrangements of field honeycombs and pupil honeycombs will be described below for one form of embodiment of the invention with field and pupil honeycomb plates.

First, different arrangements of the field honeycombs on the field honeycomb plate will be considered. The intensity distribution can be selected as desired.

The introduced examples are limited to simple geometric forms, such as circle, rectangle, or the coupling of several circles or rectangles.

The intensity distribution will be homogeneous within the illuminated region or have a slowly varying course. The aperture distribution will be independent of the field.

Figure 7:
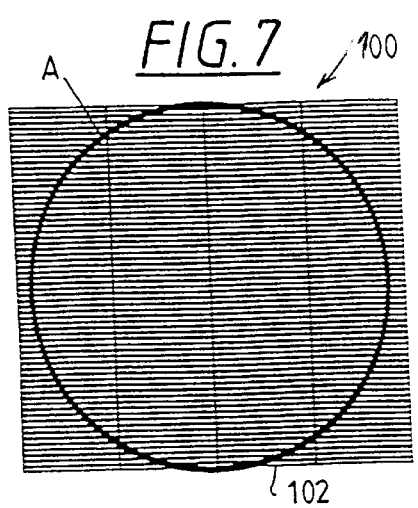
FIGS. 7–14: Different arrangements of field honeycombs on a field honeycomb plate.
Figure 8:
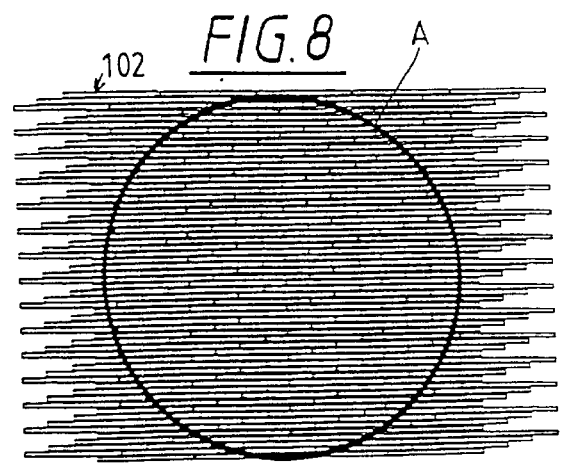

In the case of circular illumination A of field honeycomb plate 100, field honeycombs 102 may be arranged, for example, in columns and rows, as shown in FIG. 7. As an alternative to this, the space points of the honeycombs can be distributed uniformly by shifting the rows over the surface, as shown in FIG. 8. The latter arrangement is better adapted to a uniform distribution of the secondary light sources.

Figure 9:
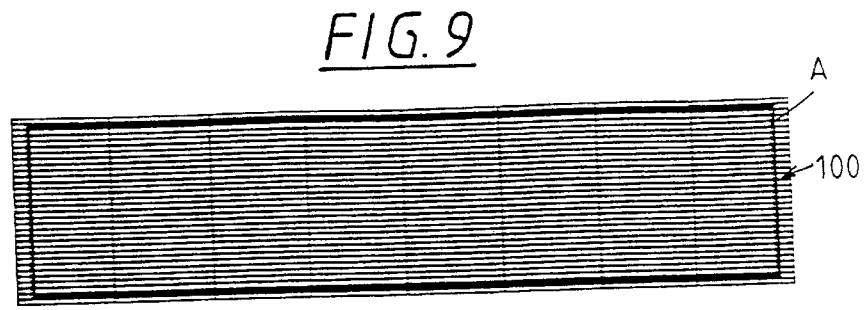
Figure 10:
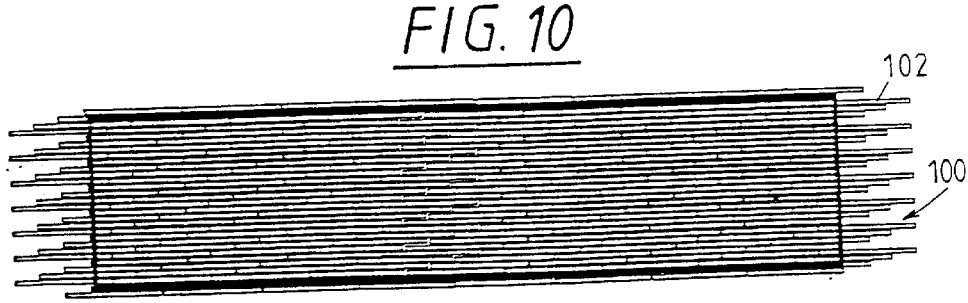

A rectangular illumination A is shown in FIG. 9. A shift of the rows, as shown in FIG. 10, leads to a more uniform distribution of the secondary light sources. However, these are arranged within a rectangle corresponding to the expansion of the field honeycomb plate. In the case of rectangular illumination, it is necessary, in order to produce the light path between the field and pupil honeycombs, to tilt the field honeycombs, so that the beam pencils impinge on the pupil honeycombs, which are arranged, for example, inside a circle, and, which also must be tilted.

Figure 11:
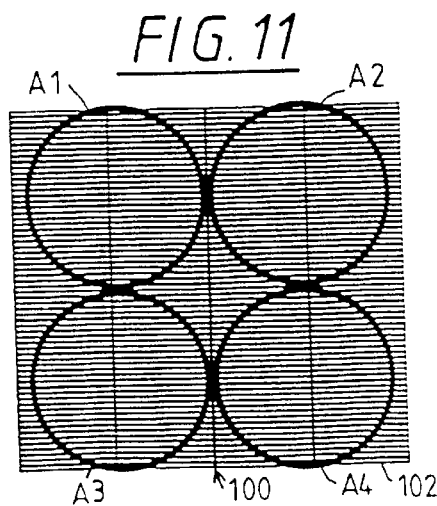
Figure 12:
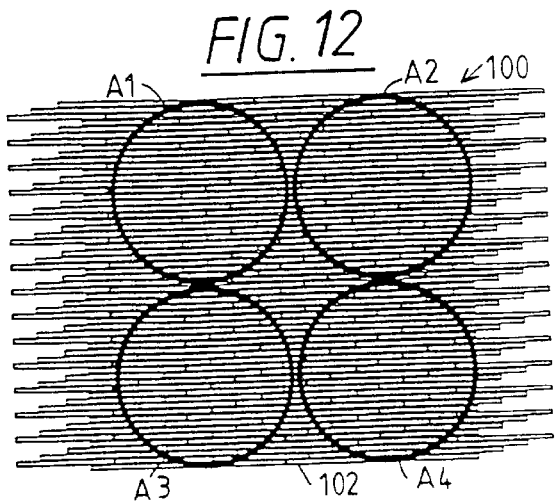

If illumination A of field honeycomb plate 100 comprises several circles, A1, A2, A3, A4, for example by coupling several sources, then in the case of uniform honeycomb size, intermixing is insufficient with an arrangement of the honeycombs in rows and columns according to FIG. 11. A more uniform illumination is obtained by shifting the honeycomb rows, as shown in FIG. 12.

Figure 13:
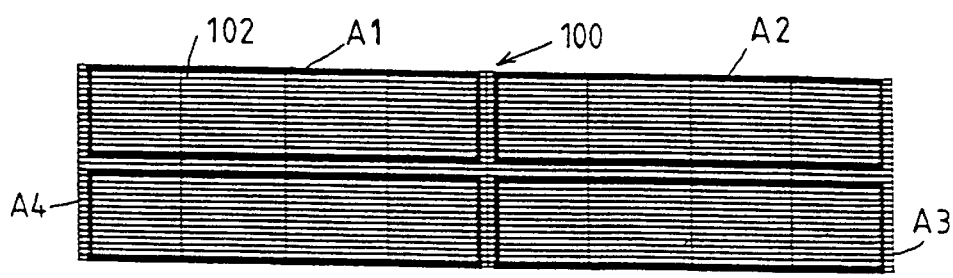
Figure 14:
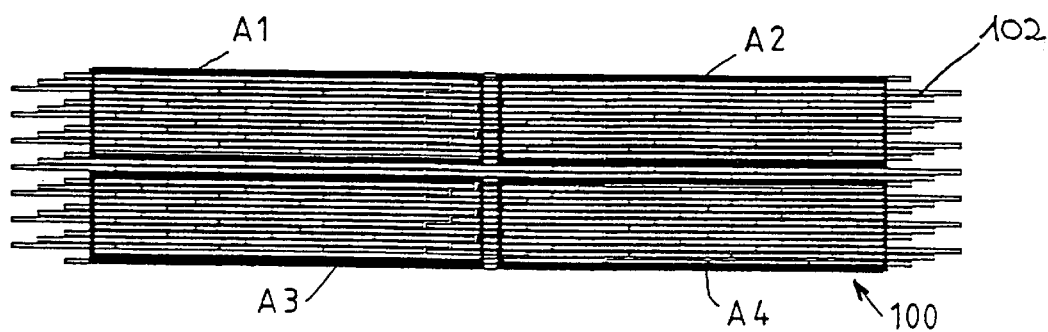

FIGS. 13 and 14 show the distribution of field honeycombs 102 in the case of combined illumination from the individual rectangles A1, A2, A3, A4.

Now, for example, arrangements of the pupil honeycombs on the pupil honeycomb plate will be described.

In the arrangement of pupil honeycombs, two points of view are to be considered:

1. For minimizing the tilt angle of field and pupil honeycombs for producing the light path, it is advantageous to maintain the arrangement of field honeycombs. This is particularly advantageous with an approximately circular illumination of the field honeycomb plate.

2. For homogeneous filling of the pupil, the secondary light sources will be distributed uniformly in the entrance pupil of the objective. This can be achieved by providing a uniform raster pattern of secondary light sources in the entrance pupil of the objective. These are imaged counter to the direction of light with the field lens in the plane of the pupil honeycombs and determine in this way the ideal site of the pupil honeycombs.

If the field lens is free of distortion, then the distribution of the pupil honeycombs corresponds to the distribution of the secondary light sources. However, since the field lens forms the annular field, distortion is purposely introduced. This does not involve rotation-symmetric hour-glass or barrel-shaped distortion, but involves the bending of horizontal lines into arcs. In the ideal case, the y distance of the arcs remains constant. Real grazing-incidence field mirrors, however, also show an additional distortion in the y-direction.

Figure 15:
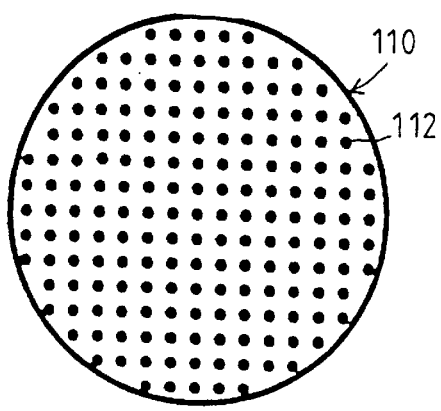
FIGS. 15–17: Raster of secondary light sources in the entrance pupil of the objective.

A raster 110 of secondary light sources 112 in the entrance pupil of the objective, which is also the exit pupil of the illumination system, is shown in FIG. 15, as it had been produced for distortion-free imaging. The arrangement of the secondary light sources 112 corresponds precisely to the pregiven arrangement of pupil honeycombs.

Figure 16:
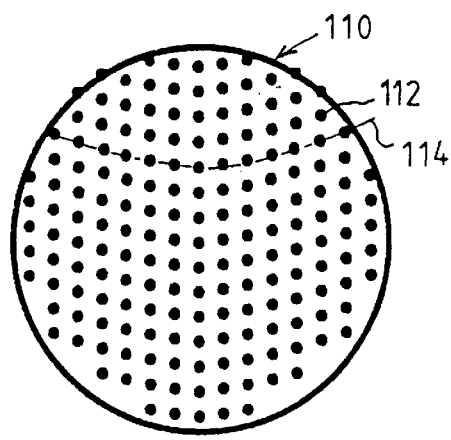

If the field lenses are utilized for shaping the annular field, as in FIG. 16, then the secondary light sources 112 lie on arcs 114. If the pupil honeycombs of individual rows are placed on the arcs which hold up the distortion, then one can place the secondary light sources again on a regular raster.

Figure 17:
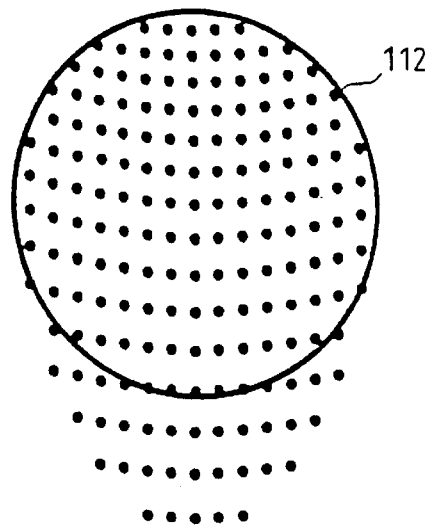

If the field lens also introduces distortion in the y-direction, then the pupil is distorted in the y-direction, as shown in FIG. 17.

The expansion of the illuminated surface onto the field honeycomb plate is given in advance with the definition of the input illumination. The illumination of the pupil honeycomb plate is determined by the structural length and the aperture in the reticle plane.

As described extensively above, the two surfaces must be fine-tuned to one another by rotating and tilting the field and pupil honeycombs.

For illustration, the problems with refractory superstructures will be explained. The examples, however, can be transferred directly to reflective systems. Various cases can be distinguished for a circular illumination of field honeycomb plates, as presented below.

Figure 18:
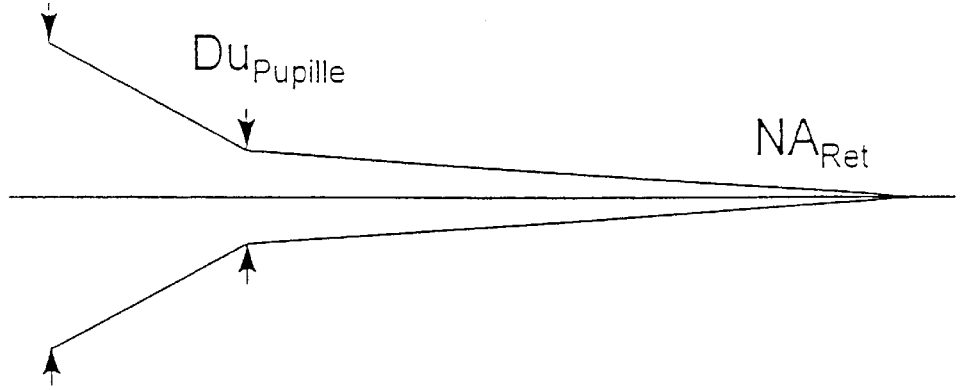
FIGS. 18–20: Relationship between illuminated surfaces of pupil honeycomb plate and field honeycomb plate as well as structural length and aperture in the reticle plane.

If a collecting effect is introduced by tilting the field honeycombs, and a diverging effect is introduced by tilting the pupil honeycombs, then the pencil cross section can be reduced. The tilt angles of the individual honeycombs are determined by means of the mid rays for each pair of honeycombs. The system acts like a tele-system for the mid rays, as shown in FIG. 18.

How far the field honeycombs must be tilted, depends on the convergence of the impinging beam pencil. If the convergence is adapted to the reduction of the pencil cross section, the field honeycombs can be introduced onto a planar substrate without a tilt angle.

Figure 19:
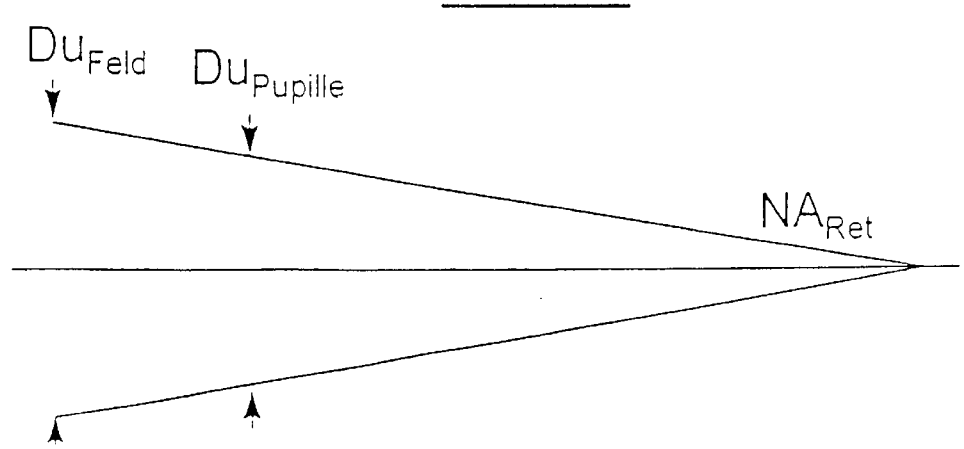

A special case results, if the convergence between the field and the pupil honeycomb plate corresponds to the aperture at the reticle, as shown in FIG. 19.

No divergng effect must be introduced by the pupil honeycombs, so they can be utilized without surface tilt. If the light source also has a very small light conductance, the pupil honeycomb can be completely dispensed with.

Figure 20:
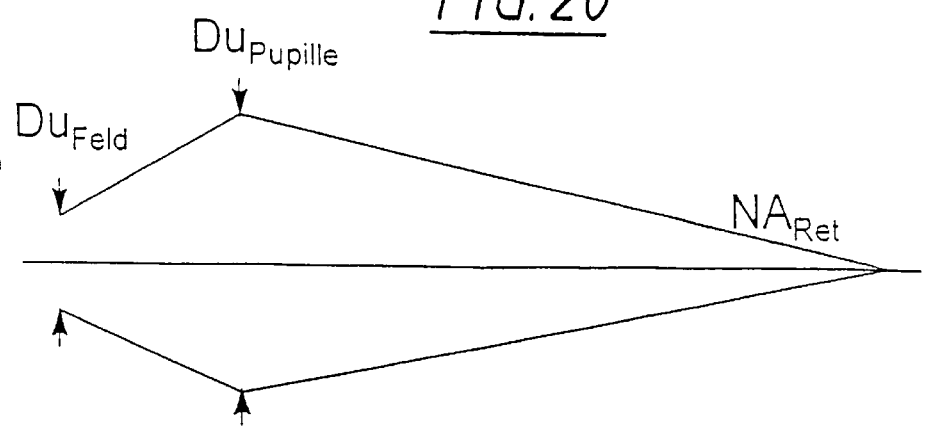

A magnification of the pencil cross section is possible, if diverging action is introduced by tilting of the field honeycombs, and collecting effect is introduced by tilting the pupil honeycombs. The system operates like a retrofocus system for the mid rays, as shown in FIG. 20.

If the divergence of the impinging radiation corresponds to the pencil enlargement between field and pupil honeycombs, then the field honeycombs can be used without surface tilt.

Instead of the round form that has been described, rectangular or other forms of illumination A of the field honeycomb plate are possible.

The following drawings describe one form of embodiment of the invention, in which a pinch-plasma source is used as the light source of the EUV illumination system.

Figure 21:
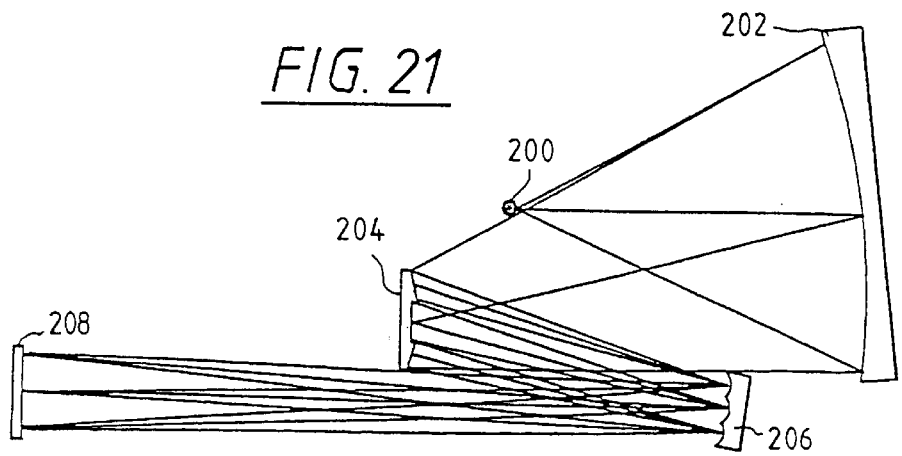
FIGS. 21–22: Illumination system with a collector unit, a diverging as well as a collecting mirror.
Figure 22:
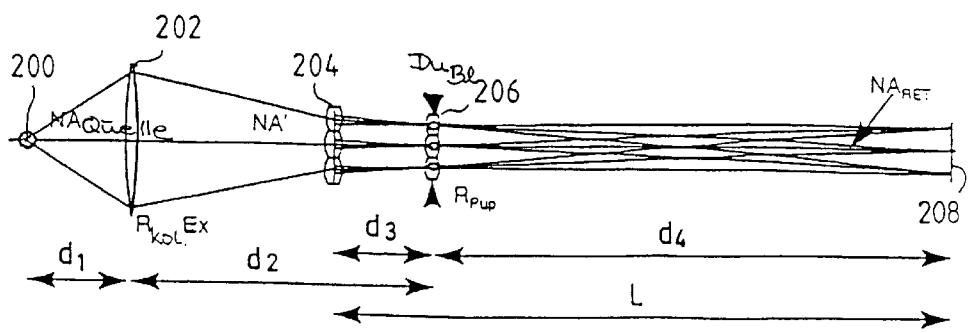

The principal construction without field lens of such a form of embodiment is shown in FIG. 21; FIG. 22 shows the abbreviations necessary for the system derivation, whereby for better representation, the system was plotted linearly and mirrors were indicated as lenses. An illumination system with pinch-plasma source 200, as shown in FIG. 21, comprises a light source 200, a collector mirror 202, which collects the light and reflects it in the field honeycomb plate 204. By reflection at the field honeycombs, the light is introduced into the respective pupil honeycombs of pupil honeycomb plate 206 and from there to reticle 208. The pinch-plasma source is an expanded light source (approximately 1 mm) with a directional radiation in a relatively small steradian region of approximately $\Omega=0.3$ sr. Based on the expansion, a pupil honeycomb condenser 206 is recommended for illumination with a pinch-plasma source.

The following dimensional specifications are used, for example, for an illumination system for EUV lithography:

Annular field: R=100 mm, segment −60°, field height ±3.0 mm, which corresponds to a rectangular field of 105 mm×6 mm Aperture at the reticle: $NA_{ret}=0.025$ Aperture at the source: $NA_{source}=0.3053$ Structural length L=1400.0 mm Number of honeycombs, which find place in an x-row: 4

$d_1=330.0$ mm

If the following coupling of the individual quantities is now considered:

$$NA_{Ret} = \frac{DU_{BL}/2}{L} \Rightarrow DU_{BL} = 2 \cdot L \cdot NA_{Ret}$$

$$\frac{DU_{BL}}{x_{Wabe}} = 4.0 \Rightarrow x_{Wabe} = \frac{DU_{BL}}{4.0}$$

$$\beta_{Wabe} = \frac{x_{Feld}}{x_{Wabe}} = \frac{d_4}{d_3} \Rightarrow \beta_{Wabe} = \frac{x_{Feld}}{x_{Wabe}}$$

$$L = d_3 + d_4 \Rightarrow d_4 = d_3 \cdot \beta_{Wabe}$$

$$NA' = \frac{DU_{BL}/2}{d_3} \Rightarrow d_3 = \frac{L}{1+\beta_{Wabe}}$$

$$\tan(\theta) = -\frac{(1-Ex)\cdot\sin(\theta')}{2\sqrt{Ex}-(1-Ex)\cdot\cos(\theta')} \Rightarrow NA' = \frac{DU_{BL}/2}{d_3}$$

$$Ex = \left(\frac{sk-sl}{sk+sl}\right)^2 = \left(\frac{d_2-d_1}{d_2+d_1}\right)^2 \Rightarrow Ex = f(NA_{QU}, NA')$$

$$Ex = 1 - \frac{R_{Kol}}{a} \Rightarrow d_2 = d_1 \cdot \frac{1+\sqrt{Ex}}{1-\sqrt{Ex}}$$

$$\frac{2}{R_{Pup}} = \frac{1}{d_3} + \frac{1}{d_4} \Rightarrow R_{Kol} = \frac{d_1+d_2}{2}\cdot(1-Ex)$$

$$\Rightarrow R_{Pup} = \frac{2\cdot d_3 \cdot d_4}{d_3+d_4}$$

Wabe = honeycomb, Feld = field,

Kol = collector, $DU_{BL}$ = diaphragm diameter the system can be completely derived from the pregiven quantities.

If one utilizes the allowances for annular field, aperture at the reticle, etc. in the above formulas, then the following system parameters result:

$$DU_{BL} = 2 \cdot L \cdot NA_{Ret} = 2 \cdot 1400 \text{ mm} \cdot 0.025 = 70.0 \text{ mm}$$

$$x_{Wabe} = \frac{DU_{BL}}{4.0} = \frac{70.0 \text{ mm}}{4.0} = 17.5 \text{ mm}$$

$$\beta_{Wabe} = \frac{x_{Feld}}{x_{Wabe}} = \frac{105.0 \text{ mm}}{17.5 \text{ mm}} = 6.0$$

$$d_3 = \frac{L}{1+\beta_{Wabe}} = \frac{1400.0 \text{ mm}}{1+6.0} = 200.0 \text{ mm}$$

$$d_4 = d_3 \cdot \beta_{Wabe} = 200.0 \text{ mm} \cdot 6.0 = 1200.0 \text{ mm}$$

$$NA' = \frac{DU_{BL}/2}{d_3} = \frac{70.0 \text{ mm}/2}{200.0 \text{ mm}} = 0.175$$

$$Ex = f(NA_{QU}, NA') = 0.078$$

$$d_2 = d_1 \cdot \frac{1+\sqrt{Ex}}{1-\sqrt{Ex}} = 330.0 \text{ mm} \cdot \frac{1+\sqrt{0.078}}{1-\sqrt{0.078}} = 585.757 \text{ mm}$$

$$R_{Kol} = \frac{d_1+d_2}{2}\cdot(1-Ex) = \frac{330.0 \text{ mm} + 585.757 \text{ mm}}{2}\cdot(1-0.078) = 422.164 \text{ mm}$$

$$R_{Pup} = \frac{2 \cdot d_3 \cdot d_4}{d_3+d_4} = \frac{2 \cdot 200 \cdot 1200}{200+1200} = 342.857 \text{ mm}$$

Figure 23:
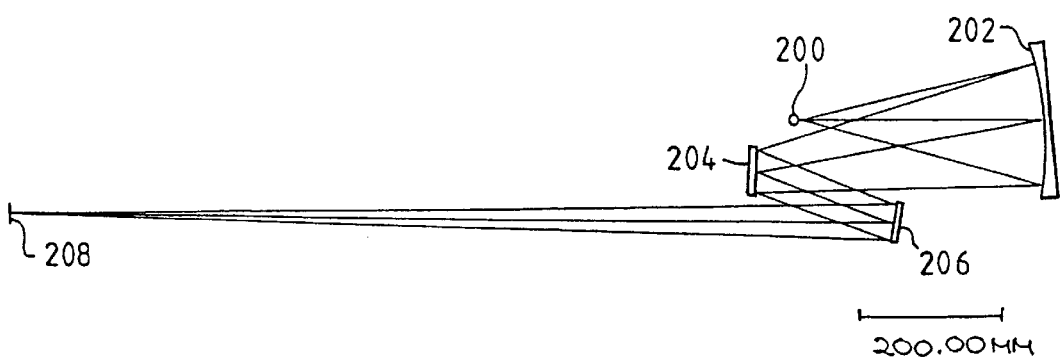
FIGS. 23–24: Beam course in a system with collector unit, diverging and collecting mirrors.

Wabe = honeycomb, Feld = field, Kol = collector, $DU_{BL}$ = diaphragm diameter, QU = source The total system with the previously indicated dimensions is shown in FIG. 23 up to the reticle plane in the yz section. The mid and the two edge beams are depicted for the central field honeycomb (0, 0) and the two outermost field honeycombs each time. A secondary light source is produced in the pupil plane by each honeycomb.

Figure 24:
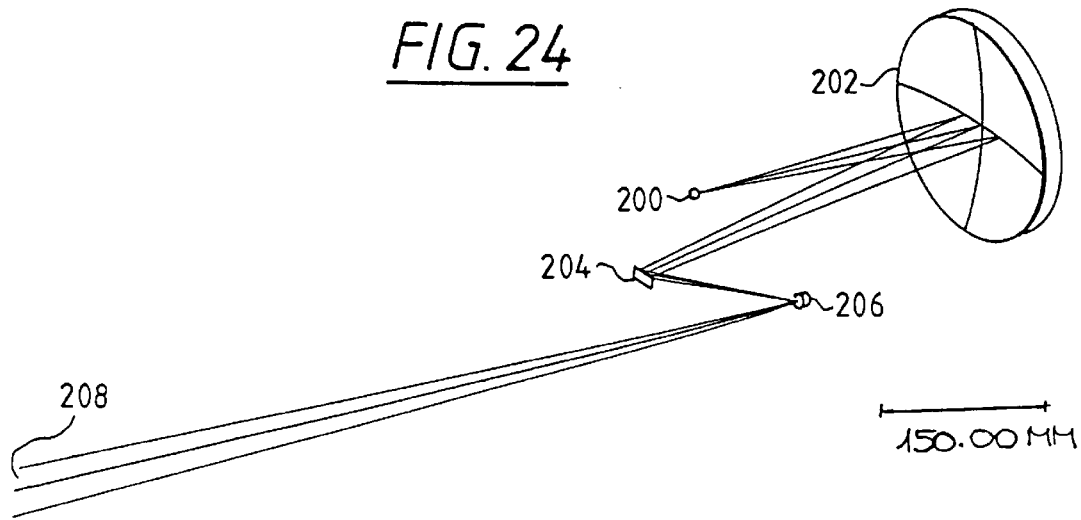

The total system is shown in FIG. 24 with an x-z fan of beams, which impinge on the central honeycomb.

Figure 25:
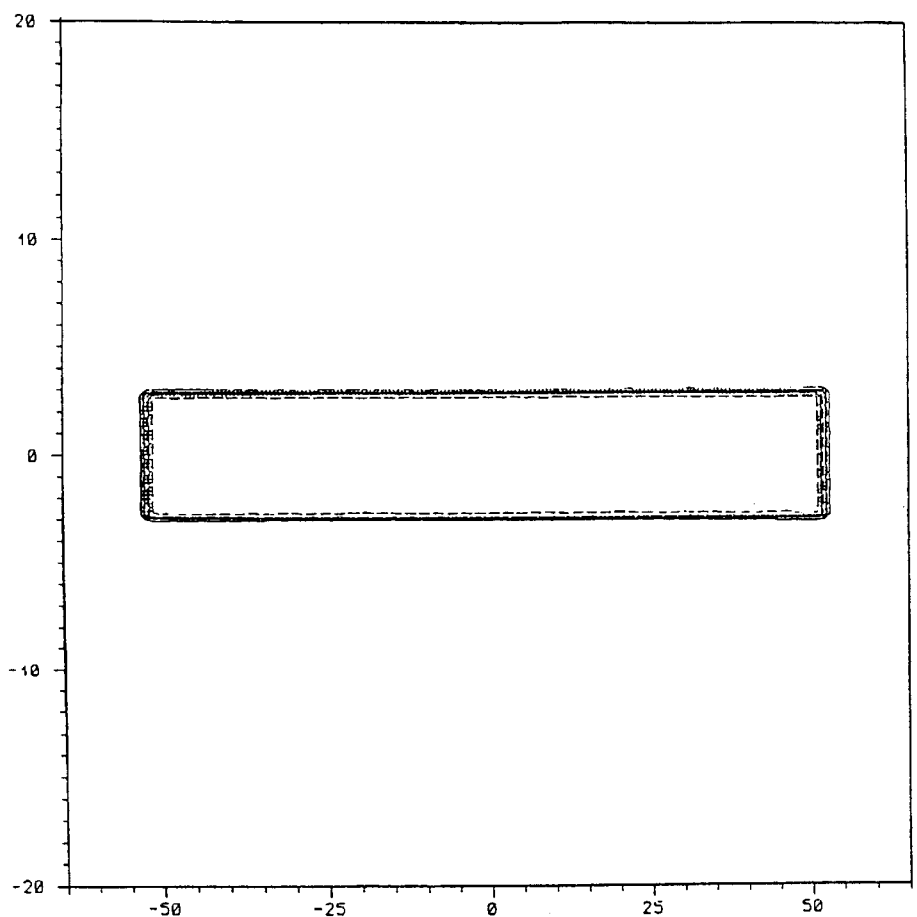
FIGS. 25–26: Illumination of the reticle of a system according to FIGS. 23–24.
Figure 26:
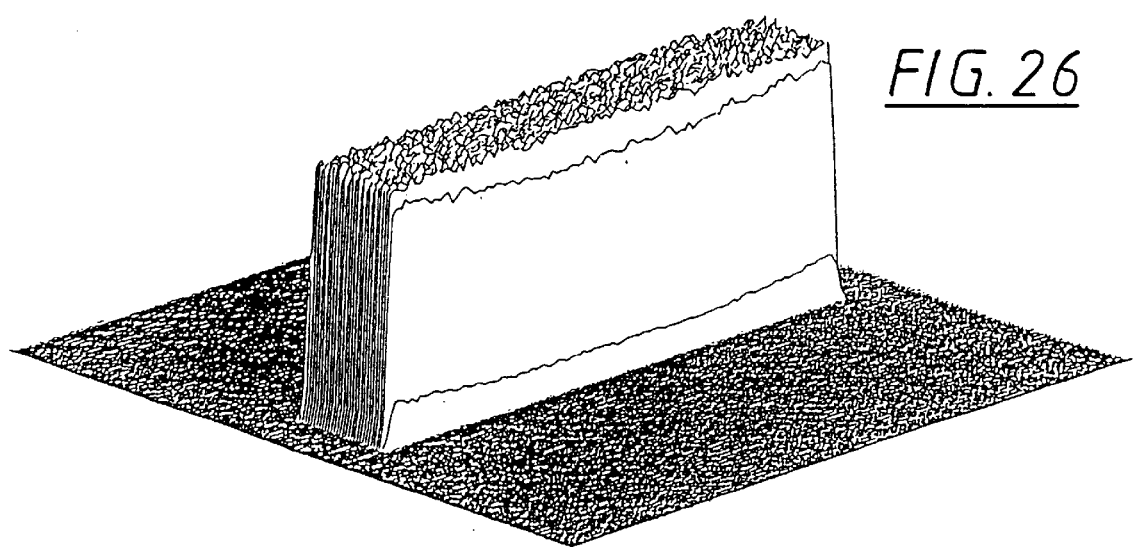

FIGS. 25 and 26 show the illumination of the reticle with the rectangular field (−52.5 mm<x<+52.5 mm; −3.0 mm<x<+3.0 mm) according to FIGS. 25 or 26 in contour lines and 3D representation. The individual partial images are optimally superimposed in the reticle plane also in the case of the expanded secondary light sources, which are produced by the pinch-plasma source, since a pupil honeycomb plate is used.

Figure 27:
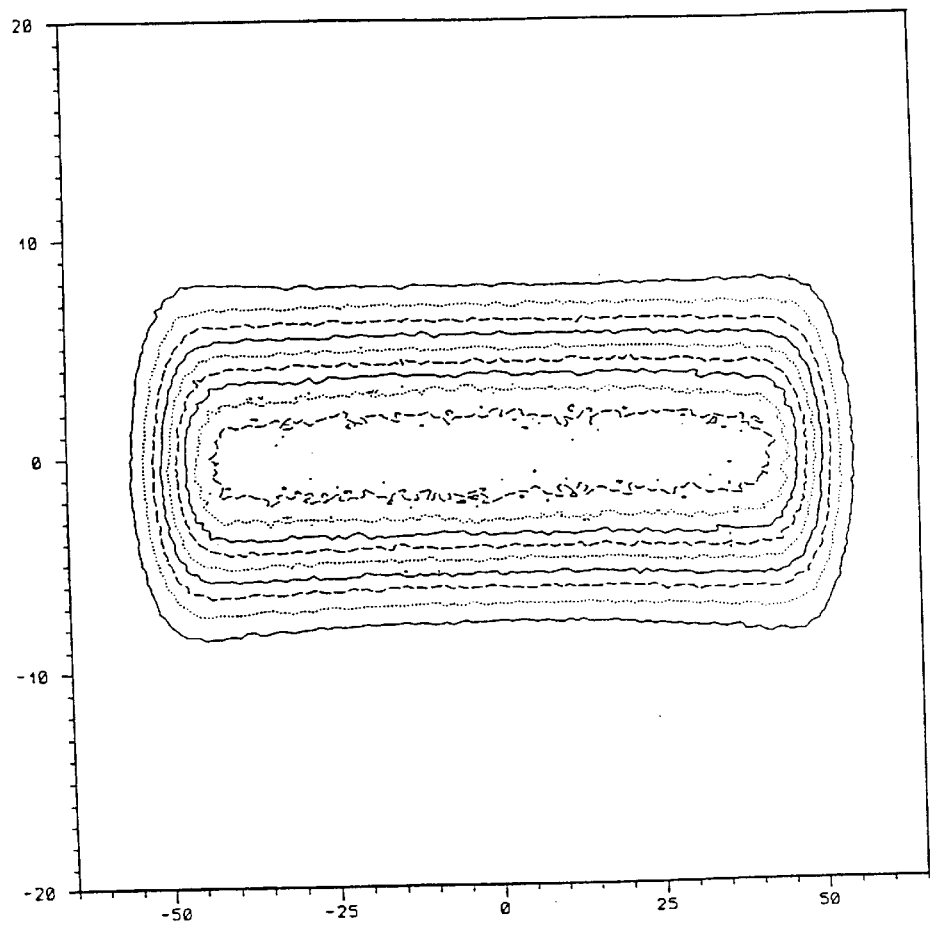
FIGS. 27–28: Illumination of the reticle with a rectangular field of a system according to FIGS. 23–24 without pupil honeycombs.
Figure 28:
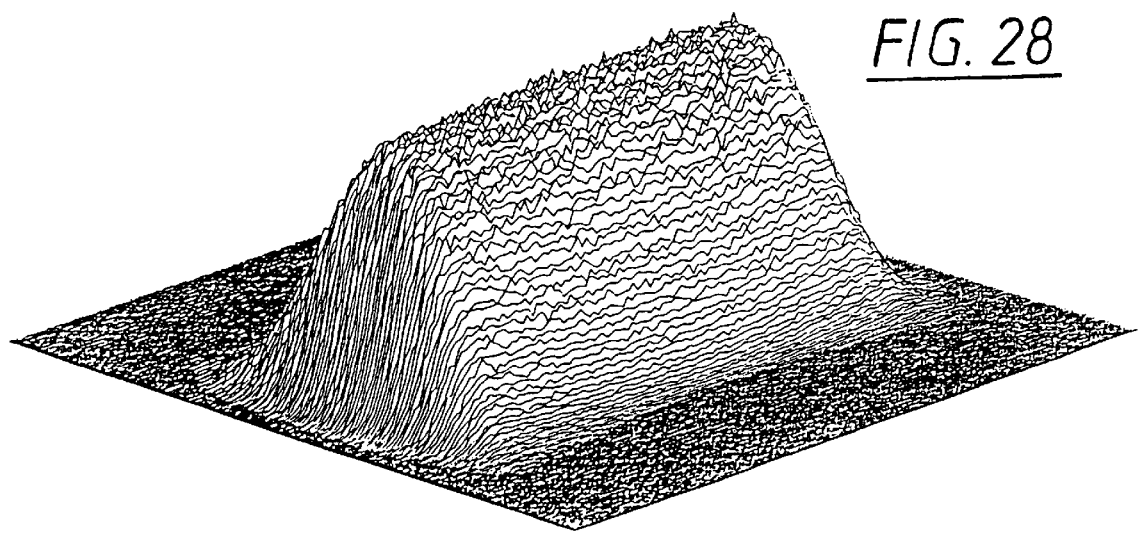

In comparison to this, the illumination of the reticle without pupil honeycomb plate is shown in contour lines and 3D representation in FIGS. 27 and 28. The partial images of the field honeycombs are not sharply imaged due to the finite aperture at the field honeycomb plate.

Figure 29:
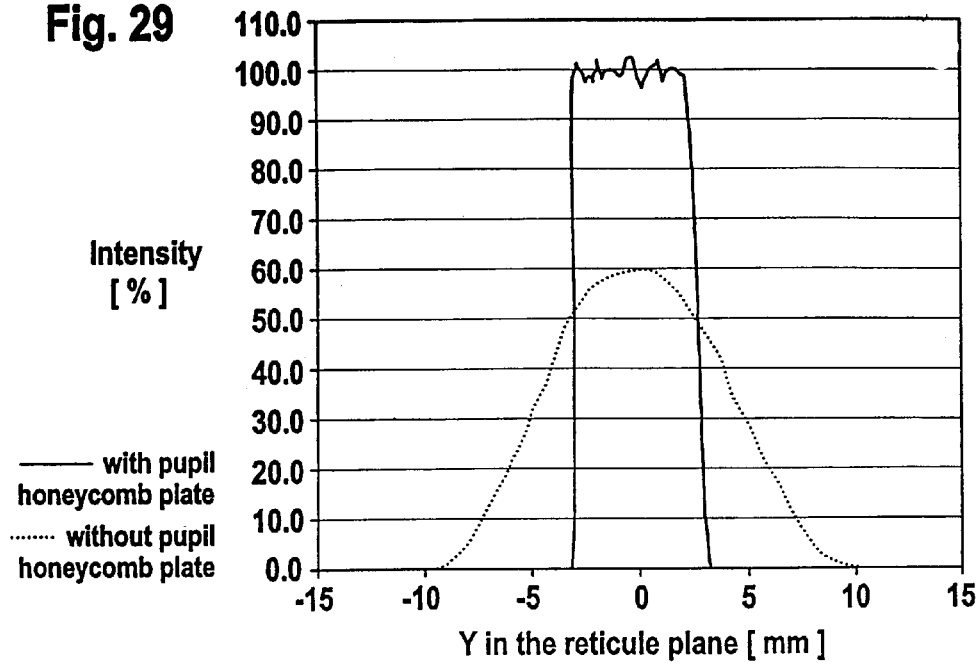
FIG. 29: Comparison of the intensity course of a system according to FIGS. 23–24 with and without pupil honeycomb plate.

FIG. 29 shows an intensity segment parallel to the y-axis for x=0.0 with and without pupil honeycomb plate. Whereas an ideal rectangular profile is formed with pupil facets, the profile decomposes without the pupil facets.

Figure 30:
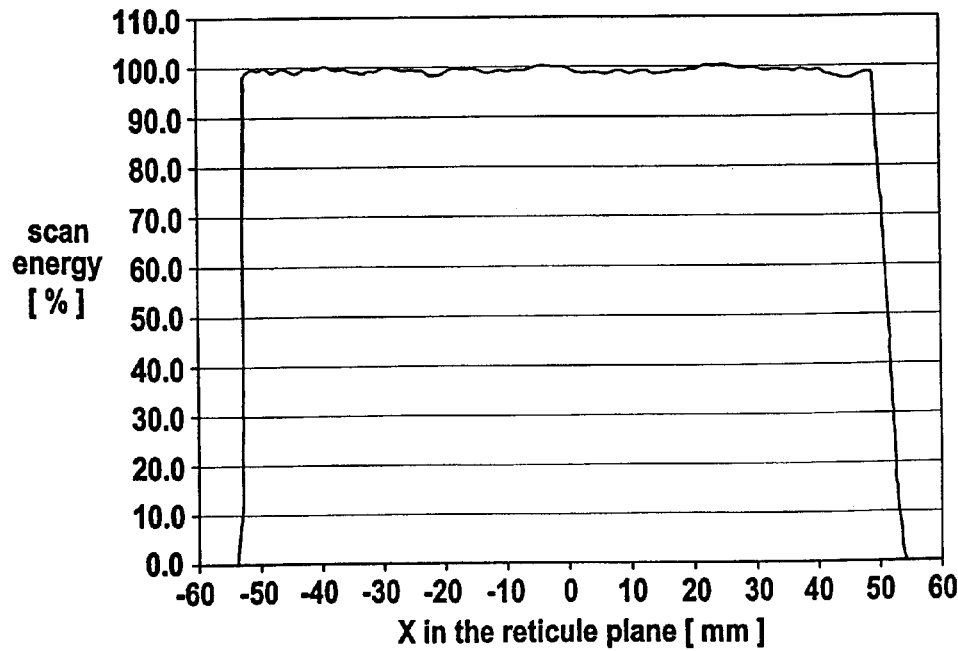
FIG. 30: Integral scan energy in the reticle plane of a system according to FIGS. 23–24 with pupil honeycomb plate.
Figure 31:
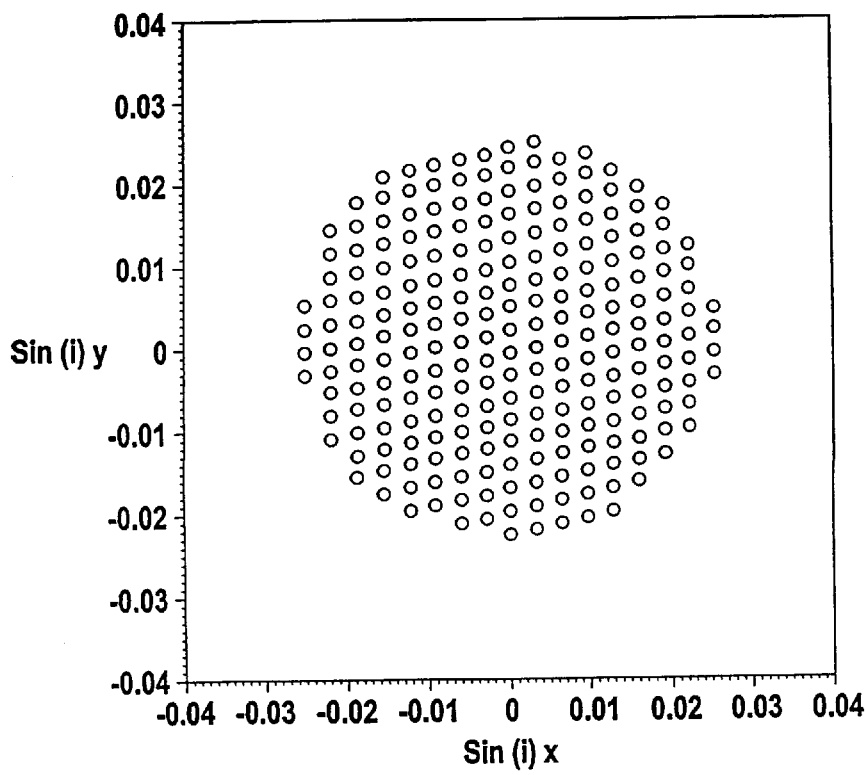
Figure 32:
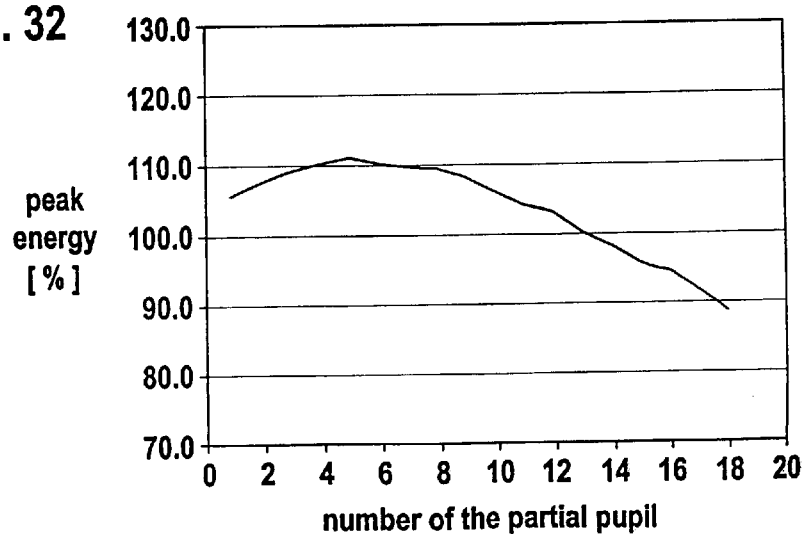
Figure 33:
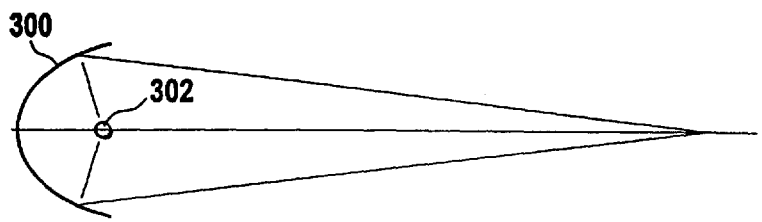
Figure 34:
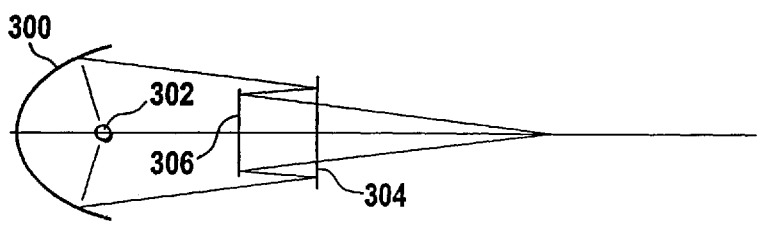
Figure 35:
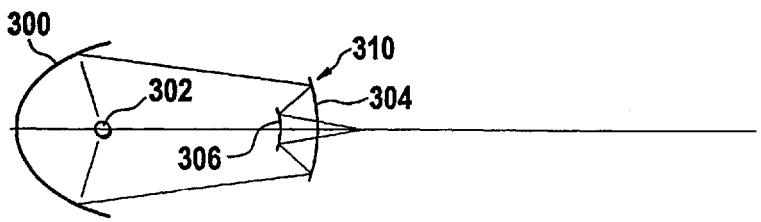
Figure 36:
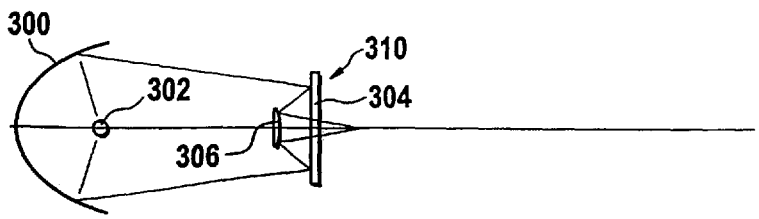
Figure 37:
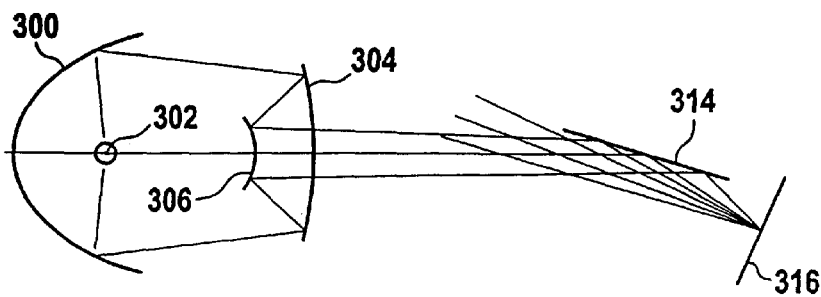
Figure 38:
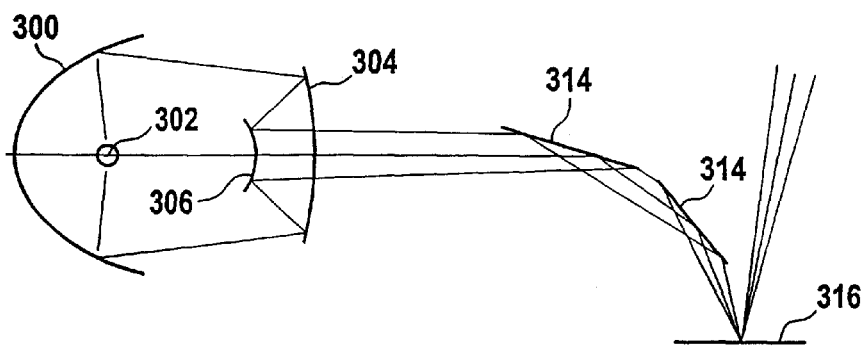
Figure 39:
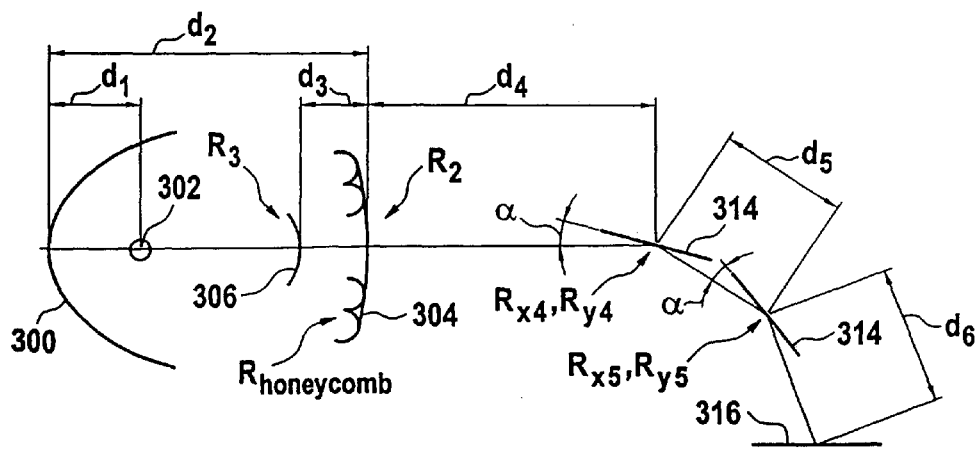
Figure 40:
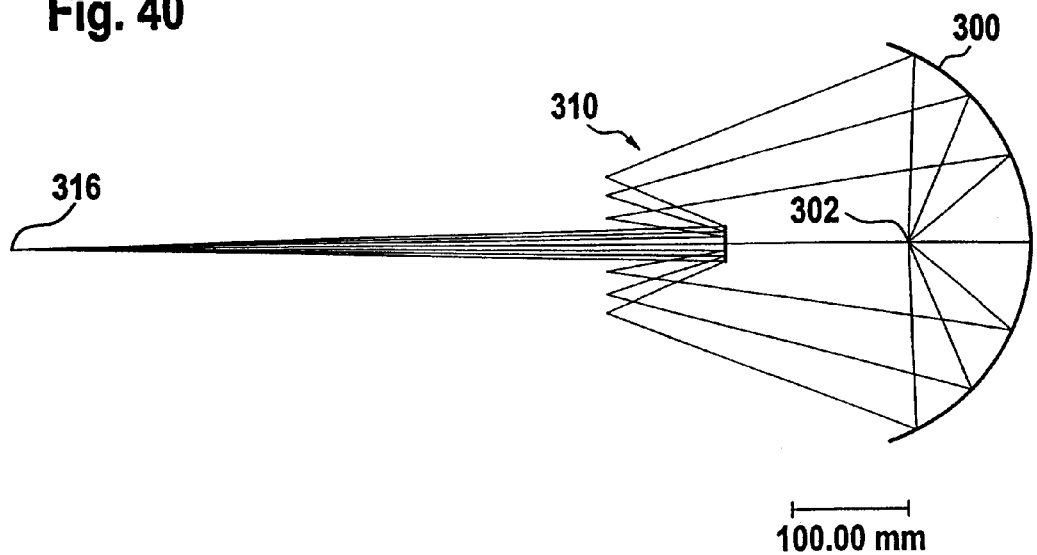
Figure 41:
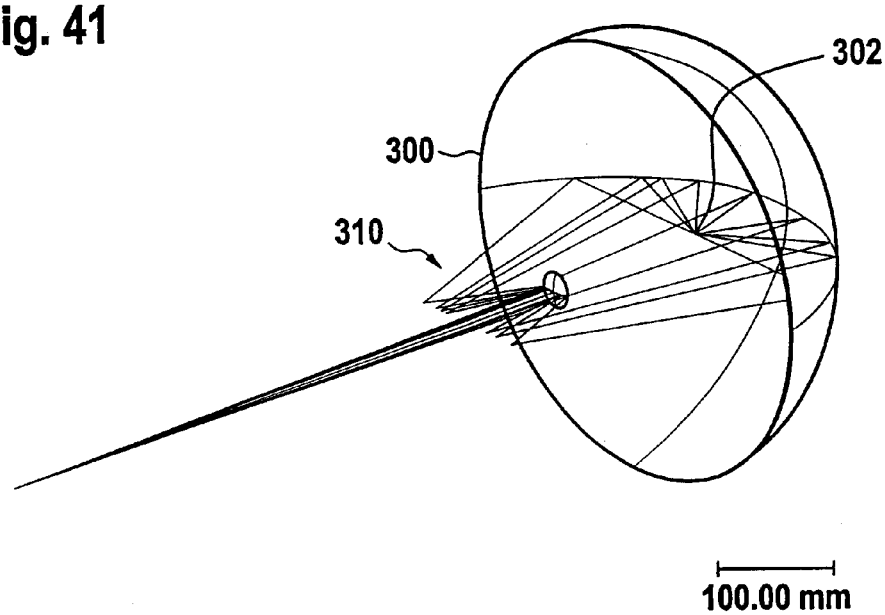
Figure 42:
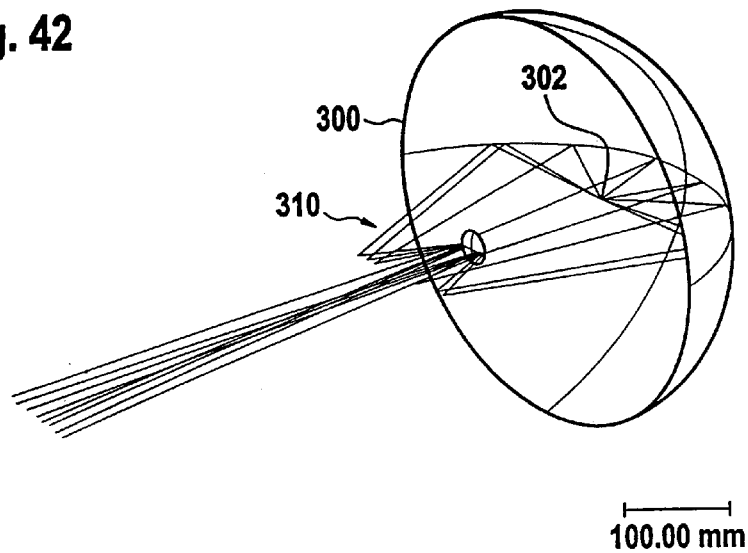
Figure 43:
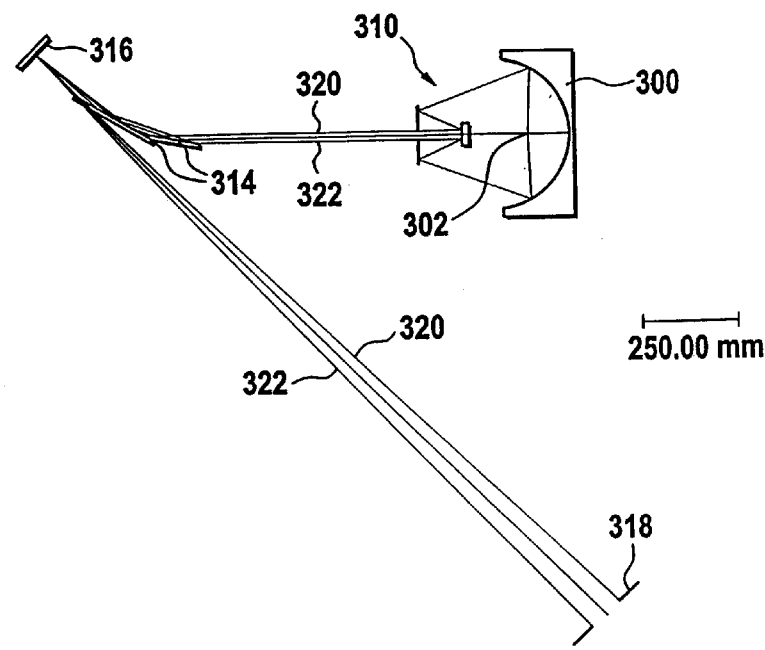
Figure 44:
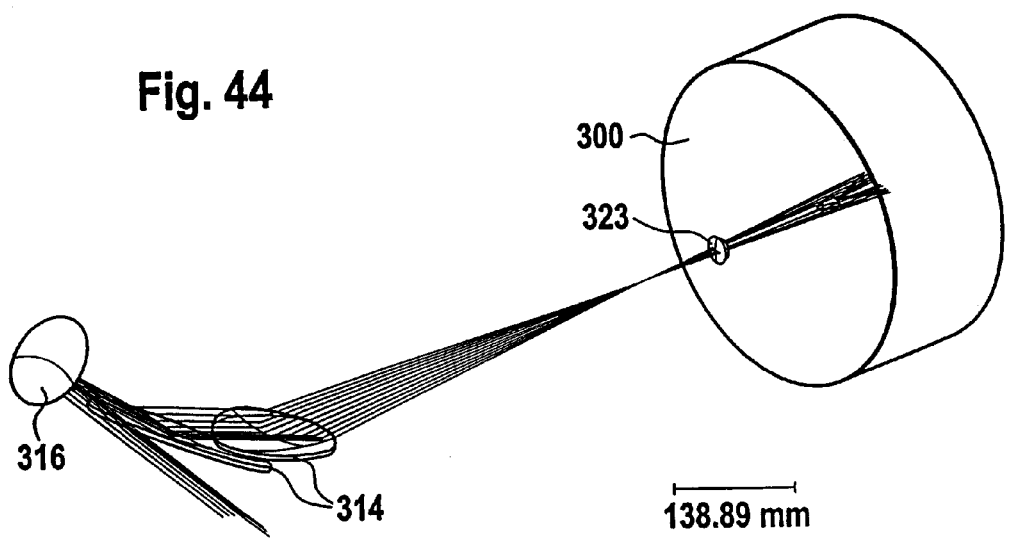
Figure 45:
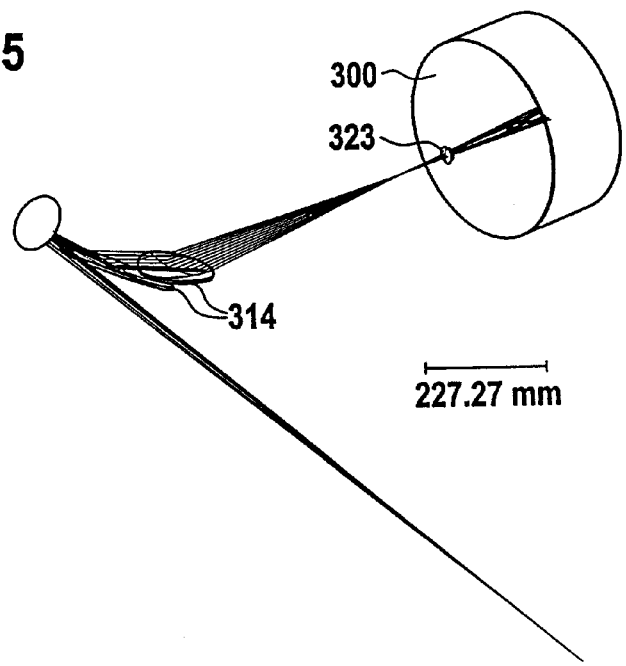
Figure 46:
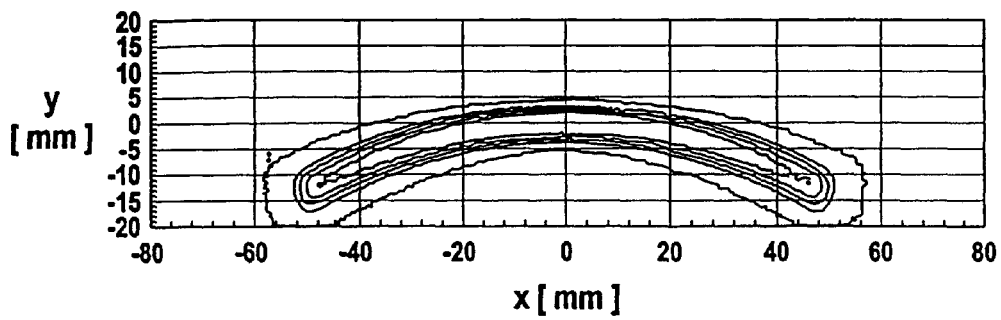
Figure 47:
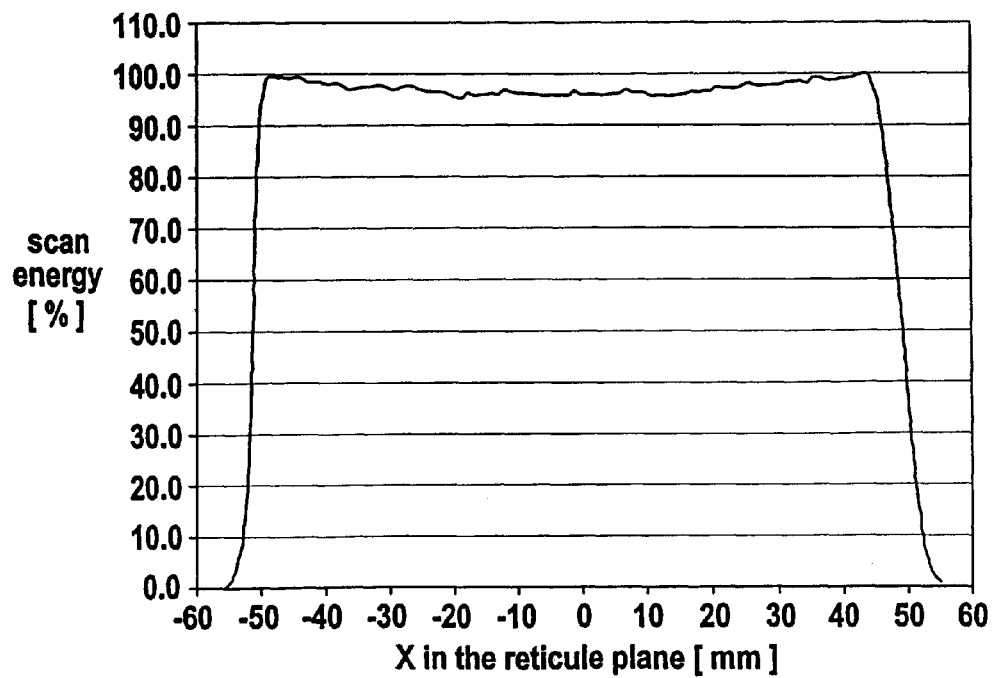
Figure 48:
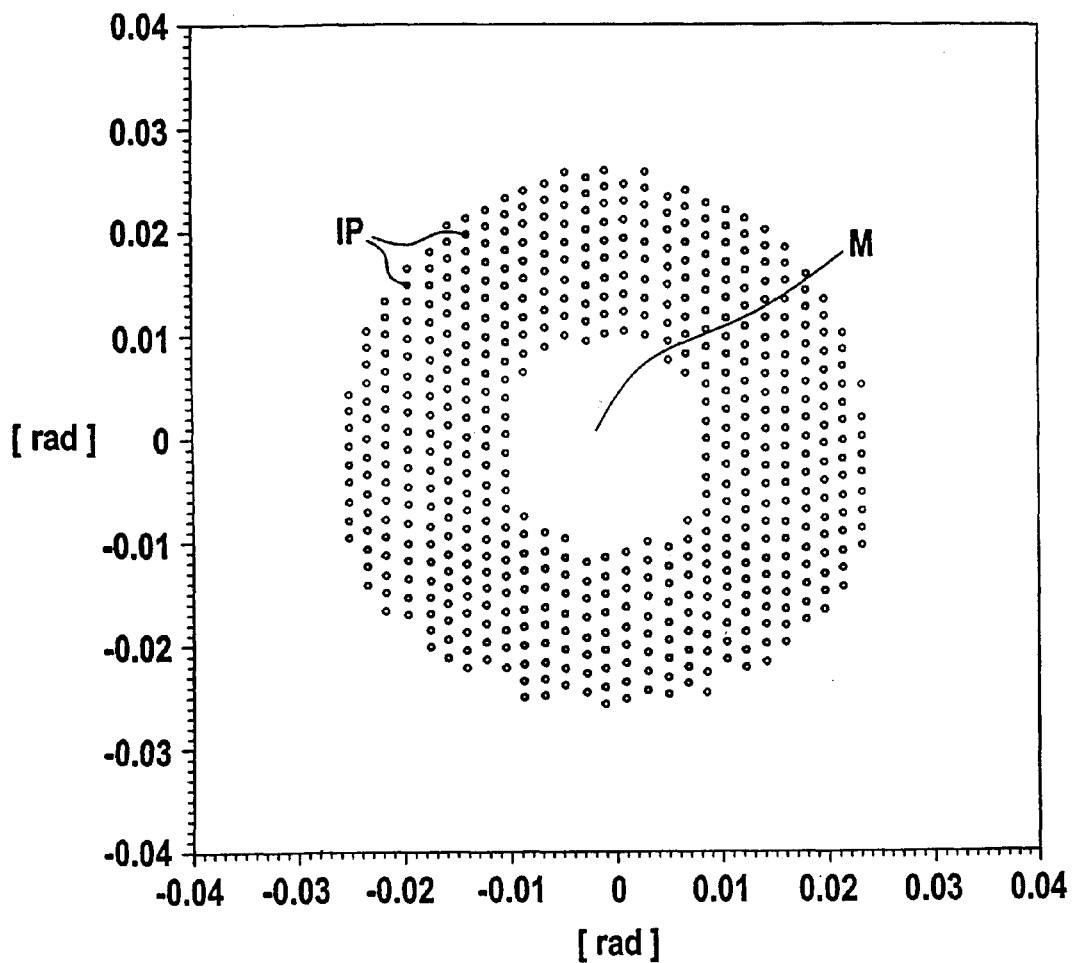
Figure 48A:
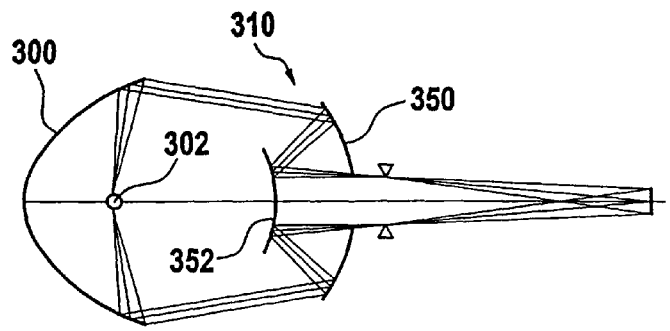
Figure 48B:
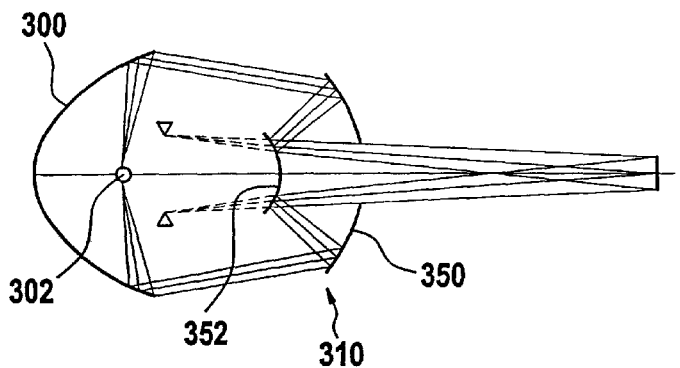
Figure 48C:
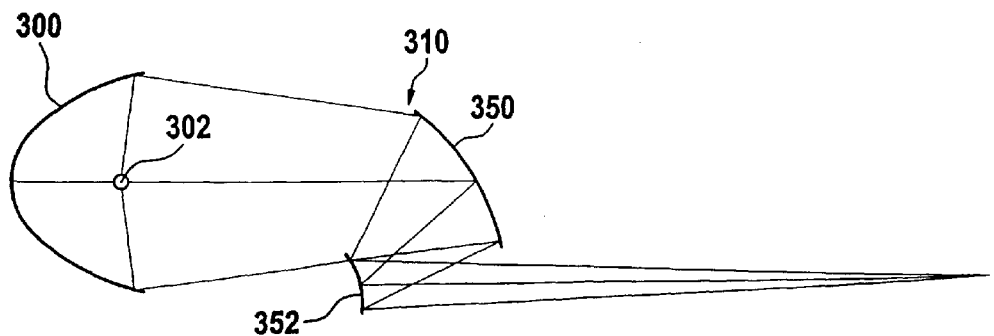
Figure 49:
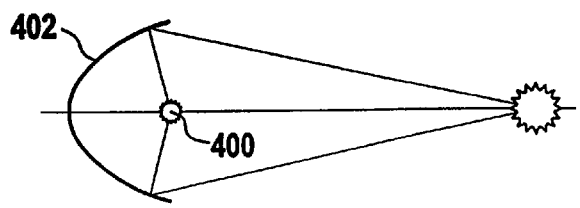
Figure 50:
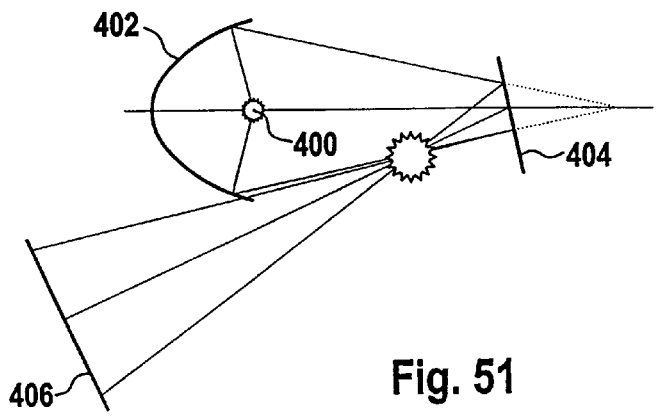
Figure 51:
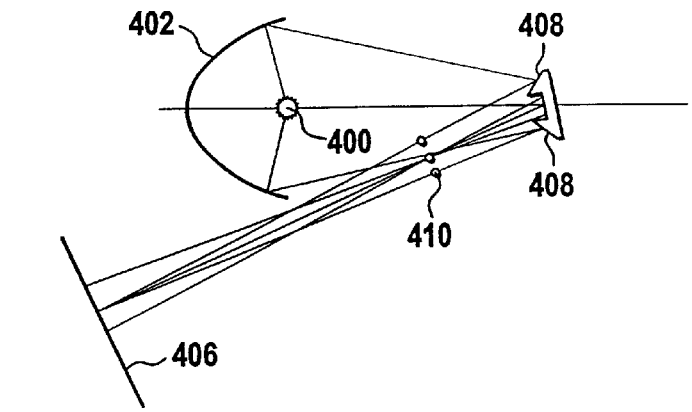
Figure 52:
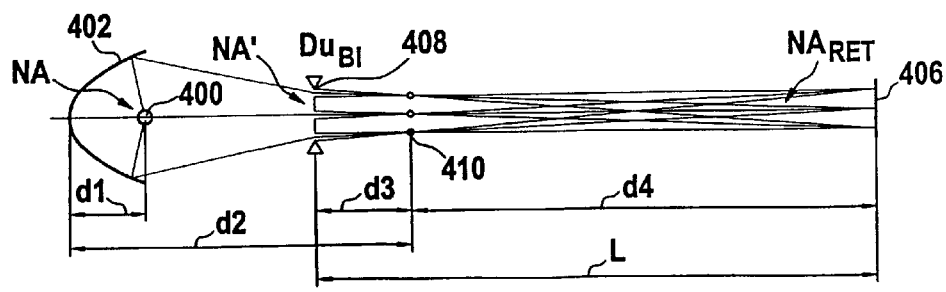
Figure 53:
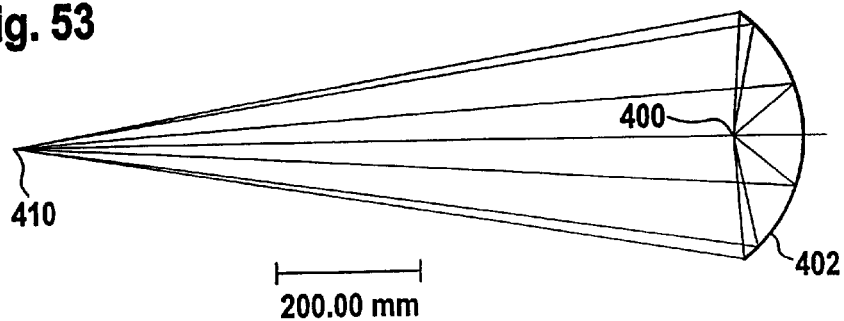
Figure 54:
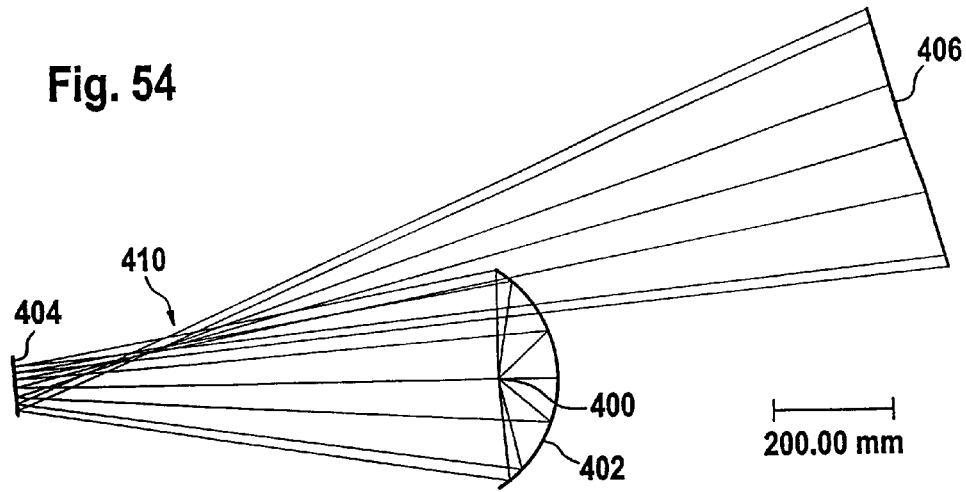
Figure 55:
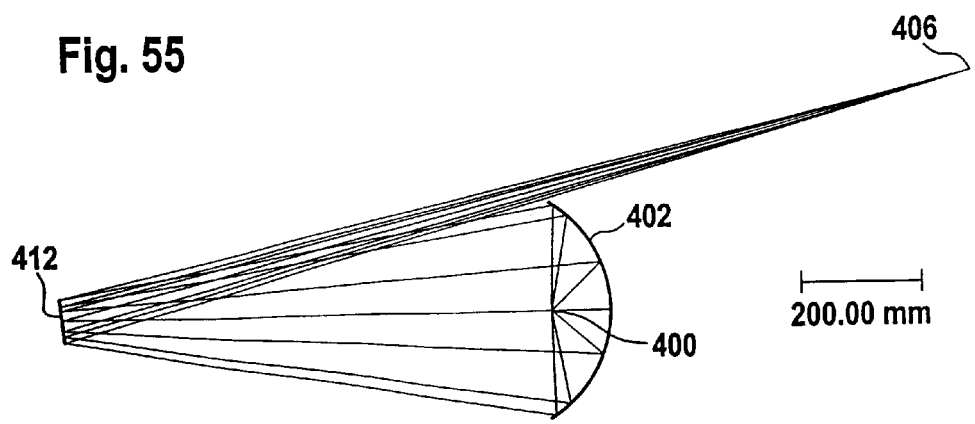
Figure 56:
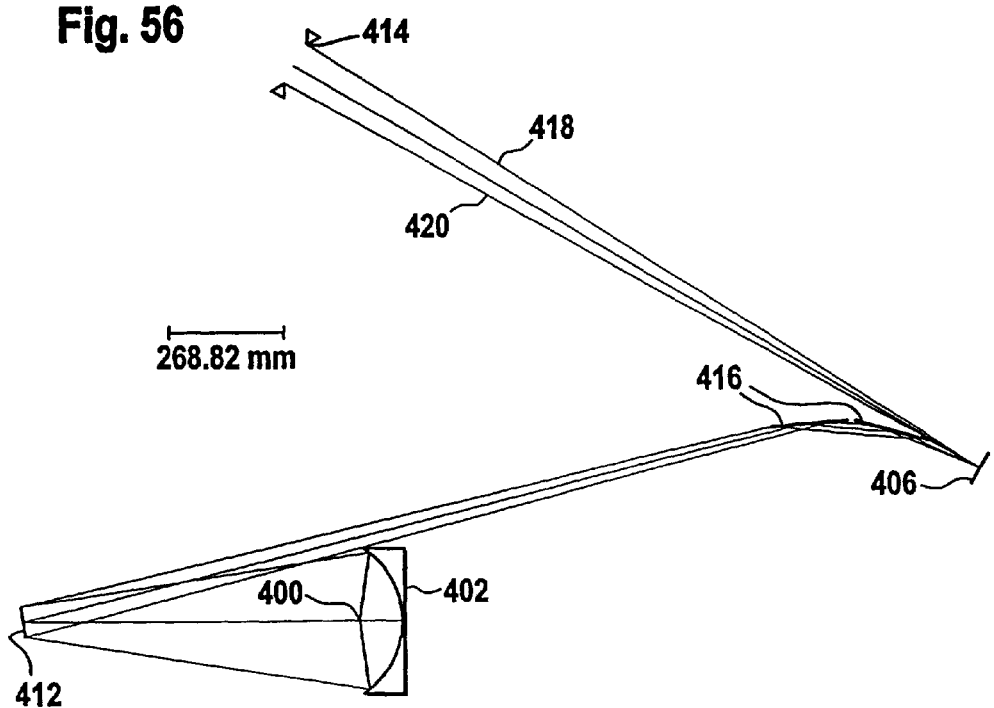
Figure 57:
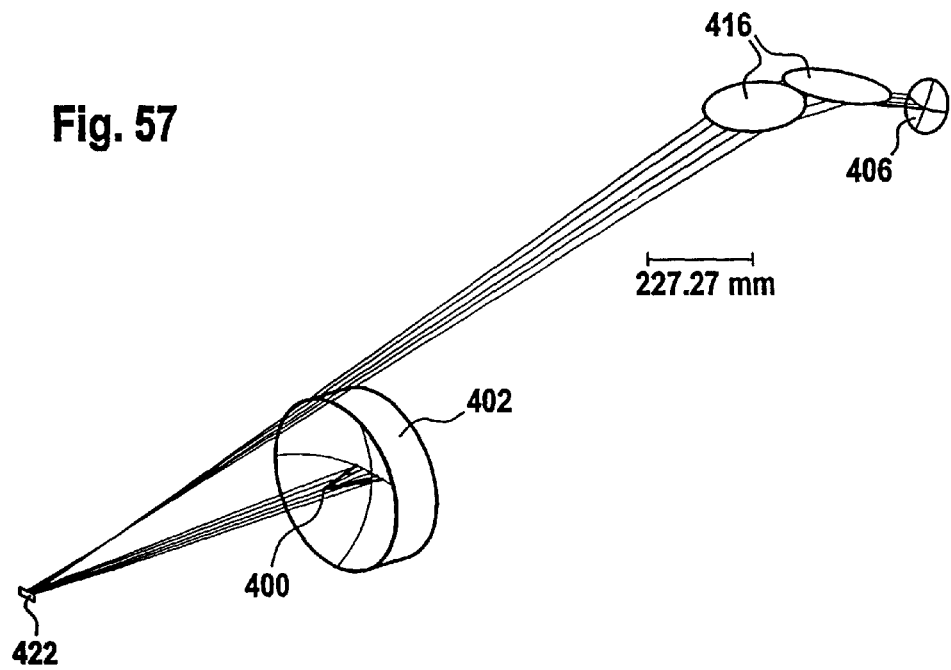
Figure 58:
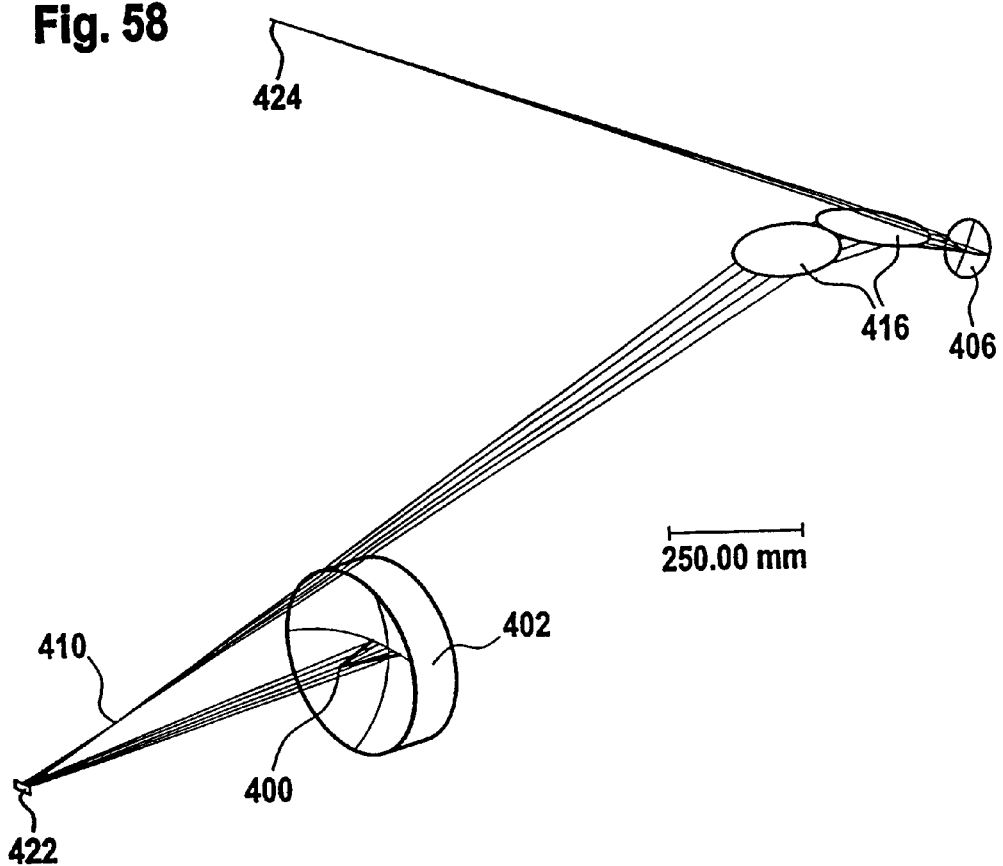
Figure 59:
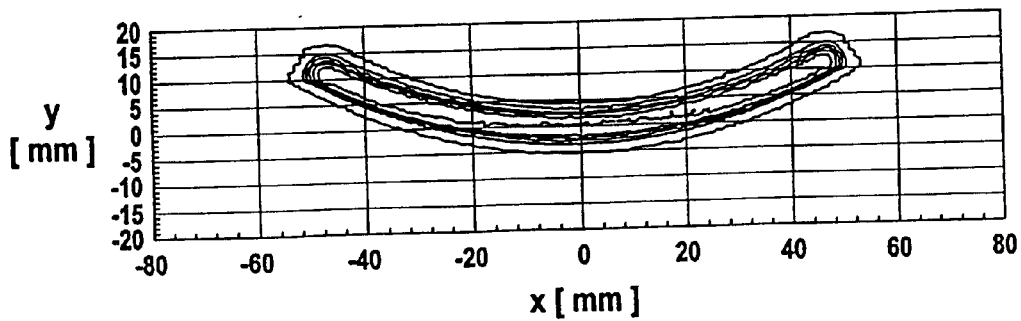
Figure 60:
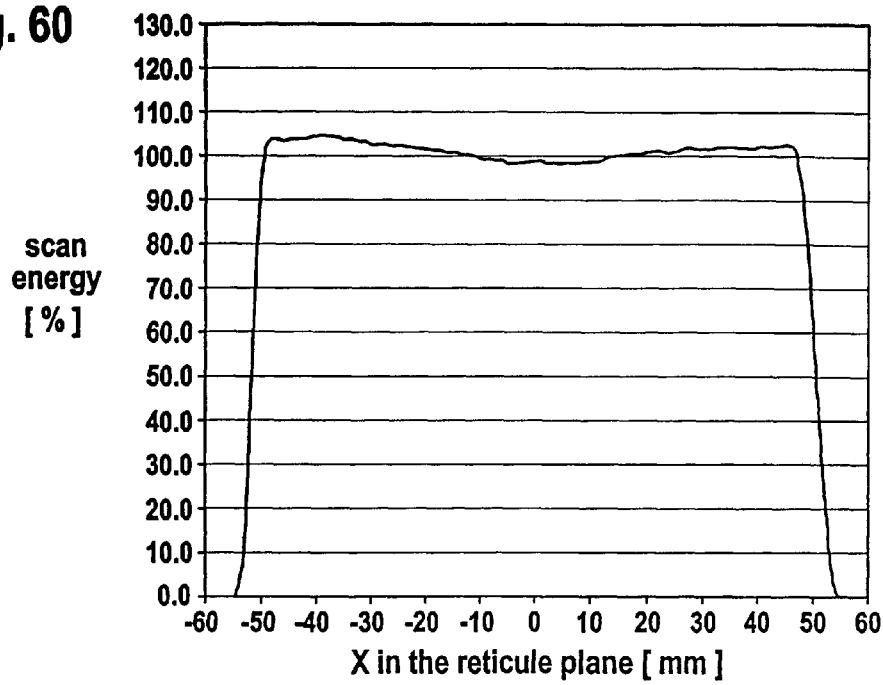
Figure 61:
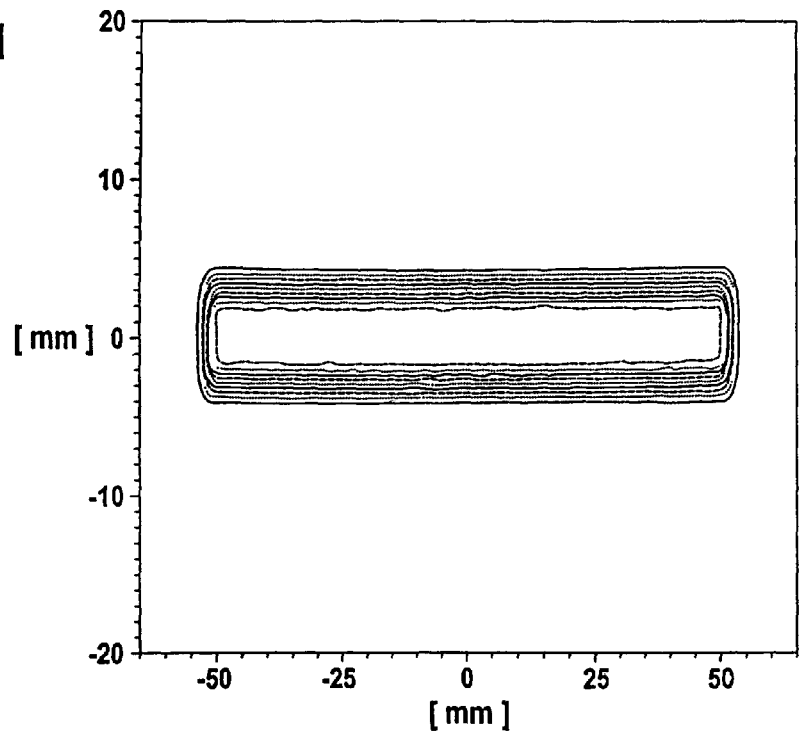

FIG. 30 shows the integral scan energy decisive for the lithography process, i.e., the integration of intensity along the scan path. The absolutely homogeneous integral scan energy can be clearly recognized.

Figure 31:
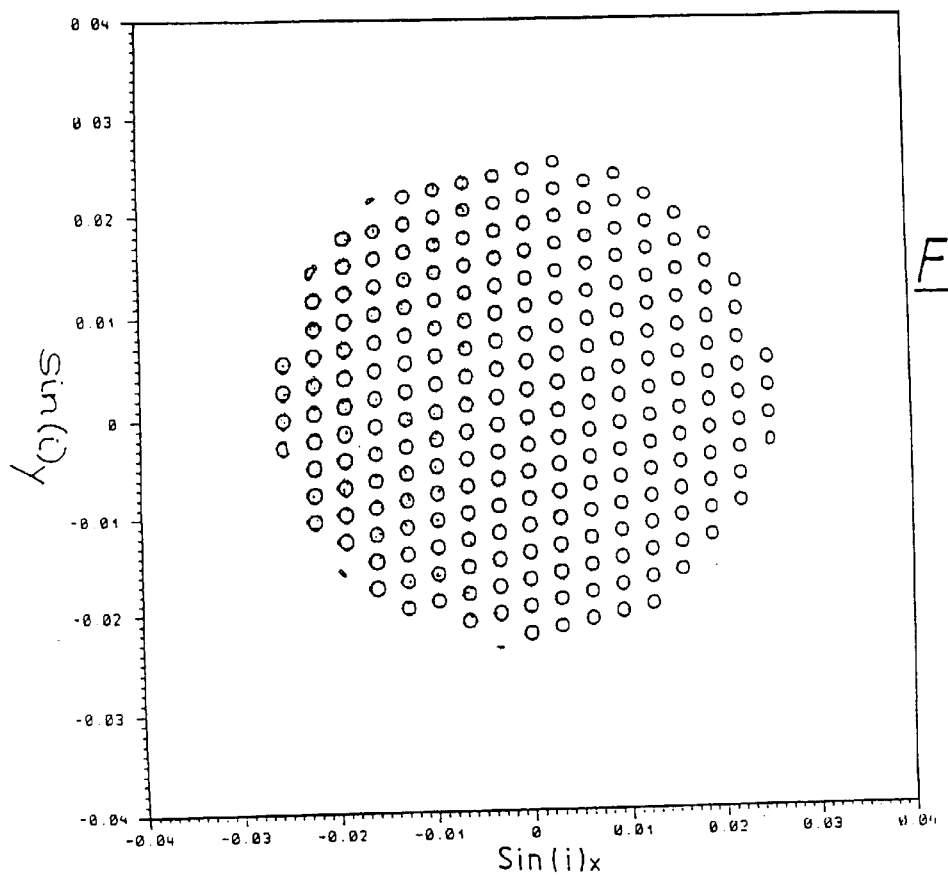
FIG. 31: Pupil illumination of the projection objective of a system according to FIGS. 23–24 with pupil honeycomb plate.

In FIG. 31, the pupil illumination of the exit pupil is shown in the center of the field. Corresponding to the honeycomb distribution, circular intensity peaks are produced in the pupil illumination. The maximum aperture amounts to $NA_{ret}$=0.025.

Figure 32:
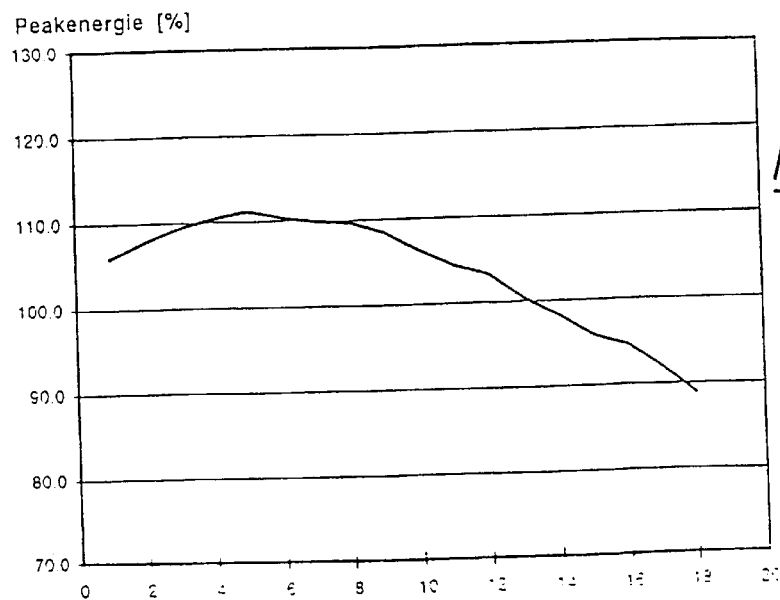
FIG. 32: Total energy of the partial pupils of a system according to FIGS. 23–24 along the Y-axis.

In FIG. 32, the total energy of the partial pupils is shown along the y-axis. The intensity distribution in the pupil has a y-tilt due to the bent beam path. The total energy of the partial pupils, which lie on the y-axis is plotted. The total energy of the individual partial pupils can be adjusted via the reflectivity of the individual facets or honeycombs, so that the energy of the partial pupils can at least be controlled in a rotational symmetric manner. Another possibility for achieving this consists in designing the reflectivity of the collector mirror independent of site.

The forms of embodiment of the invention, which use different light sources, for example, are described below.

In FIGS. 33–39, another form of embodiment of the invention is explained in detail relative to a laser-plasma source as the light source. If the field honeycomb plate is shaped as a plane, then the aperture in the reticle plane ($NA_{theoretical}$=0.025) is given in advance by the ellipsoid or collector mirror. Since the distance from the light source to the ellipsoid or collector mirror should amount to at least 100 mm in order to avoid contaminations, a rigid relationship between structural length and collection efficiency results, as recorded in the following table:

TABLE 1

| Structural length L | Collection angle θ | Collection efficiency π (0°–90°) |
|---|---|---|
| 1000 mm | 14.3° | 2%–12% |
| 2000 mm | 28.1° | 6%–24% |
| 3000 mm | 41.1° | 12%–35% |
| 4000 mm | 53.1° | 20%–45% |
| 5000 mm | 90.0° | 50%–71% |

As can be seen from this, the collection efficiency for justifiable structural lengths of 3000 mm is only 35%.

In order to achieve high collection efficiencies for justifiable structural lengths, in the particularly advantageous form of embodiment of the invention according to FIGS. 33–39, the illumination device is formed as a tele-system.

In the represented form of embodiment, a laser-plasma source is used as the light source, whereby the field honeycomb plate is found in the convergent beam path of a collector mirror, which images the light source on the reticle.

In the case of the example of embodiment considered below, the shape of the honeycombs of the field honeycomb plate corresponds to the shape of the field, whereby, in order to determine the honeycomb size, the field arc of the annular field is drawn up into a rectangle.

In the listed examples, the following results for the rectangular field x=2πr 60°/360°=104.7 mm≈105 mm
y=6 mm
The following is selected as the honeycomb size:
x=17.5 mm
y=1 mm.

In principle, the honeycomb size can be selected freely. The following is valid: the more the honeycombs, the better, and also of course: the more the honeycombs, the smaller the individual honeycomb. The smaller the honeycombs are in comparison to the field, the larger the imaging scale must be between the first honeycomb and the field.

If the field honeycombs have a very high aspect ratio, it is advantageous if the field honeycomb rows are arranged offset from one another. Due to the off-set honeycomb rows, there is a uniform arrangement of the secondary light sources on the pupil honeycomb plate. In the case of an aspect ratio of, e.g.: 1:16, it is favorable to offset the honeycomb rows each time by ¼ of the honeycomb length.

Secondary light sources, which are arranged on the field honeycomb plate corresponding to the distribution of the field honeycombs are produced on the pupil honeycomb plate. The pupil honeycomb plate is illuminated with small intensity peaks for a point light source. In order to reduce the structural length of the illumination system, the illumination system is formed as a telescopic system (tele-system). One form of embodiment for forming such a telescopic system consists of arranging the honeycombs of the field honeycomb plate on a collecting surface, and of arranging the honeycombs of the pupil honeycomb plate on a diverging surface. In this way, the surface normal lines of the honeycomb centers are adapted to the surface normal lines of the carrier surface. As an alternative to this, one can superimpose prismatic components for the honeycombs on a planar plate. This would correspond to a Fresnel lens as a carrier surface.

The above-described tele-honeycomb condenser thus represents a superimposition of the classical tele-system and the honeycomb condenser. The compression of the field honeycomb plate to the pupil honeycomb plates is possible until the secondary light sources overlap. For a laser plasma source with a small Etendu and source diameter of 0.05 mm, the surface field honeycombs plate and pupil honeycombs plate can be compressed in a large region.

In FIGS. 33 to 36, different arrangements are shown schematically, form which the drastic reduction in structural length, which can be achieved with a tele-system, becomes apparent.

Figure 33:
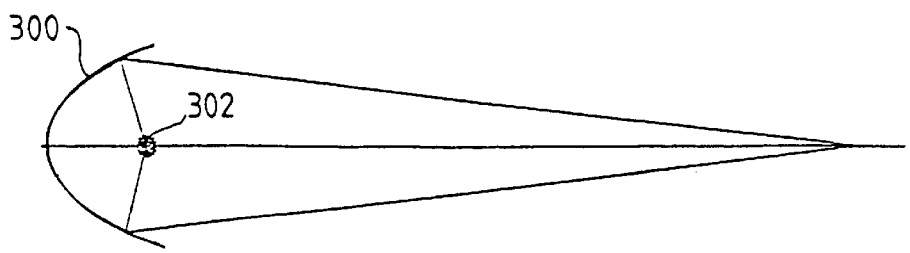
FIGS. 33–39: System according to the invention with a laser plasma source as a light source as well as a collector unit and two mirror units, which form a tele-system.

FIG. 33 shows an arrangement exclusively with collector mirror 300 and laser-plasma light source 302.

Figure 34:
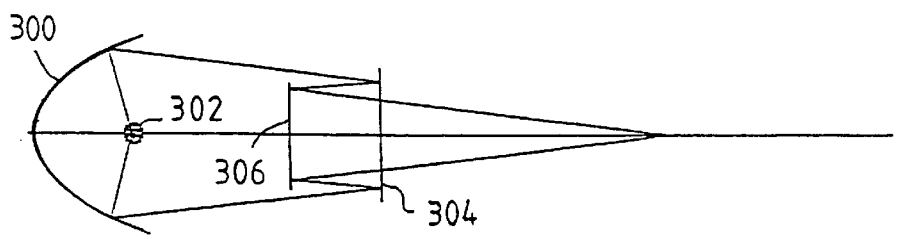

With a planar arrangement of collector mirror, field honeycomb plate 304 and pupil honeycomb plate 306, as shown in FIG. 34, the structural length can be shortened only by the zigzag light path. Since the optical conductance of a point source is approximately zero, the field honeycomb plate 304, is, in fact, fully illuminated, but the pupil honeycomb plate 306 is illuminated only with individual peaks.

Figure 35:
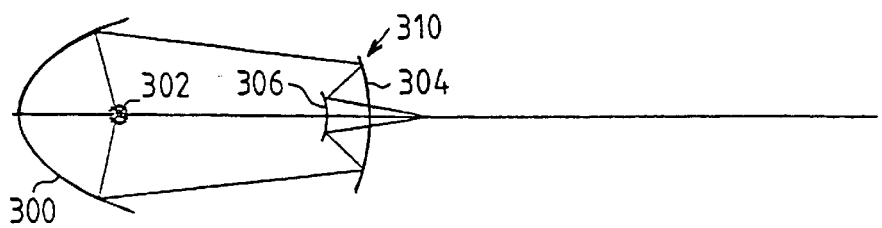

However, now if the honeycombs are introduced onto curved carrier surfaces, i.e., the system is configured as a tele-system with a collecting mirror and a diverging mirror, as shown in FIG. 35, then the structural length can be shortened and the illumination can be compressed on the pupil honeycomb plate.

Figure 36:
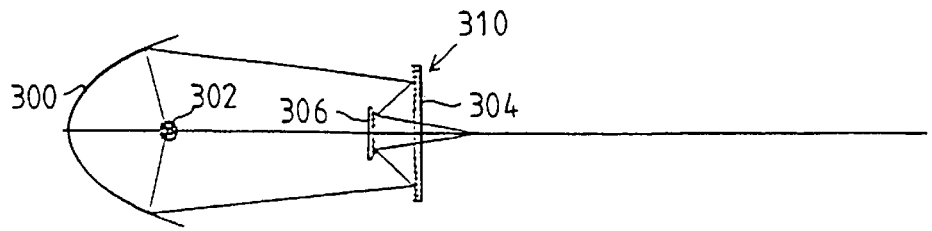

In the case of the design according to FIG. 36, the individual honeycombs are arranged tilted on a planar carrier surface.

The honeycombs of the pupil honeycomb plate have the task of correctly superimposing the fields on the reticle in the case of expanded secondary light sources. However, if a sufficiently good point light source is present, then the second honeycomb plate is not necessary. The field honeycombs can then be introduced either onto the collecting or onto the diverging tele-mirror. If the field honeycombs are found on the collecting tele-mirror, they can be designed as either concave or planar. The field honeycombs on the diverging tele-mirror can be designed as convex, concave or planar. Collecting honeycombs lead to a real pupil plane; diverging honeycombs lead to a virtual pupil plane.

Collector lens 300 and tele-honeycomb condenser or tele-system 310 produce the pregiven rectangular field illumination of 6 mm×105 mm with correct aperture NA=0.025 in the image plane of the illumination system. As in the previous examples, with the help of one or more field lenses 314 arranged between tele-honeycomb condenser 310 and reticle 312, the annular field is formed, which strikes the entrance pupil of the objective and assures the homogeniety of the field illumination necessary for the exposure process.

An intersection for the design of the field lens 314 is the plane of the secondary light sources. This must be imaged by the field lens 314 in the entrance pupil of the objective. In the pupil plane of this image, which corresponds to the reticle plane, the annular field must be produced.

Figure 37:
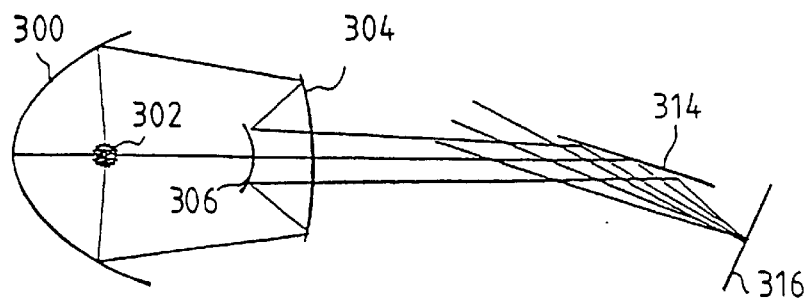
Figure 38:
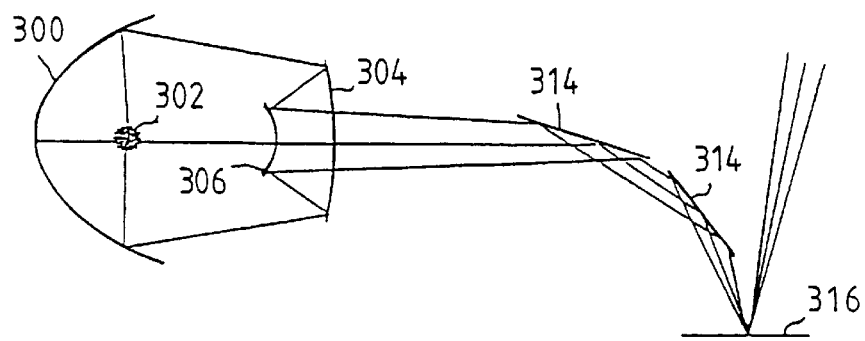

In FIG. 37, a form of embodiment of the invention with only one field mirror 314 is shown. In the form of embodiment with one field mirror, the annular field can be produced and the entrance pupil can be impinged on. Since reticle 316, however, is impinged on only under 2.97°, there is the danger that the light pencil will run back into the illumination system. It is provided in a particularly advantageous form of embodiment to use as field mirrors two grazing-incidence mirrors. This way, the annular field is again rotated and the illumination system will be left "behind" the field lens 314. By using two field mirrors, one also has more degrees of freedom in order to adjust telecentry and field illumination.

The design of tele-systems will now be described on the basis of examples of embodiment, whereby the numerical data not will represent a limitation of the system according to the invention.

In the first example of embodiment of a tele-system, this comprises a collector unit, a diverging mirror and a collecting mirror as well as field lenses, whereby the honeycombs are introduced only onto the first tele-mirror. All honeycombs are identical and lie on a curved carrier surface.

Figure 39:
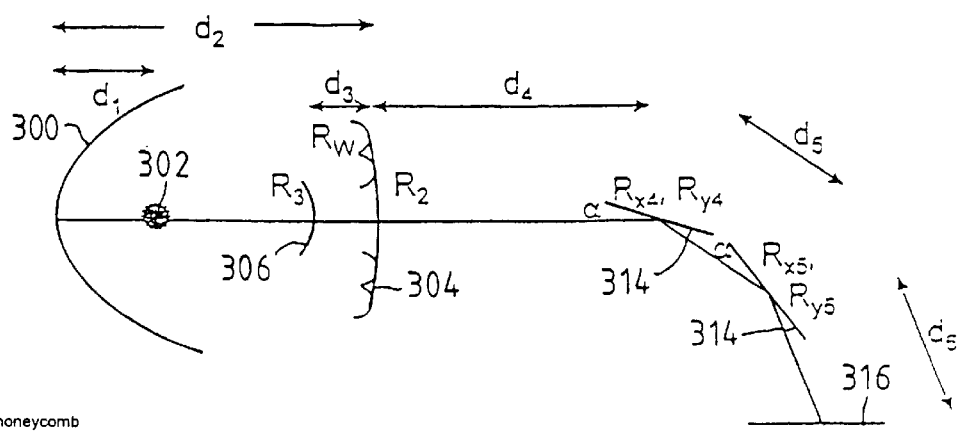

The parameters used are represented in FIG. 39 and are selected as follows below:

Annular field: R=100 mm, segment=60°, field height±3.0 mm.

Position of the entrance pupil: $S_{EP}$=1927.4 mm. This corresponds to a principal beam angle of $i_{PB}$=2.97° for y=100 mm.

Aperture at the reticle: NA=0.025.

Aperture at the source: NA=0.999.

Distance between the source and the collector mirror: $d_1$=100.0 mm.

Honeycomb size on the first tele-mirror, 1 mm×17.5 mm. $d_3$=100 mm.

Compression factor $\phi_{honeycomb}/\phi_{second\ honeycomb}$=4:1.

Tilt angle a of the grazing-incidence mirror, α=80°.

Collector mirror is shaped as an ellipsoid with $R_{collector}$ and $Ex_{collector}$.

Carrier surfaces $R_2$ and $R_3$: spherical.

Honeycomb radius $R_{honeycomb}$ spherical.

Field mirror toric without concentric component: $R_{4x}$, $R_{4y}$, $R_{5x}$, $R_{5y}$.

Figure 40:
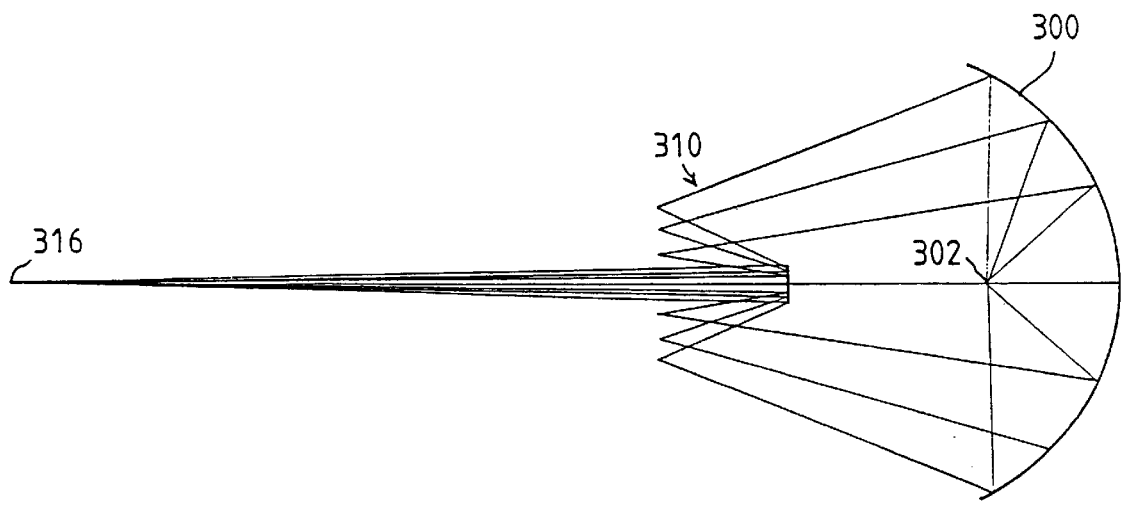
FIGS. 40–45: Course of the light beams in a system with collector unit as well as two tele-mirrors according to FIGS. 33–39.
Figure 41:
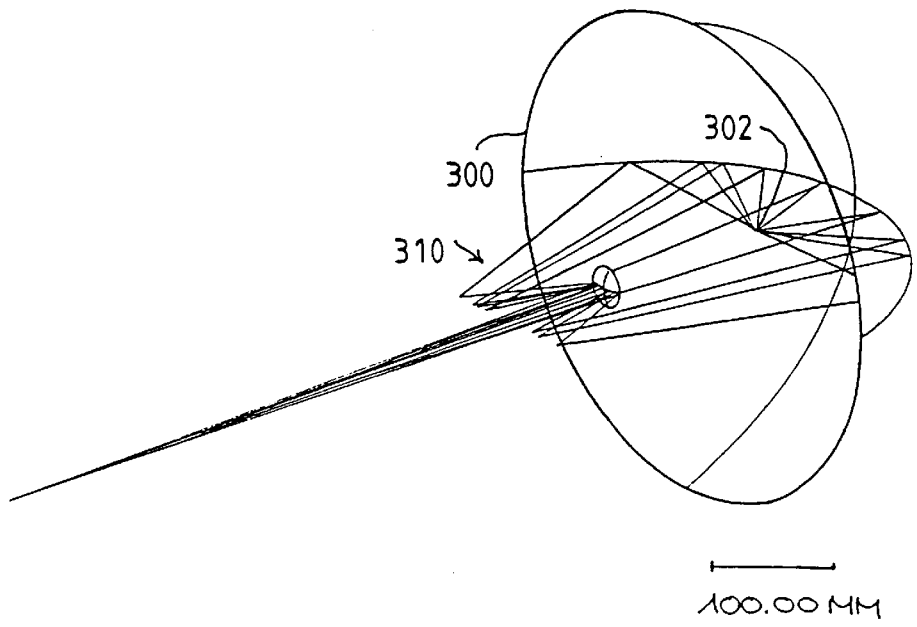

FIG. 40 shows an arrangement of a tele-system with collector mirrors, whereby the mirrors are unstructured, i.e., they do not comprise honeycombs. The two mirrors show a compression factor of 4:1. The shortening of the structural length due to the tele-system is obvious. With the tele-system, the structural length amounts to 852.3 mm, but without the tele-system, it would amount to 8000.0 mm. In FIG. 41, a fan of beams is shown in the x-z plane for the system according to FIG. 40.

Figure 42:
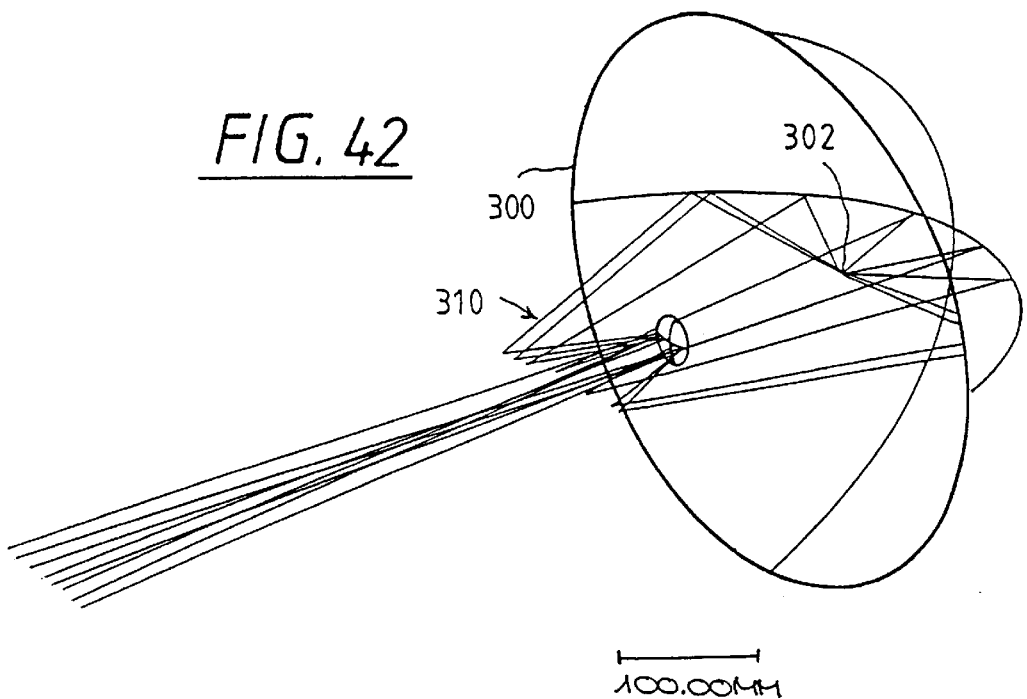

FIG. 42 in turn represents a fan of beams in the x-z plane, whereby the mirrors of the system according to FIG. 40 are now structured and have field honeycombs. Secondary light sources are formed on the second mirror of the tele-system due to the field honeycombs on the first mirror of the tele-system. In the field, the pencils are correctly overlaid, and a strip with −52.5 mm<x<+52.5 mm is homogeneously illuminated.

Figure 43:
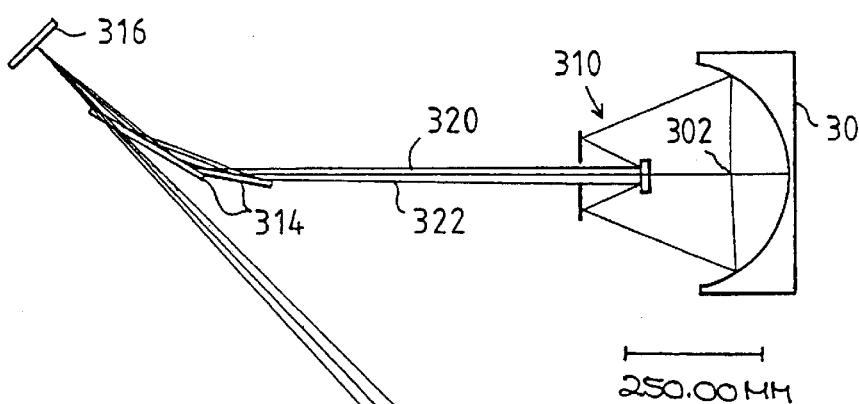

In FIG. 43, the total system up to the entrance pupil of the objective is shown. The total system comprises: light source 302, collector mirror 300, tele-honeycomb condenser 310, field mirror 314, reticle 316 and entrance pupil of the projection objective 318. The drawn-in edge beams 320, 322 impinge on the reticle and are drawn up to the entrance pupil of the objective.

Figure 44:
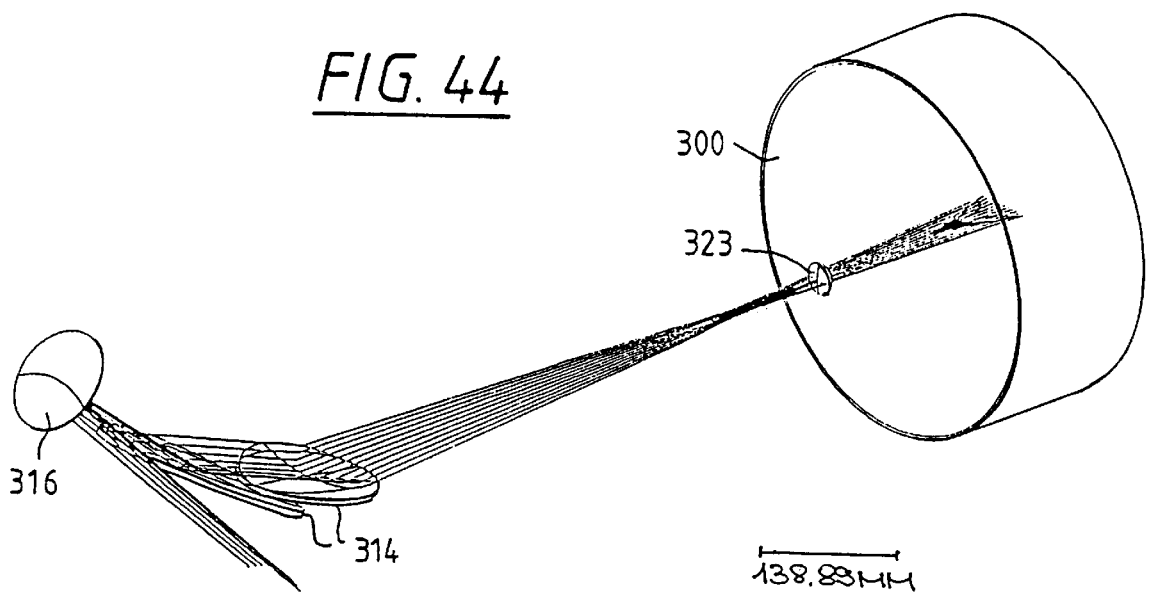

FIG. 44 shows an x-z fan of beams of a configuration according to FIG. 43, which passes through the central field honeycomb 323. This pencil is in fact physically not meaningful, since it would be vignetted by the second tele-mirror, but shows well the path of the light. One sees on field mirrors 314 how the orientation of the annular field is rotated through the second field mirror. The beams cannot run undisturbed into the objective (not shown) after reflection at reticle 316.

Figure 45:
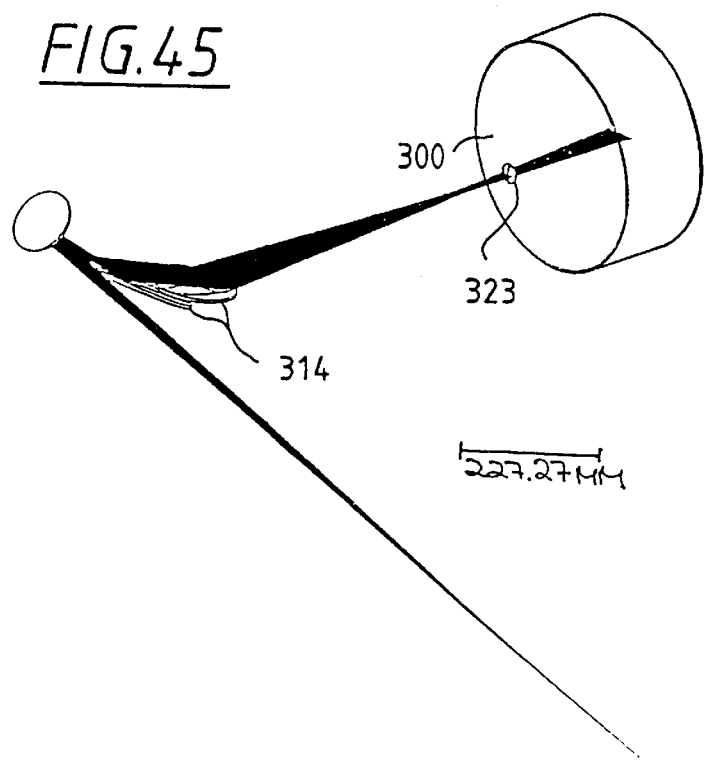

FIG. 45 shows a beam pencil, which passes through the central field honeycomb 323 as in FIG. 44, runs along the optical axis and is focused in the center of the entrance pupil.

Figure 46:
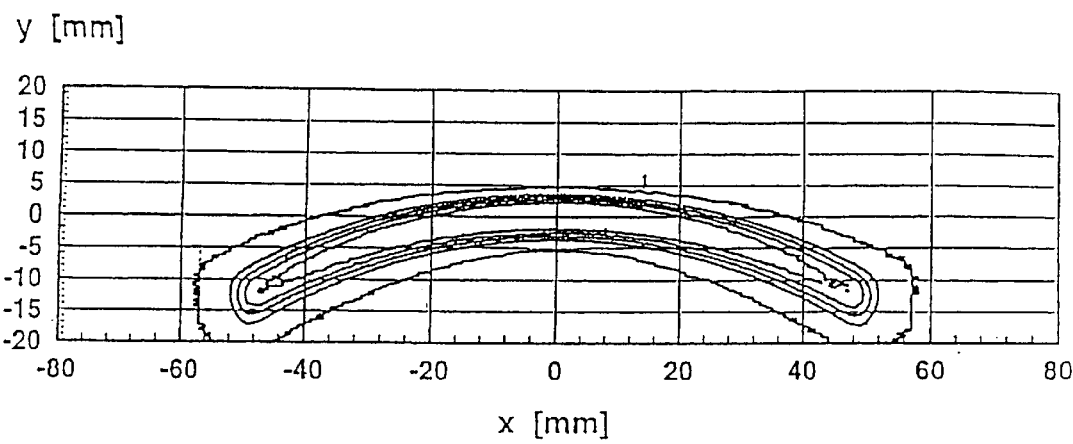
FIG. 46: Illumination of the reticle field of an arrangement according to FIGS. 44–45.

FIG. 46 describes the illumination of the reticle field with the annular field produced by the configuration according to FIGS. 40 to 45 (R=100 mm, segment=60°, field height±3.0 mm).

Figure 47:
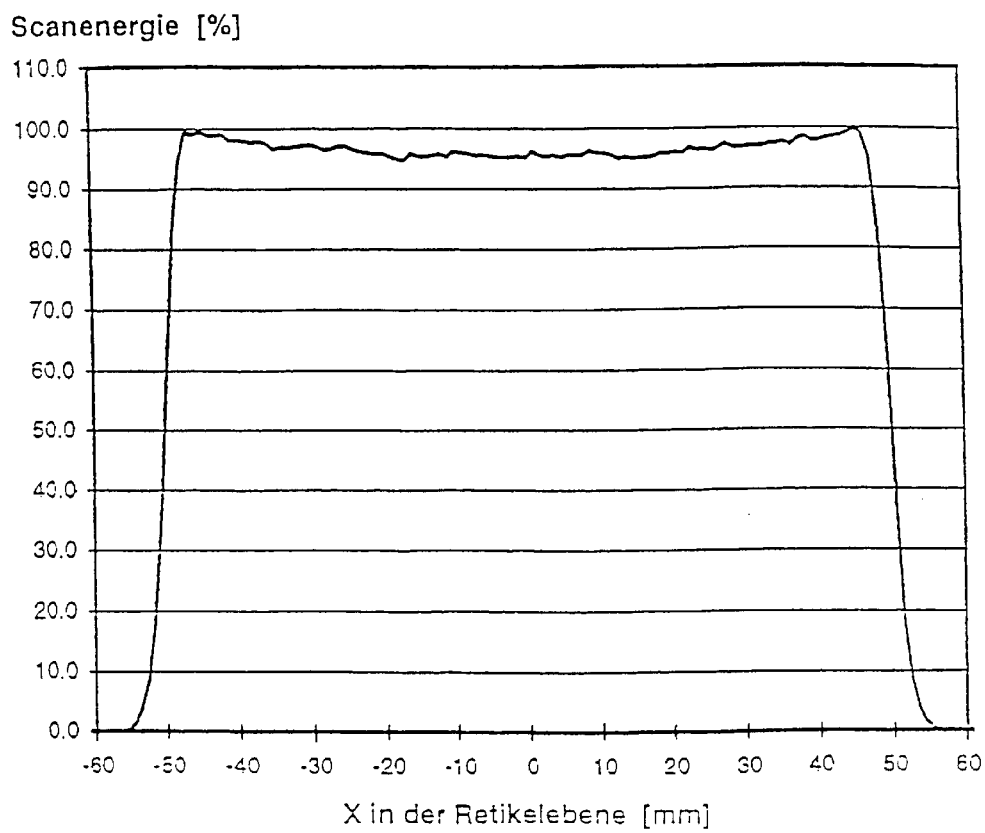
FIG. 47: Integral scan energy of an arrangement according to FIGS. 40–45.

In FIG. 47, the integral scan energy decisive for the lithography process (integration of the intensity along the scan path) represents an arrangement according to FIGS. 40 to 46. The integral scan energy varies between 95% and 100%. The uniformity thus amounts to ±2.5%.

Figure 48:
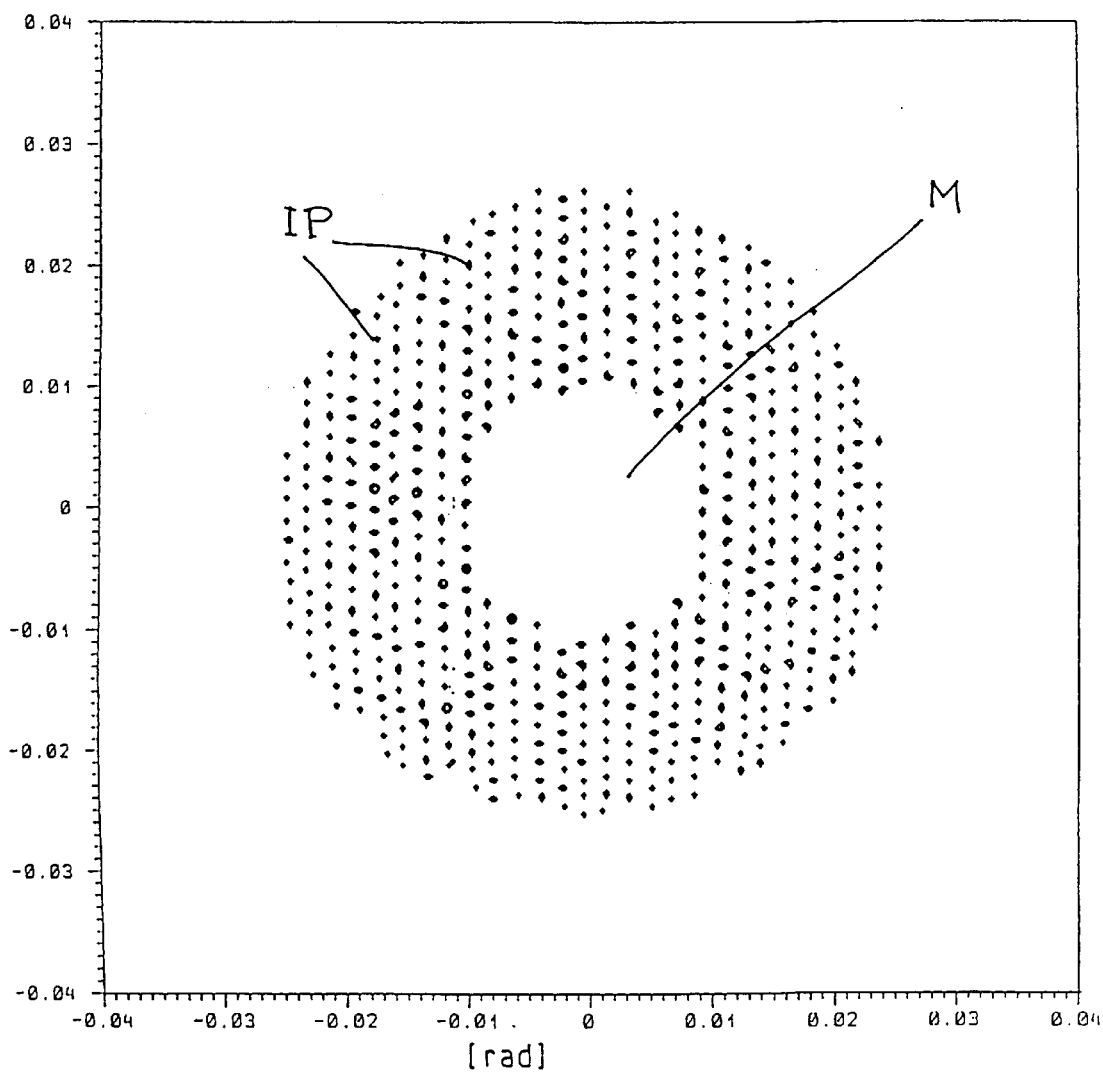
FIG. 48: Pupil illumination of a system according to FIGS. 40–45.

In FIG. 48, the pupil illumination in the field center is shown. The beam angles are referred to the centroid beam. Corresponding to the honeycomb distribution, circular intensity peaks IP result in the pupil illumination. The obscuration in the center M is caused by the second tele-mirror.

The illumination system described in FIGS. 31 to 48 has the advantage that the collecting angle can be increased to above 90° without anything further, since the ellipsoid can also enclose the source.

Further, the structural length can be adjusted by the tele-system. A reduction of structural length is limited due to the angular acceptance of the layers and the imaging error of the surfaces with a strong optical effect.

Figure 48A:
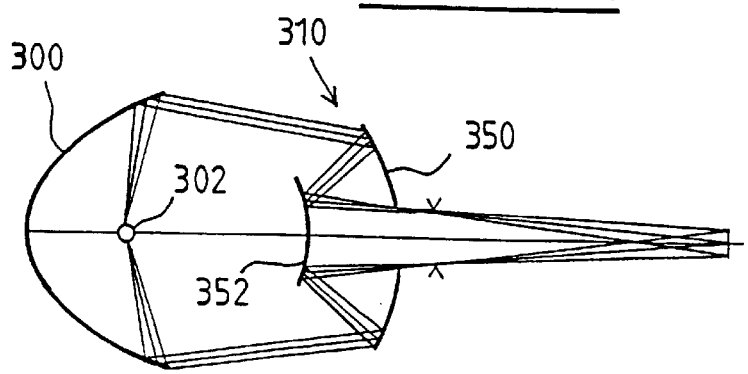
FIGS. 48A–48C: System for a laser-plasma source with diameter $\leq 50$ μm and only one honeycomb plate.

If an arrangement can be produced with only one field honeycomb plate for point light sources or sources with very small expansion, for example, in the case of laser-plasma sources with diameters ≦50 μm, then the honeycombs can be introduced onto collecting mirror 380 of the tele-system or onto the diverging second tele-mirror 352. This is shown in FIGS. 48A–48C.

The introduction onto the second tele-mirror 352 has several advantages: In the case of collecting honeycombs, a real pupil plane is formed in "air", which is freely accessible, as shown in FIG. 48A.

Figure 48B:
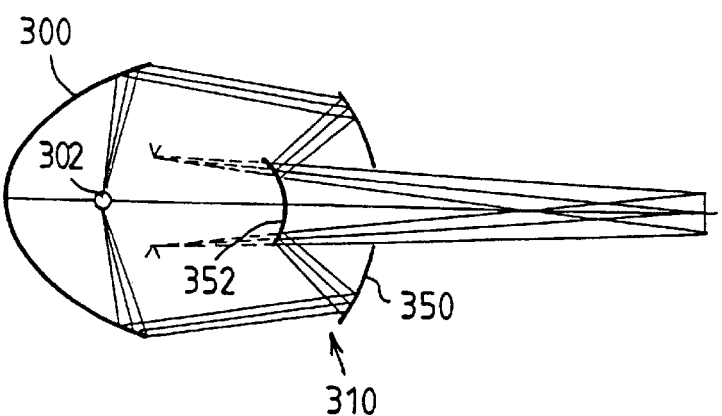

In the case of diverging honeycombs, in fact a virtual pupil plane is formed, which is not accessible, as shown in FIG. 48B. The negative focal length of the honeycombs, however, can be increased.

Figure 48C:
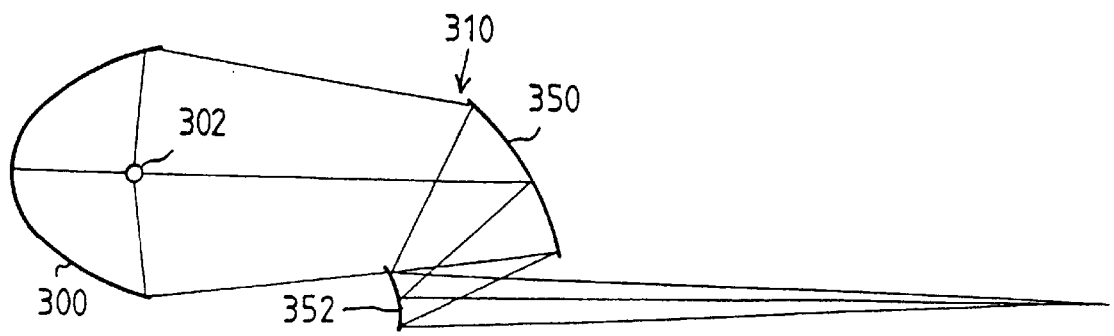

In order to avoid an obscuration, as shown in FIG. 48C, the mirrors of the tele-system 350, 352, can be tilted toward one another, so that the beam pencil does not disturb each other, e.g. by crossing.

A second example of embodiment for a tele-system will be described below, which comprises a planar facet honeycomb condenser. The system described below is particularly characterized by the fact that the collector unit forms a tele-unit with a mirror. The collecting effect of the tele-system is then completely transferred onto the collector mirror. Such a configuration will spare a mirror.

Further, in the case of the planar facet honeycomb condenser, the honeycombs are planar shaped.

Such a system has a high system efficiency of 27% with two normal-incidence mirrors (65%) and two grazing-incidence mirrors (80%).

Further, a large collecting efficiency can be realized, whereby the collecting steradian amounts to 2 π, but which can still be broadened.

Based on the zigzag beam path, there are no obscurations in the pupil illumination. In addition, in the described form of embodiment, the structural length can be easily adjusted.

The collector or ellipsoid mirror collects the light radiated from the laser-plasma source and forms the source on a secondary light source. A multiple number of individual planar field honeycombs are arranged in a tilted manner on a carrier plate. The field honeycombs decompose the collimated light pencil into partial bundles and superimpose these in the reticle plane. The form of the field honeycombs corresponds to the rectangular field of the field to be illuminated. Further, the illumination system has two grazing-incidence toroid mirrors, which form the annular field, correctly illuminate the entrance pupil of the objective, and assure the homogeneity of the field illumination corresponding to the exposure process.

In contrast to the first example of embodiment of a tele-system with collector unit as well as two other mirrors, in the presently described form of embodiment, the laser-plasma source alone is imaged by the ellipsoid mirror in the secondary light source. This saves one normal-incidence mirror and permits the use of planar field honeycombs. Such a savings presupposes that no pupil honeycombs are necessary, i.e., the light source is essentially punctiform.

The mode of action will be described in more detail on the basis of FIGS. 49–51.

Figure 49:
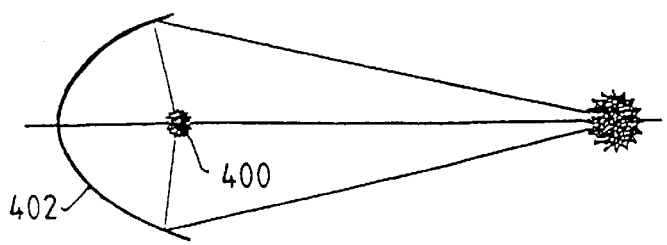
FIGS. 49–52: System with a laser-plasma source, a collector and a field honeycomb plate with planar honeycombs.
Figure 50:
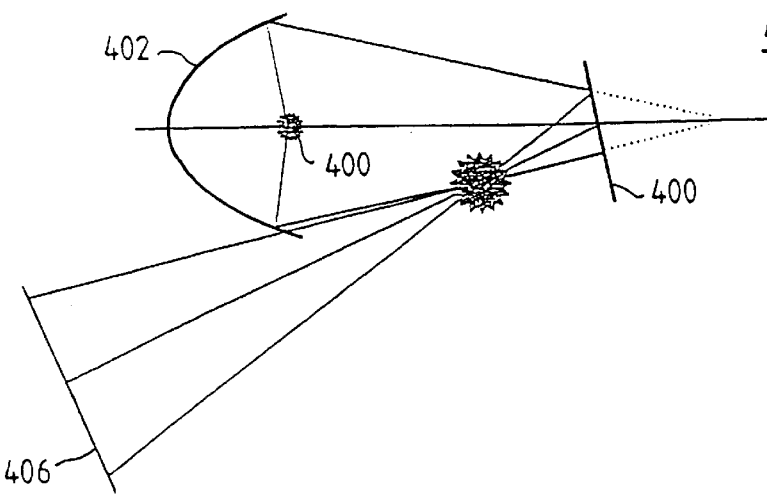

FIG. 49 shows the image of the laser-plasma source 400 through ellipsoid mirror 402. A secondary light source 410 is formed. In the imaging of FIG. 50, a tilted planar mirror 404 defects the light pencil and guides it to the ellipsoid mirror in front of the reticle plane 406.

Figure 51:
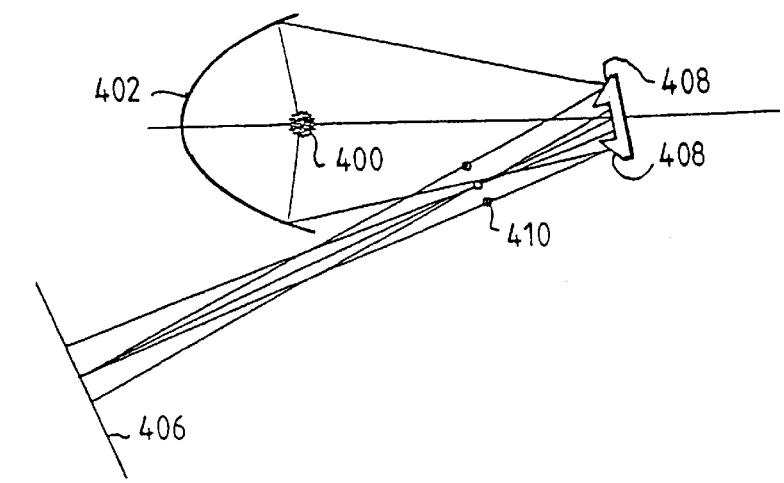

In the imaging of FIG. 51, tilted field honeycombs 408 are dividing the light pencil and superimpose the partial bundles in the reticle plane. In this way, a multiple number of secondary light sources 410 are produced, which are distributed uniformly over the pupils. The tilt angles of the individual field honeycombs 408 correspond, at the space-point of the field honeycombs, to the curvatures of a hyperboloid, which images the laser-plasma source in the reticle plane, together with the ellipsoid mirror. The diverging effect of the tele-unit is thus introduced by the tilt angle of the field honeycombs or facets.

Figure 52:
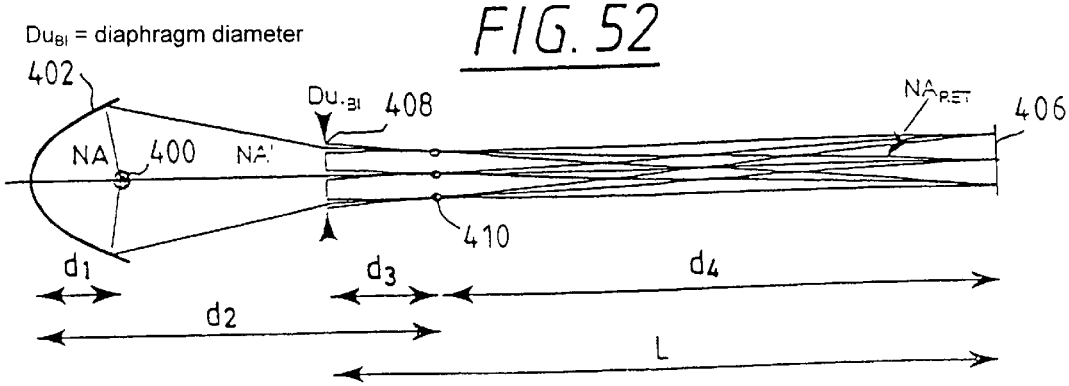

In FIG. 52, the abbreviations are drawn in, as they are used in the following system derivation. For better presentation, the system was drawn linearly.

The following values are used as a basis for the example of embodiment described below, without the numerical data being seen as a limitation:

Annular field: R=100 mm, segment 60°, field height ±3.0 mm, which corresponds to a rectangular field of 105 mm×6 mm.
Aperture at the reticle: $NA_{ret}=0.025$.
Aperture at the source: $NA_{source}=0.999$.
$d_1=100.0$ mm
Structural length $L=d_3+d_4=1400$ mm.

Number of honeycombs within an x-row of the diaphragm diameter=4.

The dimensions are coupled together as follows:

$$NA_{Ret} = \frac{DU_{BL}/2}{L} \Rightarrow DU_{BL} = 2 \cdot L \cdot NA_{Ret}$$

$$\frac{DU_{BL}}{x_{Wabe}} = 4.0 \Rightarrow x_{Wabe} = \frac{DU_{BL}}{4.0}$$

$$\beta_{Wabe} = \frac{x_{Feld}}{x_{Wabe}} = \frac{d_4}{d_3} \Rightarrow \beta_{Wabe} = \frac{x_{Feld}}{x_{Wabe}}$$

$$\Rightarrow d_4 = d_3 \cdot \beta_{Wabe}$$

$$L = d_3 + d_4$$

$$NA' = \frac{DU_{BL}/2}{d_3} \Rightarrow d_3 = \frac{L}{1+\beta_{Wabe}}$$

$$\tan(\theta) = -\frac{(1-Ex)\cdot\sin(\theta')}{2\sqrt{Ex}-(1-Ex)\cdot\cos(\theta')} \Rightarrow NA' = \frac{DU_{BL}/2}{d_3}$$

$$Ex = \left(\frac{sk-sl}{sk+sl}\right)^2 = \left(\frac{d_2-d_1}{d_2+d_1}\right)^2 \Rightarrow Ex = f(NA_{QU}, NA')$$

$$\Rightarrow d2 = d1 \cdot \frac{1+\sqrt{Ex}}{1-\sqrt{Ex}}$$

$$Ex = 1 - \frac{R}{a}$$

$$\Rightarrow R = \frac{d_1+d_2}{2}\cdot(1-Ex)$$

*Ret* = reticle; $DU_{BL}$ = diaphragm diameter;

*Wabe* = honeycomb; *Feld* = field

The system can be completely determined with the process of the invention for the design of an illumination system with the use of planar field honeycombs and the pre-given values. If one inserts the design tolerances in the above formulas, then the following system parameters result:

$$DU_{BL} = 2 \cdot L \cdot NA_{Ret} = 2 \cdot 1400\,\text{mm} \cdot 0.025 = 70.0\,\text{mm}$$

$$x_{Wabe} = \frac{DU_{BL}}{4.0} = \frac{70.0\,\text{mm}}{4.0} = 17.5\,\text{mm}$$

$$\beta_{Wabe} = \frac{x_{Feld}}{x_{Wabe}} = \frac{105.0\,\text{mm}}{17.5\,\text{mm}} = 6.0$$

$$d_3 = \frac{L}{1+\beta_{Wabe}} = \frac{1400.0\,\text{mm}}{1+6.0} = 200.0\,\text{mm}$$

$$d_4 = d_3 \cdot \beta_{Wabe} = 200.0\,\text{mm} \cdot 6.0 = 1200.0\,\text{mm}$$

$$NA' = \frac{DU_{BL}/2}{d_3} = \frac{70.0\,\text{mm}/2}{200.0\,\text{mm}} = 0.175$$

$$Ex = f(NA_{QU}, NA') = 0.695$$

$$d_2 = d_1 \cdot \frac{1+\sqrt{Ex}}{1-\sqrt{Ex}} = 100.0\,\text{mm} \cdot \frac{1+\sqrt{0.695}}{1-\sqrt{0.695}} = 1101.678\,\text{mm}$$

$$R = \frac{d_1+d_2}{2}\cdot(1-Ex) = \frac{100.0\,\text{mm}+1101.678\,\text{mm}}{2}\cdot(1-0.695) = 183.357\,\text{mm}$$

*Ret* = reticle; $DU_{BL}$ = diaphragm diameter; *Wabe* = honeycomb; *Feld* = field; *QU* = source The field lenses are constructed similar to the case of the first example of embodiment of a tele-system, i.e., two toroid mirrors are again used as field lenses.

In FIGS. 53–58, the beam courses of a system are shown with the previously given parameters as an example.

Figure 53:
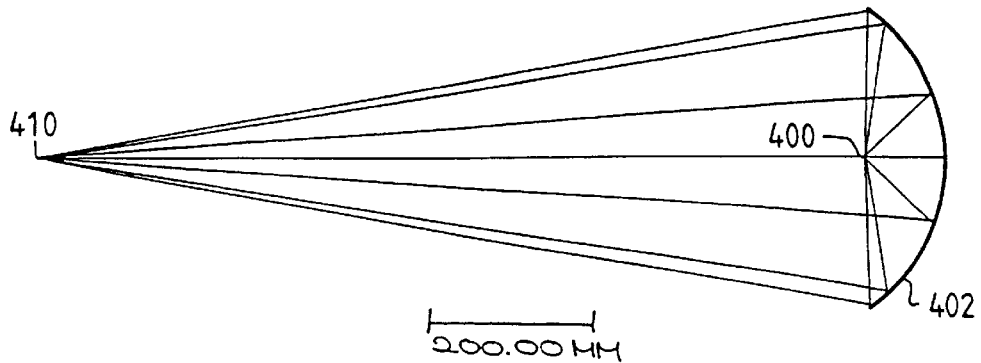
FIGS. 53–58: Beam courses in an system according to FIGS. 49–52.

In FIG. 53) the beam course is shown for an ellipsoid mirror, which assumes aperture NA=0.999 and images on a secondary light source 410.

Figure 54:
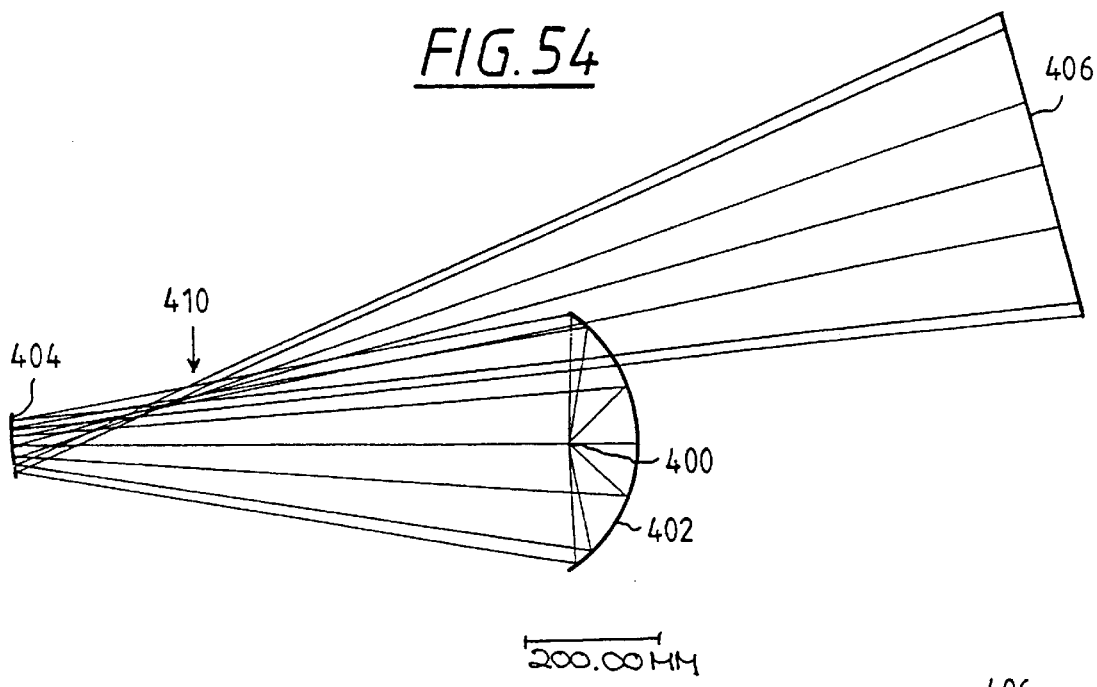

In the form of embodiment according to FIG. 54, a planar mirror 404 is arranged at the position of the field honeycomb plate, which mirrors back the pencil. The beams are extended up to the reticle plane 406. One of the secondary light sources 410 lies within the beam pencil.

Figure 55:
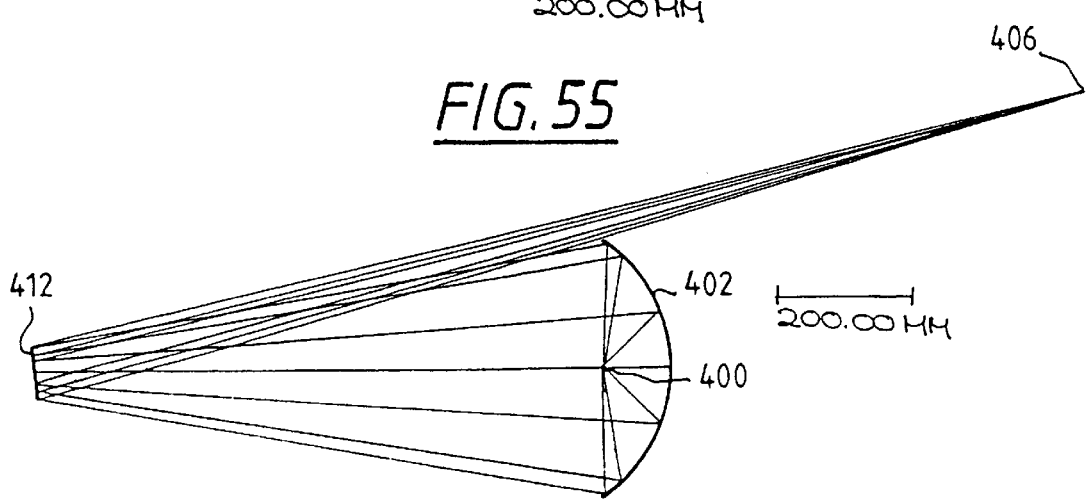

Finally, in FIG. 55, the construction according to the invention is shown, in which deflecting mirror 404 is replaced by the field honeycomb plate 412. A fan of beams is depicted, which each time goes through the center of the individual field honeycombs. These beams intersect on the optical axis in the reticle plane 406.

Figure 56:
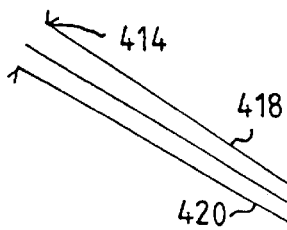

FIG. 56 finally shows the total system up to entrance pupil 414 of the objective with field lenses 416. The depicted edge beams 418, 420 strike on reticle 406 and are further calculated up to the entrance pupil of the objective.

Figure 57:
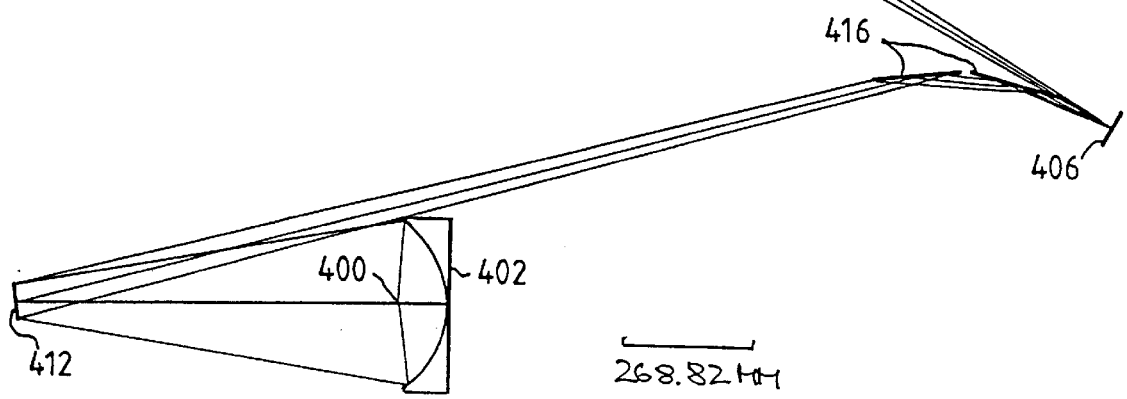
Figure 57:
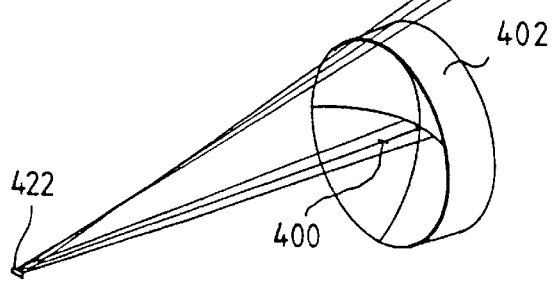

In FIG. 57, an x-z fan of beams is depicted for the system of FIG. 56, and this fan strikes the central field honeycomb 422. The beams illuminate the ring on reticle 406 with the correct orientation.

Figure 58:
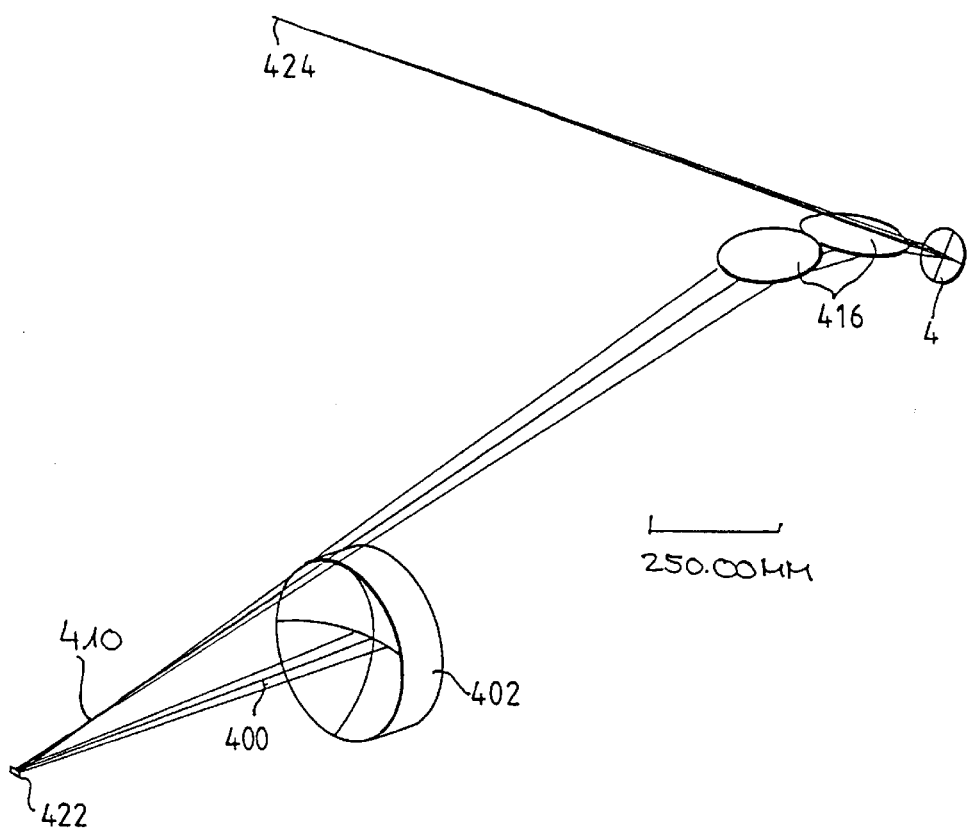

In FIG. 58, in addition, the entrance pupil 424 of the projection objective is represented. The depicted beam pencil runs along the optical axis (central pencil) and is thus focused in the center of the entrance pupil.

Figure 59:
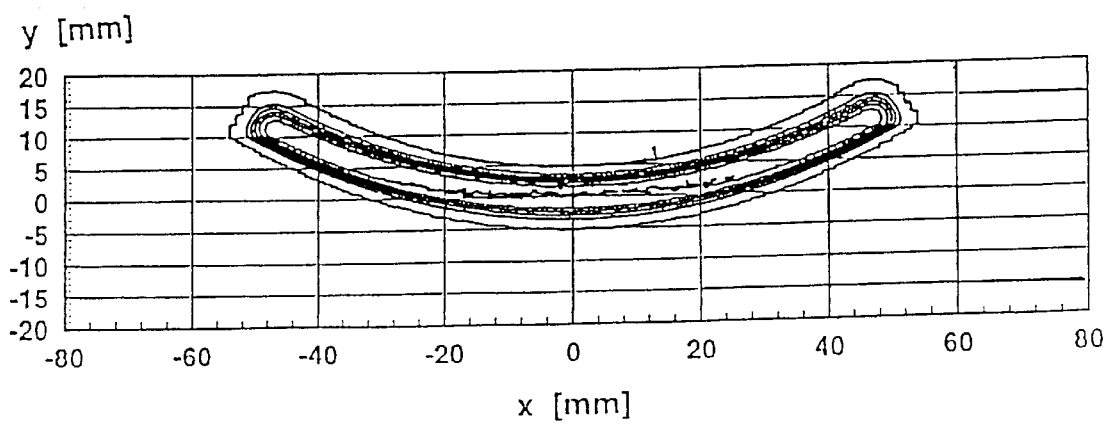
FIG. 59: Illumination of the reticle with an illumination arrangement according to FIGS. 52–58.

In FIG. 59, the illumination of the reticle is shown with an annular field (R=100 mm, segment=600, field height ±3.0 mm), which is based on an illumination arrangement according to FIGS. 52–58.

Figure 60:
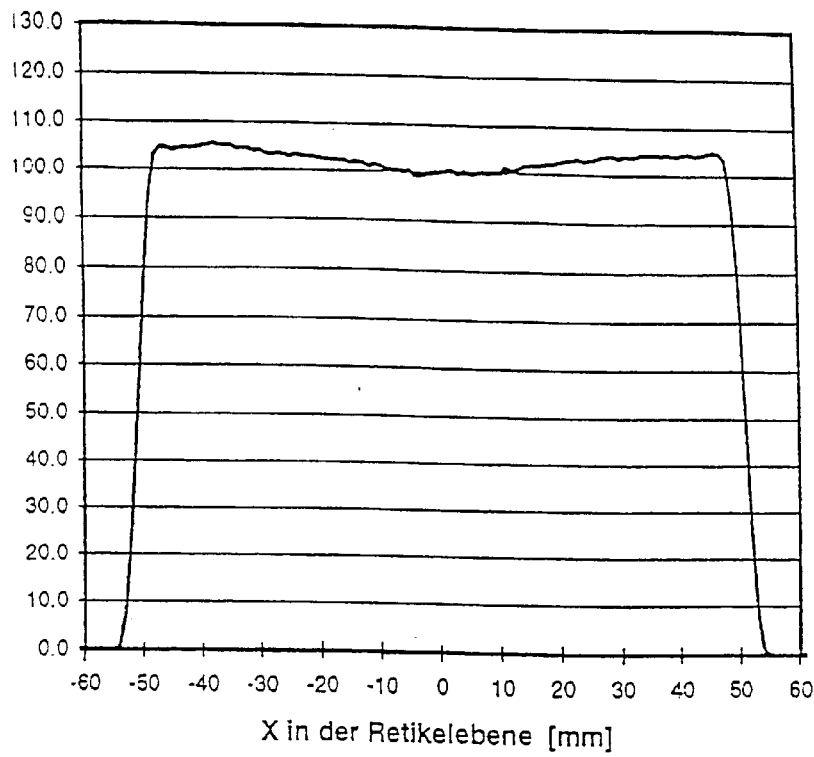
FIG. 60: Integral scan energy in the reticle plane of a system according to FIGS. 52–58.

The integral scan energy which is decisive for the lithographic process, i.e., the integration of the intensity along the scan path, is shown in FIG. 60. The integral scan energy varies between 100% and 105%. The uniformity or homogeneity thus amounts to ±2.5%.

Figure 61:
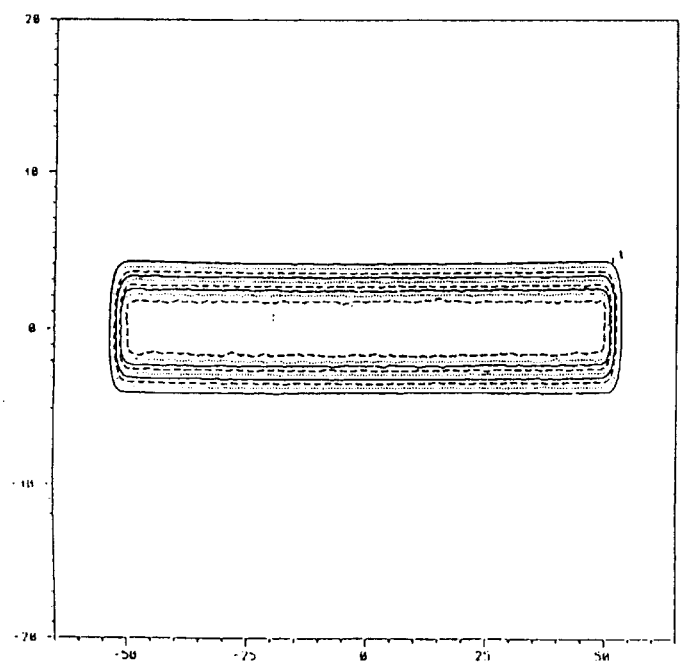
FIG. 61: Pupil illumination of a system according to FIGS. 52–58.
Figure 1:
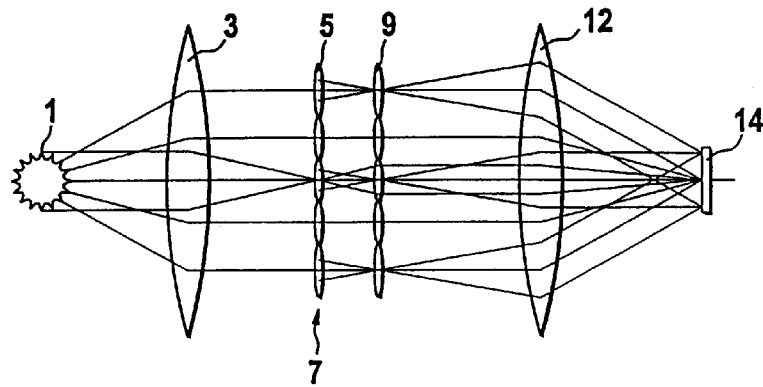
Figure 2A:
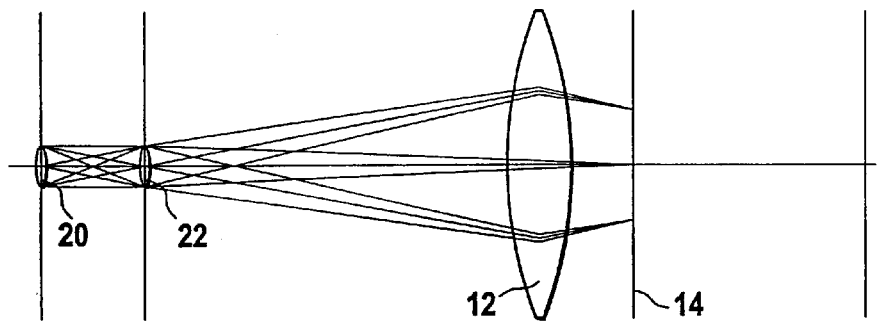
Figure 2B:
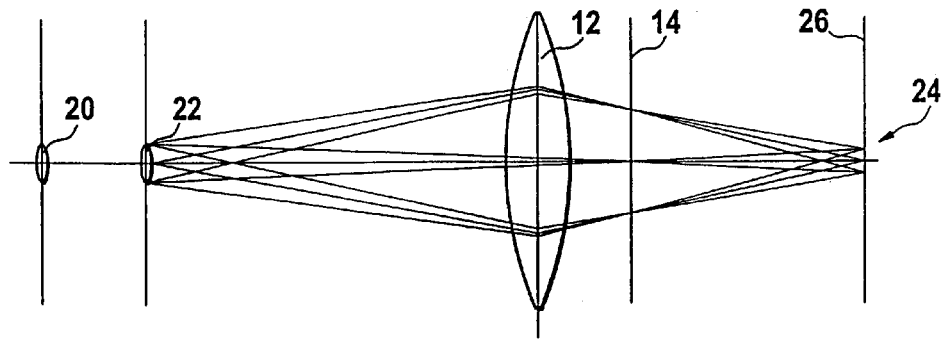
Figure 3:
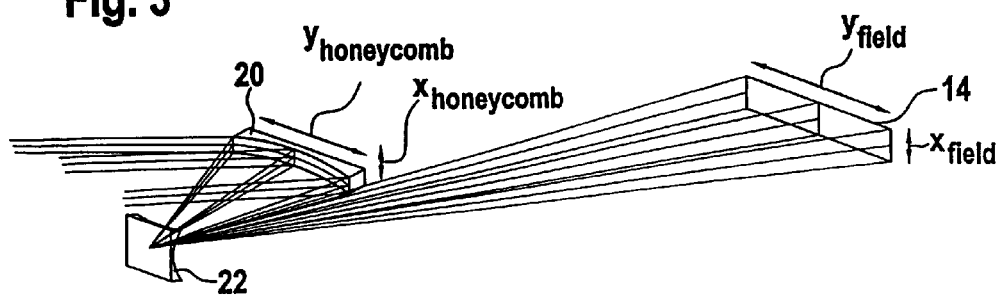
Figure 4:
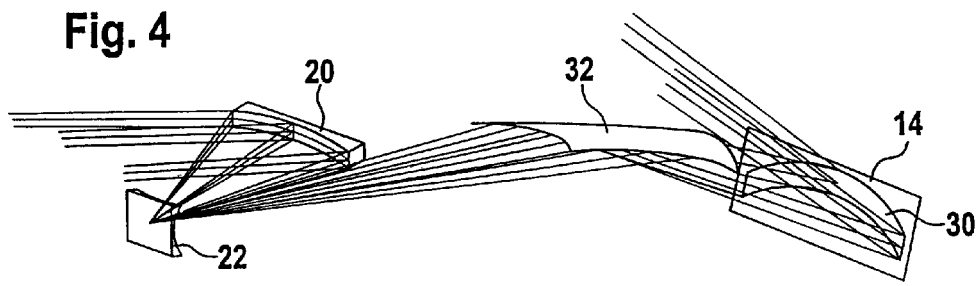
Figure 5:
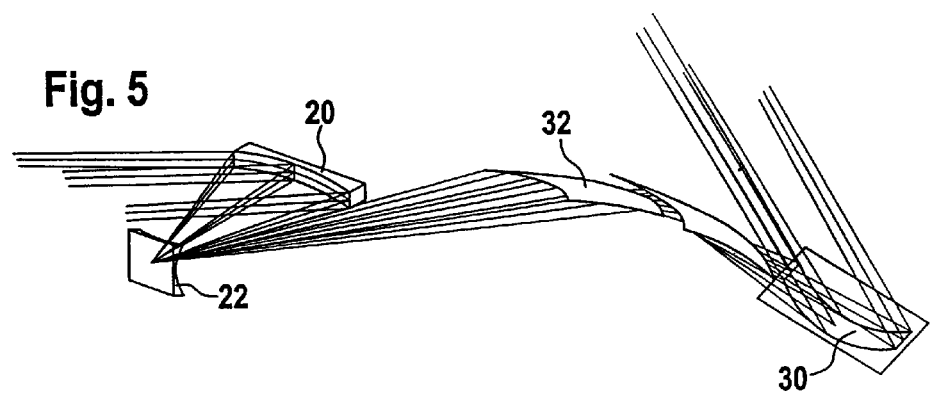
Figure 6:
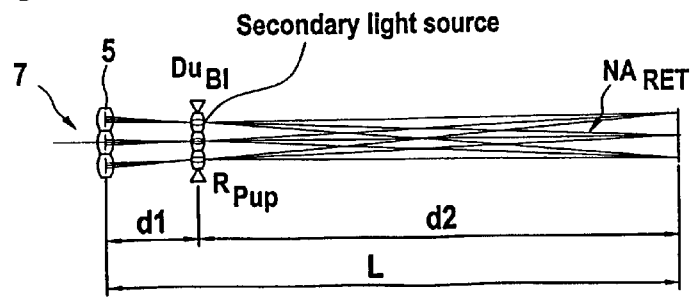
Figure 7:
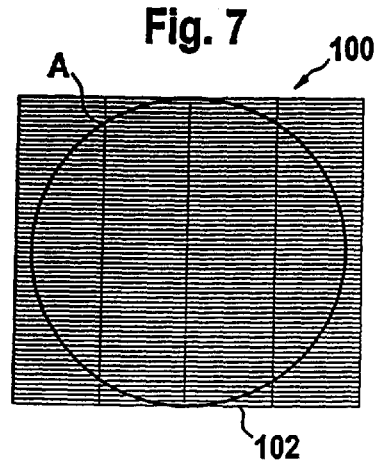
Figure 8:
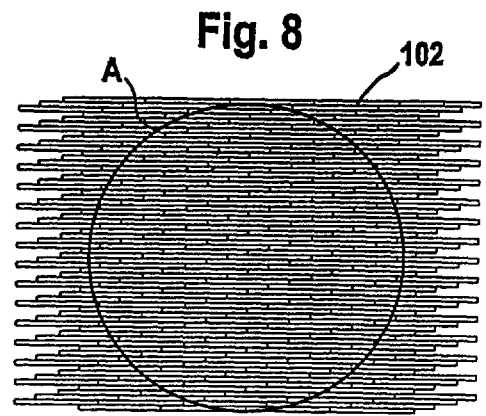
Figure 9:
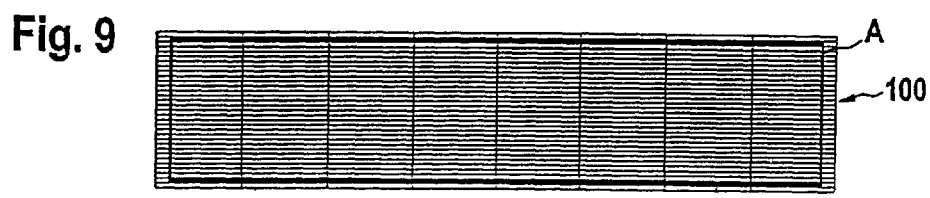
Figure 10:
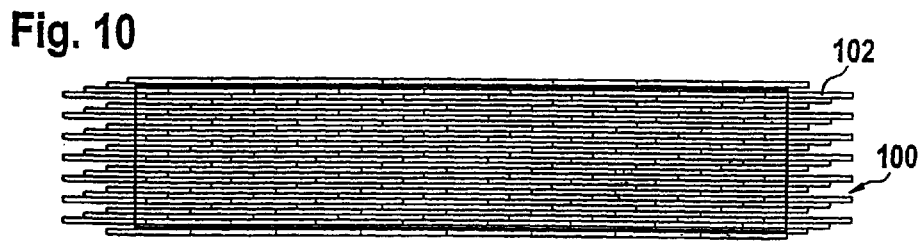
Figure 11:
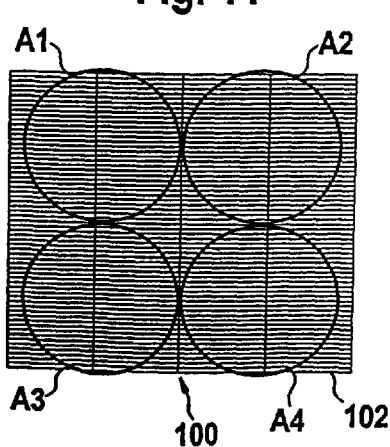
Figure 12:
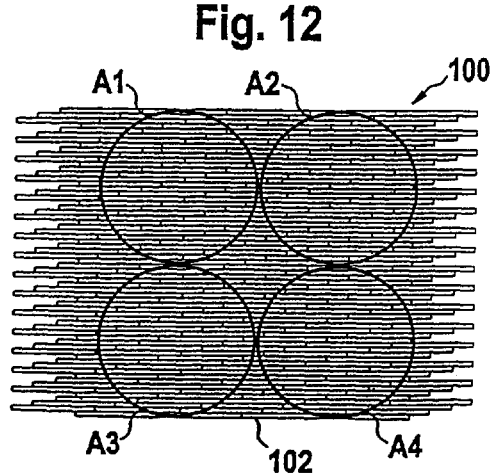
Figure 13:
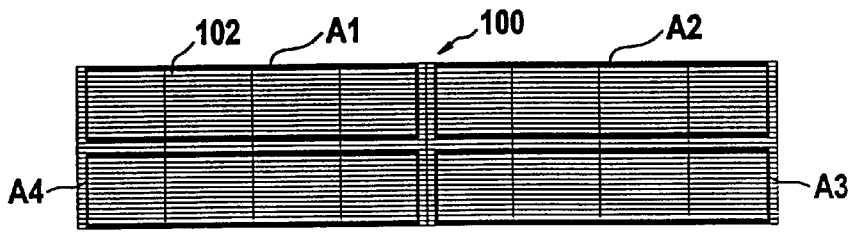
Figure 14:
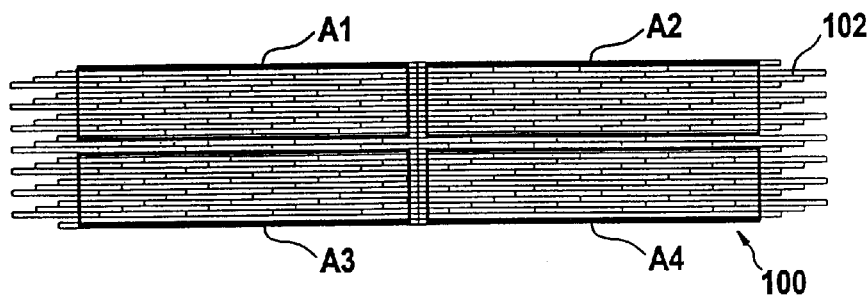
Figure 15:
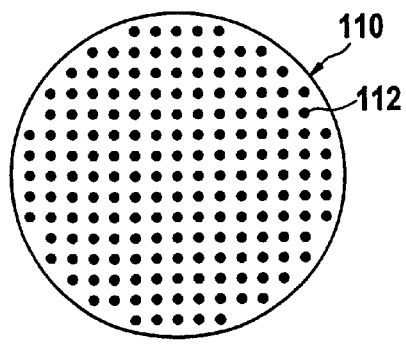
Figure 16:
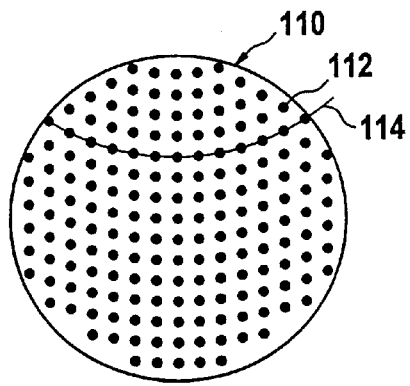
Figure 17:
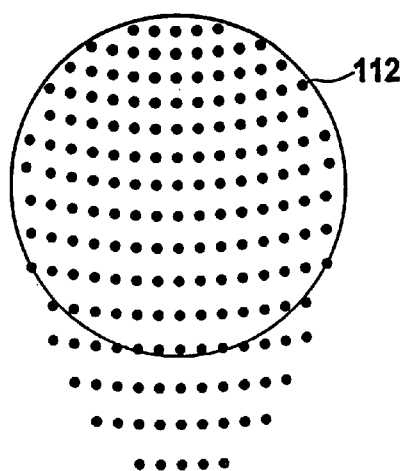
Figure 18:
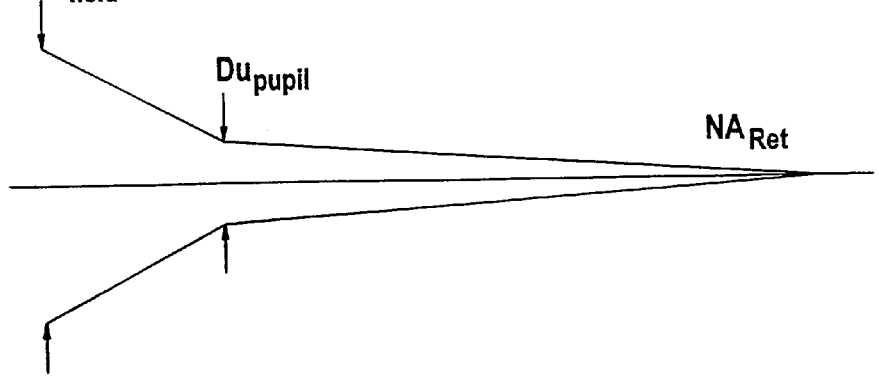
Figure 19:
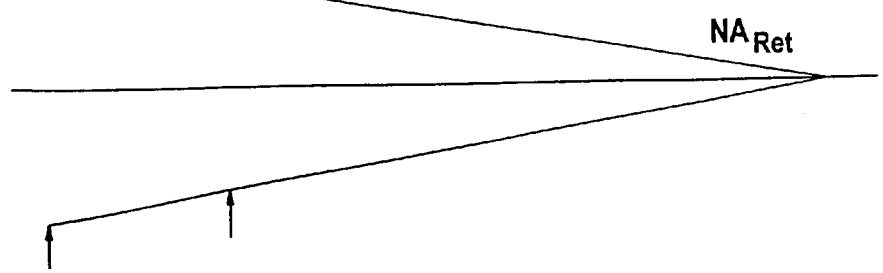
Figure 20:
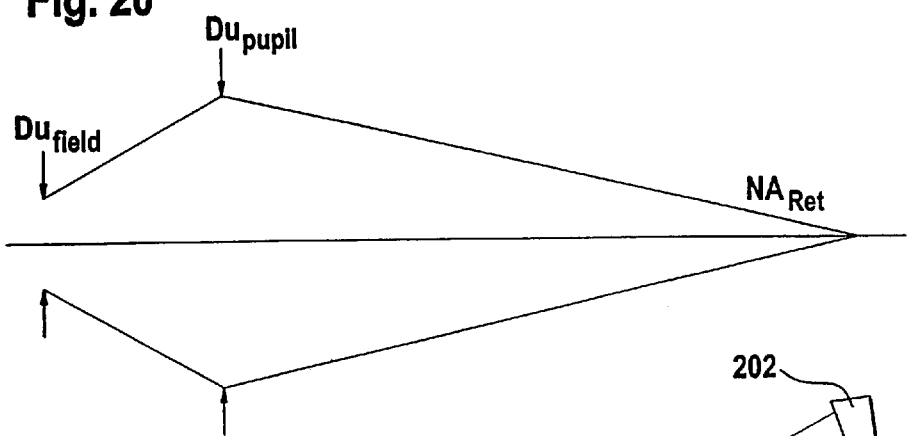
Figure 21:
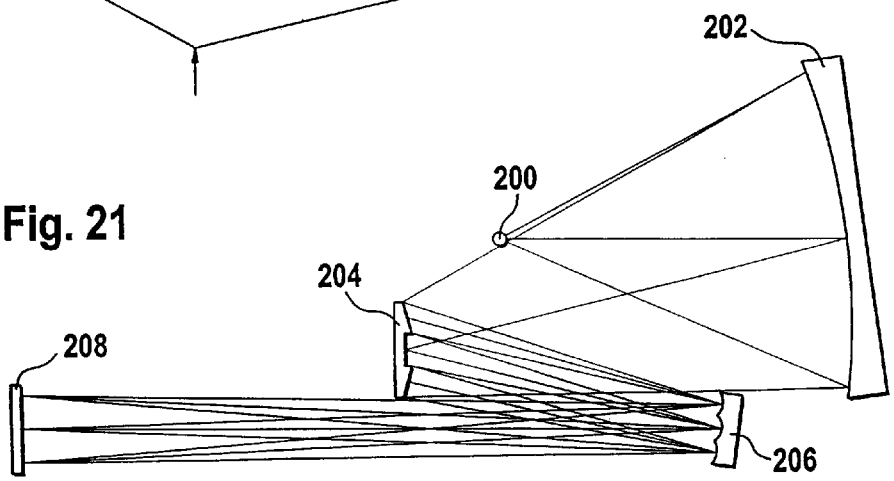
Figure 22:
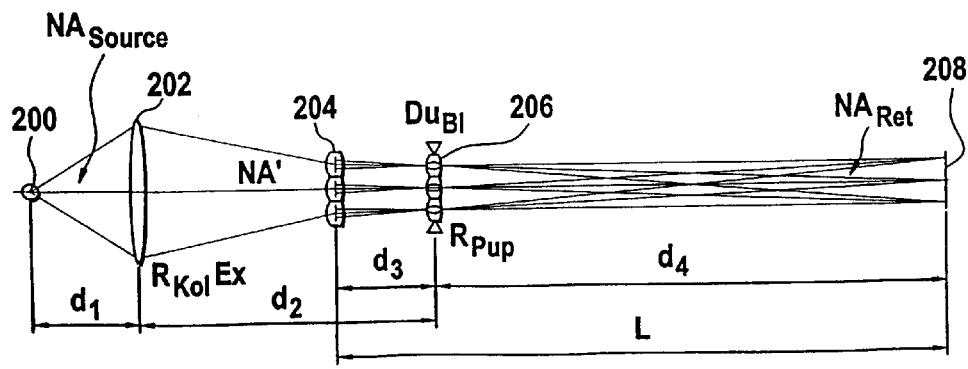
Figure 23:
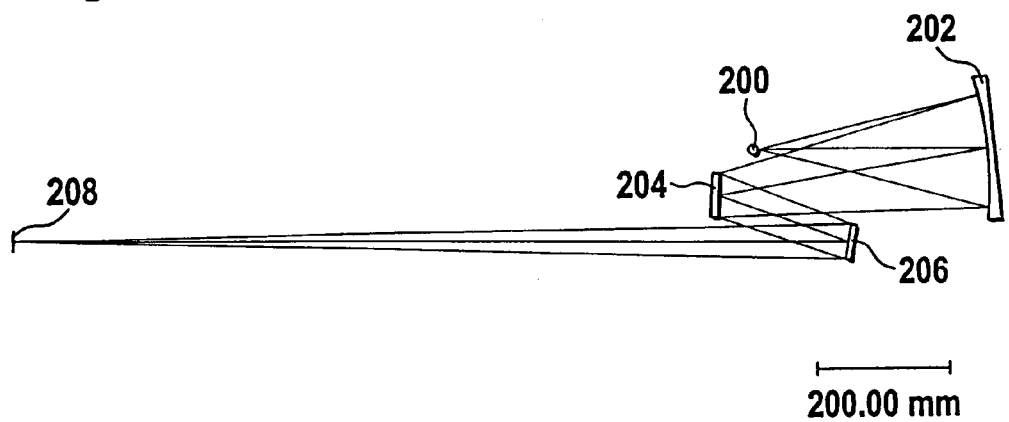
Figure 24:
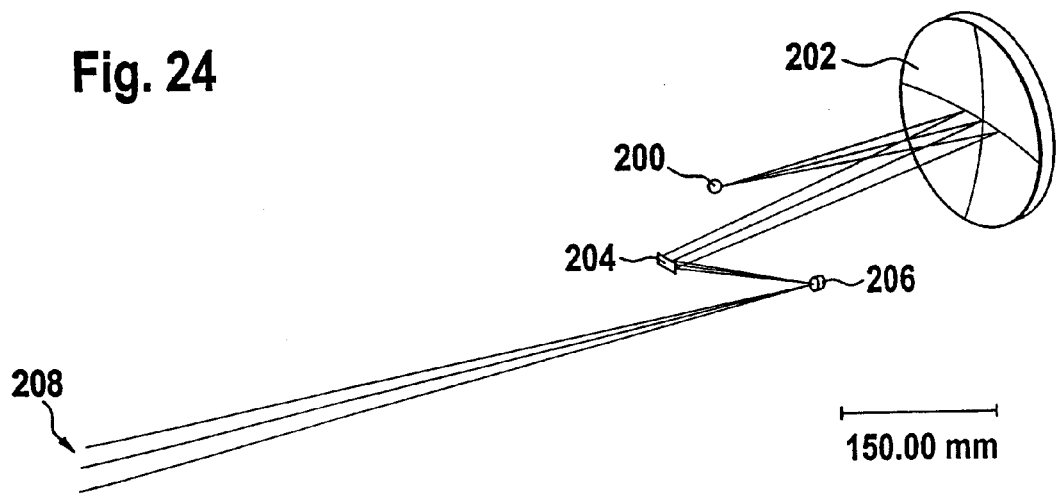
Figure 25:
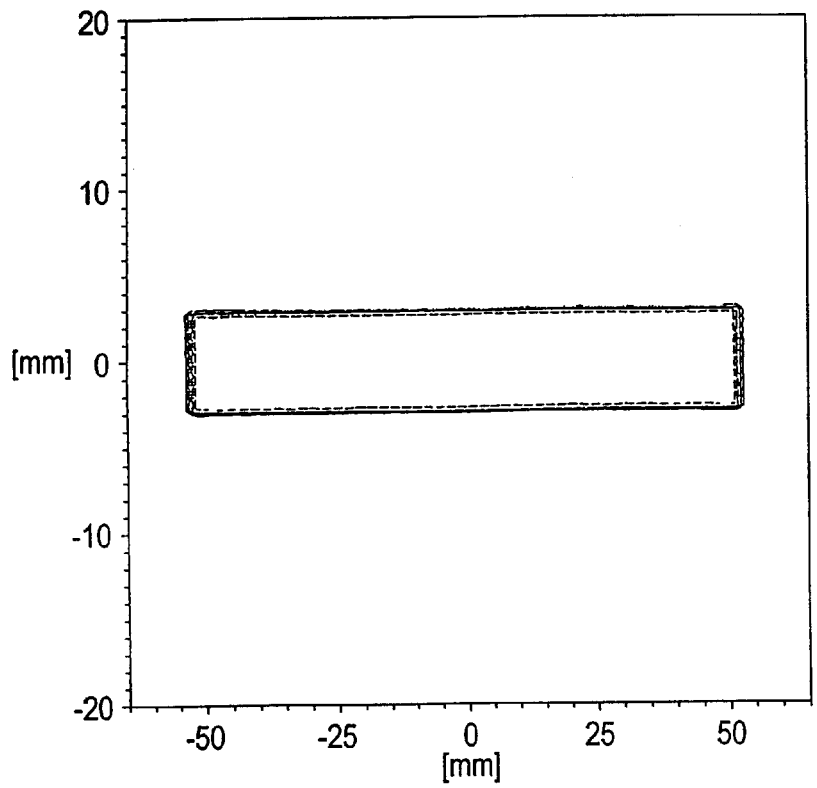
Figure 26:
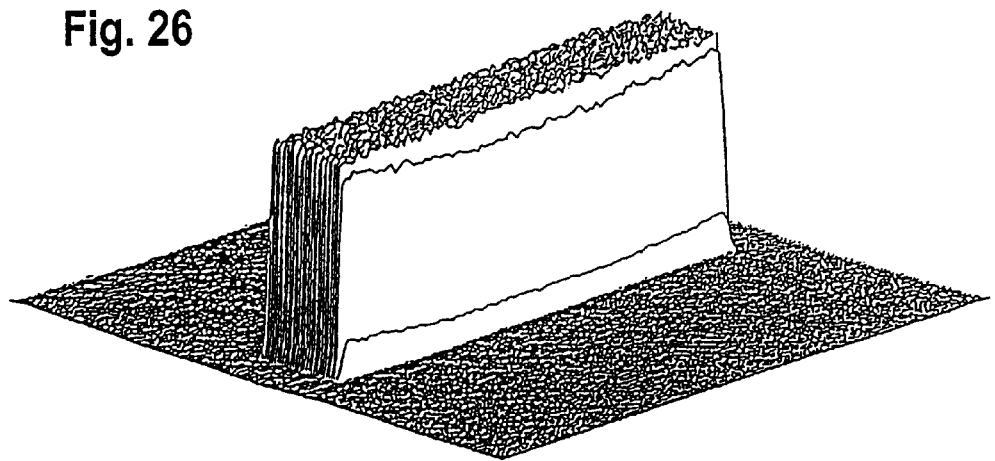
Figure 27:
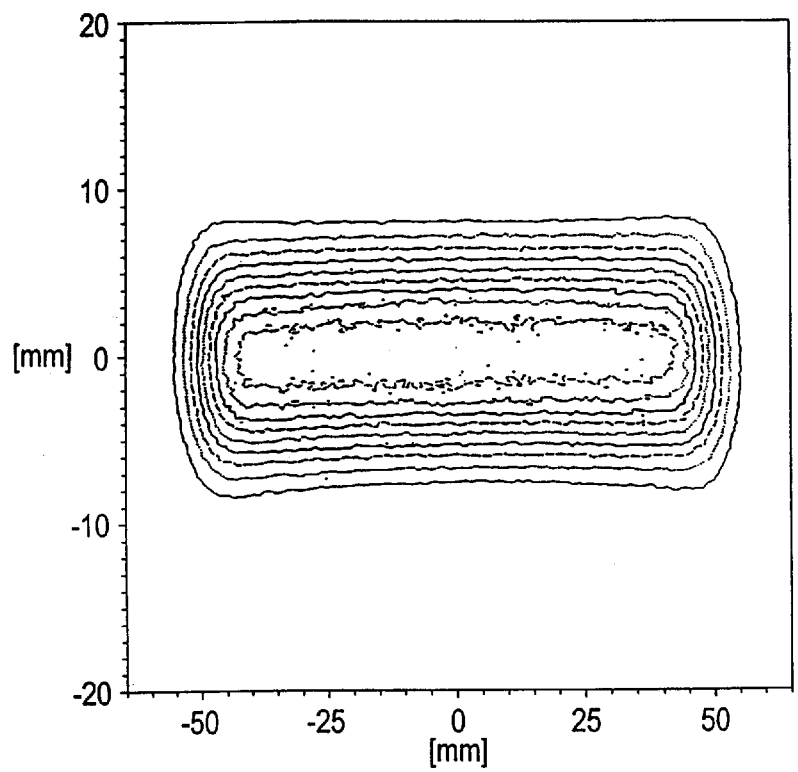
Figure 28:
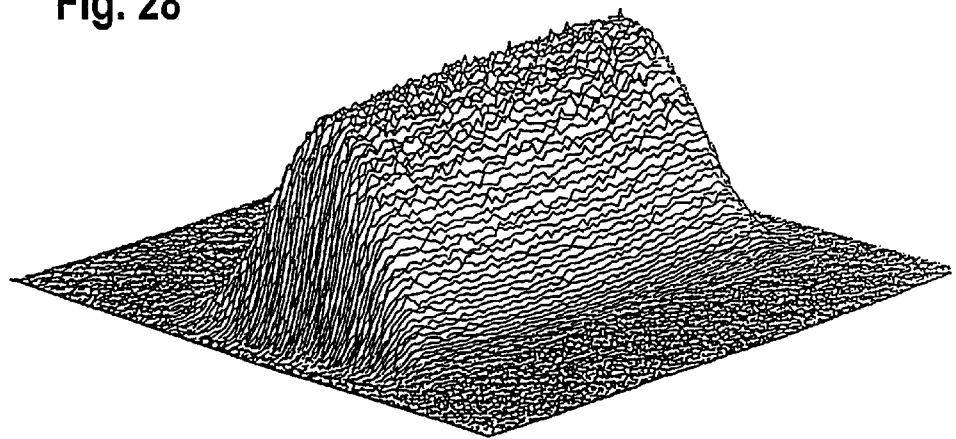

FIG. 61 represents the pupil illumination of the above-described system in the field center. The beam angles are referred to the centroid beam. Corresponding to the field honeycomb distribution, circular intensity peaks are produced in the pupil illumination. The pupil is completely filled. There are no center obscurations, since in the case of the described second form of embodiment, the mirrors are arranged in zigzag fashion.

Figure 62:
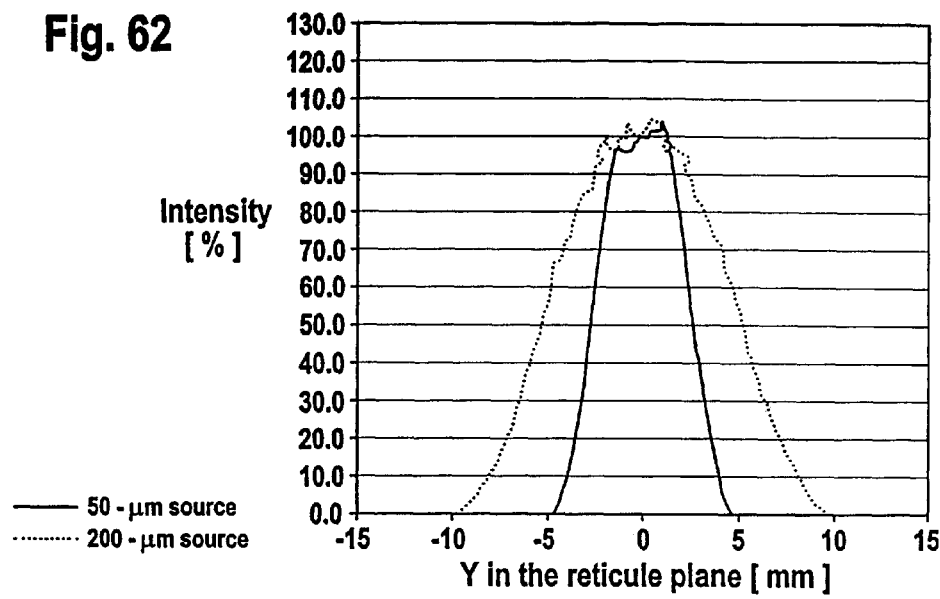
FIG. 62: Intensity course in the scan direction of a system according to FIGS. 52–58.

In FIG. 62, the intensity course is shown in the scan direction with the use of two different laser-plasma sources. Whereas with only one field honeycomb plate for the 50-$\mu$m source, the desired rectangular course is obtained, the 200$\mu$m source shows at the edges a clear blurring. This source can no longer be considered punctiform. The use of a second faceted mirror comprising pupil honeycombs, such as, for example, in the case of the pinch-plasma source, is necessary for the correct pencil superimposition in the entrance pupil of the objective.

Figure 63A:
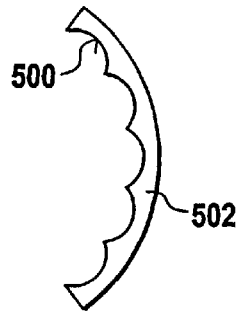
FIG. 63A: Honeycomb condenser with individual honeycombs on a curved carrier surface.
Figure 63B:
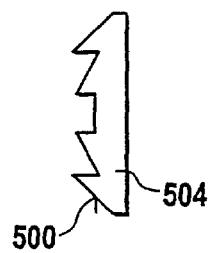
FIG. 63B: Honeycomb condenser with tilted honeycombs on a planar carrier plate.

In FIGS. 63A+63B two possibilities are shown for the formation of the field honeycomb plate. In FIG. 63A, the honeycombs 500 are arranged on a curved carrier surface 502. Thus the inclination of the honeycombs corresponds to the tangential inclination of the carrier surface. Such plates are described, for example, in the case of the first form of embodiment of a tele-system according to the invention with two mirrors and a separate collector mirror.

If the field honeycombs 500 are shaped in planar manner, such as, for example, in the case of the second form of embodiment that is described, in which collector unit and field honeycomb plate are combined into one tele-system, then the individual field honeycombs are arranged under a pregiven tilt angle on the honeycomb plate 504. Depending on the distribution of the tilt angle on the plate, one obtains either collecting or diverging effects. A plate with a diverging effect is illustrated.

Of course, honeycomb plates with planar honeycombs can be used also in systems according to the first example of embodiment with a collector unit and two tele-mirrors. In the case of such a system, the honeycombs are then tilted onto one of the mirrors such that a diverging effect is produced and onto the other in such a way that a collecting action is adjusted.

Figure 64:
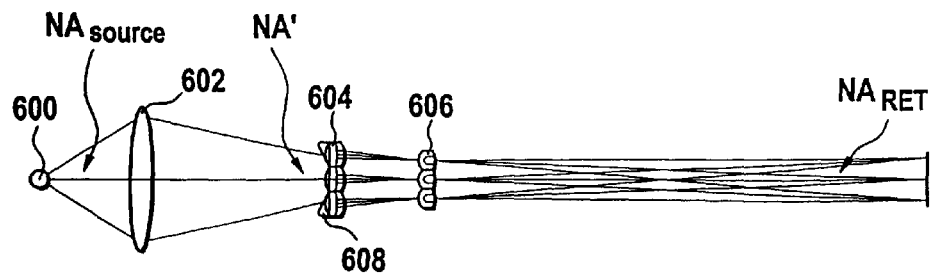
FIG. 64: A configuration of the invention with lenses and prisms arranged in front in schematic presentation.

FIG. 64 shows a form of embodiment of the invention, which is defined as a refractive system with lenses for wavelengths, for example, of 193 nm or 157 nm. The system comprises a light source 600, a collector lens 602, as well as a field honeycomb plate 604 and a pupil honeycomb plate 606. Prisms 608 arranged in front of the field honeycombs serve for adjusting the light path between the field honeycomb plate 604 and the pupil honeycomb plate 606. With the device according to the invention or the design process according to the invention, for the first time, an arrangement or a design process for illumination systems is given, which finds use particularly in EUV lithography, in which a uniform illumination of a reticle field is produced with uniform imaging and filling of the entrance pupil for light sources with any desired illumination A in a predetermined surface.

What is claimed is:

1. An illumination system for wavelengths ≦193 nm, comprising:

a light source having an illumination in a predetermined surface;

a device for the production of a secondary light source;

a mirror or lens device having a mirror or lens, which is organized into a raster element;

an optical element, which is arranged between said mirror or lens device and a reticle plane, whereby said optical element images said secondary light source in an exit pupil of the illumination system, wherein said raster element of said mirror or lens is shaped and arranged in such a way that an image of said raster element covers a major portion of said reticle plane, and wherein said exit pupil is illuminated, and said exit pupil is defined by an aperture and a filling ratio.

2. The illumination system according to claim 1, wherein said optical element comprises at least one field mirror or at least one field lens.

3. The illumination system according to claim 2, wherein said optical element is at most two field mirrors or field lenses.

4. The illumination system according to claim 2, wherein said field mirror is arranged in striped incidence.

5. The illumination system according to claim 1, wherein said mirror or lens device comprises a mirror or a lens with a raster element formed as field honeycombs.

6. The illumination system according to claim 5, wherein said field honeycombs in their aspect ratio essentially correspond to that of a field to be illuminated in said reticle plane.

7. The illumination system according to claim 5, wherein said mirror or lens with said raster element produces said secondary light source.

8. The illumination system according to claim 1, further comprising a collector that collects light from said light source.

9. The illumination system according to claim 8, wherein said collector and said mirror or lens with said raster element produce said secondary light source.

10. The illumination system according to claim 1, wherein said light source radiates in a steradian greater than $\pi/2$.

11. The illumination system according to claim 10, wherein said light source is a plasma focus source.

12. The illumination system according to claim 1, wherein said light source radiates in a steradian smaller than $\pi/2$.

13. The illumination system according to claim 12, wherein said light source is a pinch-plasma source.

14. The illumination system according to claim 1, wherein said mirror or lens device comprises a first mirror or lens with a multiple number of field honeycombs and a second mirror or lens with a multiple number of pupil honeycombs.

15. The illumination system according to claim 14, wherein said field honeycombs are arranged on said first mirror or lens in such a way that they do not overlap and their images cover a surface to be illuminated in said reticle plane.

16. The illumination system according to claim 14, wherein said pupil honeycombs are arranged on said second mirror or lens in such a way that their images, which are produced by said optical element, illuminate said exit pupil with a predetermined pattern.

17. The illumination system according to claim 16, comprising a light path between a pair of field and pupil honeycombs formed by rotating and tilting said field and said pupil honeycombs relative to one another.

18. The illumination system according to claim 16, comprising a light path constructed between a pair of field and pupil honeycombs by orienting and selecting a deflection angle of a prismatic component of said field honeycombs and said pupil honeycombs.

19. The illumination system according to claim 1, further comprising a zigzag beam path produced by field and pupil planes.

20. The illumination system according to claim 1, wherein said mirror or lens device comprises a telescope system.

21. The illumination system according to claim 20, wherein said mirror or lens comprises said raster element, and is one mirror or lens of said telescope system.

22. The illumination system according to claim 20, wherein said telescope system comprises a collector mirror or collector lens.

23. The illumination system according to claim 22, wherein said telescope system additionally comprises a first mirror or lens with a multiple number of field honeycombs, whereby said collector mirror or said collector lens has positive refractive power and said first mirror or lens has negative refractive power.

24. The illumination system according to claim 20, wherein said telescope system comprises a first mirror or lens with a multiple number of field honeycombs and a second mirror or lens with a multiple number of pupil honeycombs, whereby said first mirror or lens has positive refractive power and said second mirror or lens has negative refractive power.

25. The illumination system according to claim 1, further wherein a distance from said light source to a field to be illuminated is smaller than 3 m.

26. The illumination system according to claim 1, wherein said illumination system comprises three to five mirrors, and wherein at least one mirror has striped incidence and at least one mirror has said raster element.

27. The illumination system according to claim 1, wherein said illumination system comprises four to five mirrors, and wherein at least two mirrors have grazing incidence and at least two mirrors have said raster elements.

28. The illumination system according to claim 1, wherein said raster element of said mirror is curved.

29. The illumination system according to claim 1, wherein said raster element of said mirror is planar.

30. The illumination system according to claim 1, wherein said raster element of said mirror has a surface that is arranged on a curved surface.

31. The illumination system according to claim 1, wherein said raster element of said mirror is arranged on a basic structure according to a type of Fresnel lens.

32. The illumination system according to claim 1, wherein said raster element of said mirror is tilted relative to an enveloping or bearing surface.

33. The illumination system according to claim 1, wherein said mirror is comprised of at least two raster elements, said at least two raster elements are arranged in rows and each adjacent row is displaced relative to the other adjacent row by a fraction of a length of one of said raster elements.

34. The illumination system according to claim 1, wherein said light source has a steradian component of light radiated of 0.5 π transported to a field.

35. The illumination system according to claim 1, wherein said mirror device has an axial symmetric construction with central vignetting.

36. The illumination system according to claim 1, wherein said mirror device has an outer axial course of a light bundle that is free of vignetting.

37. The illumination system according to claim 1, wherein said raster element has an aspect ratio of 1:1 to 1:20.

38. The illumination system according to claim 1, wherein the illumination system has a field that is a rectangular field or an annular segment.

39. The illumination system according to claim 1, wherein said mirror has a toroidal form, whereby cross sections can also have conical and aspherical components.

40. The illumination system according to claim 1, further comprising an optical element that has a function selected from the group consisting of imaging a secondary light source in an entrance pupil of a subsequent projection objective, remodeling a pre-given rectangular illumination by raster elements to form a field in a form of an annular segment, adjusting an intensity distribution over said field, and mixtures thereof.

41. The illumination system according to claim 1, wherein said mirror has a reflectivity that is position-dependent.

42. The illumination system according to claim 1, further comprising a field-side numerical aperture that amounts to approximately 0.01 to 0.1.

43. The illumination system according to claim 1, further comprising an accessible diaphragm plane.

44. The illumination system according to claim 43, further comprising a masking device at said diaphragm plane, with which a type of illumination can be adjusted.

45. The illumination system according to claim 1, wherein said light source is a synchrotron radiation source.

46. The illumination system according to claim 45, wherein said light source is an undulator source or a wiggler source.

47. EUV projection exposure unit for microlithography with an illumination system according to claim 1 comprising a mask on a carrier system, a projection objective, and a light-sensitive object on a carrier system.

48. The EUV projection exposure unit according to claim 47, wherein the unit is a scanning system.

49. The EUV projection exposure unit according to claim 47, further comprising an illumination intensity at said light-sensitive object, with an unstructured mask, that has position-dependent differences of less than ±5%.

50. The EUV projection exposure unit according to claim 47, further comprising a scan energy at said light sensitive object, with an unstructured mask, that has position-dependent differences of less than ±5%.

51. The EUV projection exposure unit according to claim 47, further comprising a vacuum window transparent to EUV that is arranged in a beam path.

52. The EUV projection exposure unit according to claim 51, wherein said vacuum window is arranged at a constriction of a light bundle in said illumination system.

53. Process for the production of microelectronic components according to claim 1.

54. A process for designing an illumination system for wavelengths ≦193 nm, said illumination system having:
- a light source with any desired illumination in a predetermined surface,
- a mirror or lens device having at least two mirrors or lenses, with each mirror or lens organized into a raster element,
- an optical element arranged between said mirror or lens device and a reticule plane, said process comprising the following steps:
- arranging said raster element of a first mirror or lens to cover said surface without overlapping;
- shaping said raster element of said first mirror or lens such that its form corresponds to that of a field to be illuminated, whereby a secondary light source is assigned to each said raster element;
- arranging said raster element of a second mirror or lens to a position at said secondary light source;
- shaping said raster element of said second mirror or lens such that its form corresponds to that of said secondary light source;
- rotating or tilting said raster elements of said first and second mirrors or orienting and selecting an angle of deflection of a prismatic component of said raster elements of said first or second lens, a light path being produced, whereby a predetermined assignment of said raster elements of said first mirror or lens to said second mirror or lens is maintained, so that said raster element of said first mirror or lens is imaged in said reticule plane by said raster element of said second mirror or lens;
- an image of said raster element of said first mirror or lens is partially superimposed in said reticule plane; and
- said secondary light source is imaged in an exit pupil by said optical element.

\* \* \* \* \*

UNITED STATES PATENT AND TRADEMARK OFFICE
CERTIFICATE OF CORRECTION

PATENT NO. : 6,198,793 B1
DATED : March 6, 2001
INVENTOR(S) : Schultz et al.

It is certified that error appears in the above-identified patent and that said Letters Patent is hereby corrected as shown below:

The title page, showing the illustrative figure, should be deleted and substitute therefore the attached title page.

Delete Drawing Sheets 1-25, and substitute therefore the Drawing Sheets, consisting of Figs. 1-64, as shown on the attached pages.

Signed and Sealed this

Eighth Day of April, 2003

JAMES E. ROGAN
*Director of the United States Patent and Trademark Office*

(12) United States Patent
Schultz et al.

(10) Patent No.: US 6,198,793 B1
(45) Date of Patent: Mar. 6, 2001

(54) ILLUMINATION SYSTEM PARTICULARLY FOR EUV LITHOGRAPHY

(75) Inventors: Jörg Schultz, Aalen; Johannes Wangler, Königsbronn; Karl-Heinz Schuster, Rechbergstrasse; Udo Dinger, Oberkochen, all of (DE)

(73) Assignee: Carl-Zeiss-Stiftung Trading As Carl Zeiss, Heidenheim (DE)

( * ) Notice: Subject to any disclaimer, the term of this patent is extended or adjusted under 35 U.S.C. 154(b) by 0 days.

(21) Appl. No.: 09/305,017

(22) Filed: May 4, 1999

(30) Foreign Application Priority Data

| May 5, 1998 | (DE) | 198 19 898 |
| Feb. 2, 1999 | (DE) | 199 03 807 |
| Feb. 8, 1999 | (DE) | 299 02 108 U |

(51) Int. Cl.[7] ........................................ G21K 5/04
(52) U.S. Cl. .................... 378/34; 378/145; 378/146; 378/147
(58) Field of Search ................... 378/34, 145, 146, 378/147, 154

(56) References Cited

U.S. PATENT DOCUMENTS

| 4,651,012 | 3/1987 | Clark et al. ................ 250/505.1 |
| 5,339,346 | 8/1994 | White ................................ 378/34 |
| 5,361,292 | 11/1994 | Sweatt ............................. 378/34 |
| 5,512,759 | 4/1996 | Sweatt ........................... 250/492.1 |
| 5,581,605 | 12/1996 | Murakami et al. ............... 378/84 |
| 5,669,708 | 9/1997 | Mashima et al. ............... 362/341 |
| 5,677,939 * | 10/1997 | Oshino ............................. 378/34 |
| 5,737,137 | 4/1998 | Cohen et al. ..................... 359/859 |
| 5,896,438 | 4/1999 | Miyake et al. ..................... 378/34 |

FOREIGN PATENT DOCUMENTS 0 359 018   3/1990   (EP)

OTHER PUBLICATIONS

"Handbook On Synchrotron Radiation" Ernst–Eckhard Koch ed., pp. 140–145, 1098–1111 (1983).

* cited by examiner

*Primary Examiner*—David V. Bruce
*Assistant Examiner*—Allen C Ho
(74) *Attorney, Agent, or Firm*—Ohlandt, Greeley, Ruggiero & Perle, L.L.P.

(57) ABSTRACT

The invention concerns an illumination system for wavelengths $\leq 193$ nm, particularly for EUV lithography, with at least one light source, which has an illumination A in a predetermined surface; at least one device for producing secondary light sources; at least one mirror or lens device comprising at least one mirror or one lens, which is or are organized into raster elements; one or more optical elements, which are arranged between the mirror or lens device comprising at least one mirror or one lens, which is or are organized into raster elements and the reticle plane, whereby the optical elements image the secondary light sources in the exit pupil of the illumination system.

The illumination system is characterized by the fact that the raster elements of the one or more mirror or lenses are shaped and arranged in such a way that the images of the raster elements cover by means of the optical elements the major portion of the reticle plane and that the exit pupil defined by aperture and filling degree is illuminated.

54 Claims, 25 Drawing Sheets

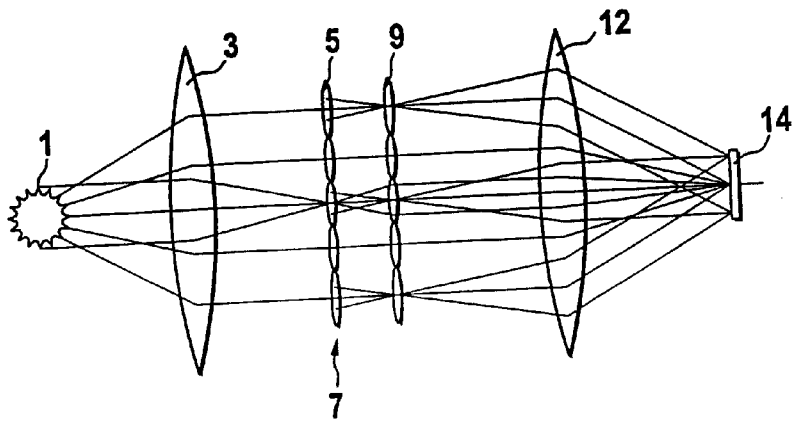

200.00 mm 150.00 mm 100.00 mm 100.00 mm 100.00 mm 250.00 mm 138.89 mm 227.27 mm